United States Patent
Koch, III et al.

(10) Patent No.: US 12,140,732 B2
(45) Date of Patent: Nov. 12, 2024

(54) ANTI-REFLECTIVE COATINGS AND ARTICLES AND METHODS OF FORMING THE SAME

(71) Applicant: CORNING INCORPORATED, Corning, NY (US)

(72) Inventors: Karl William Koch, III, Elmira, NY (US); Cheng-Chung Li, Redmond, WA (US); Jean-Francois Oudard, Webster, NY (US)

(73) Assignee: CORNING INCORPORATED, Corning, NY (US)

( * ) Notice: Subject to any disclaimer, the term of this patent is extended or adjusted under 35 U.S.C. 154(b) by 971 days.

(21) Appl. No.: 16/977,332

(22) PCT Filed: Mar. 1, 2019

(86) PCT No.: PCT/US2019/020343
§ 371 (c)(1),
(2) Date: Sep. 1, 2020

(87) PCT Pub. No.: WO2019/169293
PCT Pub. Date: Sep. 6, 2019

(65) Prior Publication Data
US 2020/0408954 A1    Dec. 31, 2020

Related U.S. Application Data
(60) Provisional application No. 62/637,666, filed on Mar. 2, 2018.

(51) Int. Cl.
*G02B 1/115* (2015.01)
*B60K 35/22* (2024.01)
(Continued)

(52) U.S. Cl.
CPC ............ *G02B 1/115* (2013.01); *C03B 23/023* (2013.01); *C03C 17/3411* (2013.01);
(Continued)

(58) Field of Classification Search
None
See application file for complete search history.

(56) References Cited

U.S. PATENT DOCUMENTS 2,068,030 A    1/1937 Lieser
2,608,030 A    8/1952 Jendrisak
(Continued)

FOREIGN PATENT DOCUMENTS

CN    1389346 A    *    1/2003
CN    1400476 A         3/2003
(Continued)

OTHER PUBLICATIONS

Machine Translation of CN-104553126-A, Apr. 2015 (Year: 2015).*
(Continued)

*Primary Examiner* — Jeffrey A Vonch
(74) *Attorney, Agent, or Firm* — William M. Johnson; Frank Brock Riggs; Payal A. Patel

(57) ABSTRACT

Embodiments of a color-neutral anti-reflective coating and articles including the same are described. In one or more embodiments, a substrate includes a first major surface and an anti-reflective coating disposed on the first major surface of the substrate and having a reflective surface opposite the first major surface. In one or more embodiments, a point on the reflective surface has a single-surface reflectance under a D65 illuminant with an angular color variation, $\Delta E\theta$ that is less than 5, where $\Delta E_\theta = \sqrt{\{(a^*_{\theta 1} - a^*_{\theta 2})^2 + (b^*_{\theta 1} - b^*_{\theta 2})^2\}}$, and $a^*_{\theta 1}$ and $b^*_{\theta 1}$ are color values a* and b* values of the point measured from a first angle $\theta_1$, and a second angle $\theta_2$, where $\theta_1$ and $\theta_2$ are any two different viewing angles at least (Continued)

5 degrees apart in a range from about 10° to about 60° relative to a normal vector of the reflective surface.

20 Claims, 24 Drawing Sheets

(51) Int. Cl.
| | |
|---|---|
| *B60R 13/02* | (2006.01) |
| *C03B 23/023* | (2006.01) |
| *C03C 17/34* | (2006.01) |
| *G02B 1/113* | (2015.01) |
| *G02B 27/00* | (2006.01) |
| *C03C 15/00* | (2006.01) |
| *C23C 14/08* | (2006.01) |
| *C23C 14/34* | (2006.01) |
| *C23C 28/00* | (2006.01) |
| *C23C 28/04* | (2006.01) |

(52) U.S. Cl.
CPC .......... *C03C 17/3417* (2013.01); *G02B 1/113* (2013.01); *G02B 27/0018* (2013.01); *B60K 35/22* (2024.01); *B60R 13/02* (2013.01); *C03C 15/00* (2013.01); *C03C 2217/212* (2013.01); *C03C 2217/213* (2013.01); *C03C 2217/218* (2013.01); *C03C 2217/734* (2013.01); *C23C 14/08* (2013.01); *C23C 14/083* (2013.01); *C23C 14/34* (2013.01); *C23C 28/042* (2013.01); *C23C 28/40* (2013.01); *C23C 28/42* (2013.01); *C23C 28/44* (2013.01); *Y10T 428/24479* (2015.01); *Y10T 428/24942* (2015.01); *Y10T 428/265* (2015.01); *Y10T 428/315* (2015.01)

(56) References Cited

U.S. PATENT DOCUMENTS

| | | | |
|---|---|---|---|
| 3,197,903 A | 8/1965 | Walley | |
| 3,338,696 A | 8/1967 | Dockerty | |
| 3,582,456 A | 6/1971 | Stolki | |
| 3,682,609 A | 8/1972 | Dockerty | |
| 3,753,840 A | 8/1973 | Plumat | |
| 3,778,335 A | 12/1973 | Boyd | |
| 3,781,090 A * | 12/1973 | Sumita | C03C 17/3429 359/588 |
| 3,790,430 A | 2/1974 | Mochel | |
| 3,799,817 A | 3/1974 | Laethem | |
| 4,147,527 A | 4/1979 | Bystrov et al. | |
| 4,238,265 A | 12/1980 | Deminet | |
| 4,445,953 A | 5/1984 | Hawk | |
| 4,455,338 A | 6/1984 | Henne | |
| 4,859,636 A | 8/1989 | Aratani et al. | |
| 4,896,928 A * | 1/1990 | Perilloux | G02B 5/285 359/359 |
| 4,899,507 A | 2/1990 | Mairlot | |
| 4,969,966 A | 11/1990 | Norman | |
| 4,985,099 A | 1/1991 | Mertens et al. | |
| 5,108,480 A | 4/1992 | Sugiyama | |
| 5,154,117 A | 10/1992 | Didelot et al. | |
| 5,173,102 A | 12/1992 | Weber et al. | |
| 5,245,468 A | 9/1993 | Demiryont et al. | |
| 5,250,146 A | 10/1993 | Horvath | |
| 5,264,058 A | 11/1993 | Hoagland et al. | |
| 5,300,184 A | 4/1994 | Masunaga | |
| 5,711,119 A | 1/1998 | Cornils et al. | |
| 5,891,556 A * | 4/1999 | Anderson | B32B 17/10174 359/359 |
| 5,897,937 A | 4/1999 | Cornils et al. | |
| 6,044,662 A | 4/2000 | Morin | |
| 6,074,730 A * | 6/2000 | Laird | G02B 1/16 359/586 |
| 6,086,983 A | 7/2000 | Yoshizawa | |
| 6,101,748 A | 8/2000 | Cass et al. | |
| 6,165,598 A * | 12/2000 | Nelson | C03C 17/3452 359/359 |
| 6,242,931 B1 | 6/2001 | Hembree et al. | |
| 6,265,054 B1 | 7/2001 | Bravet et al. | |
| 6,270,605 B1 | 8/2001 | Doerfler | |
| 6,274,219 B1 | 8/2001 | Schuster et al. | |
| 6,287,674 B1 | 9/2001 | Verlinden et al. | |
| 6,302,985 B1 | 10/2001 | Takahashi et al. | |
| 6,332,690 B1 | 12/2001 | Murofushi | |
| 6,387,515 B1 | 5/2002 | Joret et al. | |
| 6,420,800 B1 | 7/2002 | Levesque et al. | |
| 6,426,138 B1 | 7/2002 | Narushima et al. | |
| 6,582,799 B1 | 6/2003 | Brown et al. | |
| 6,620,365 B1 | 9/2003 | Odoi et al. | |
| 6,816,225 B2 | 11/2004 | Colgan et al. | |
| 6,903,871 B2 | 6/2005 | Page | |
| 7,297,040 B2 | 11/2007 | Chang et al. | |
| 7,375,782 B2 | 5/2008 | Yamazaki et al. | |
| 7,478,930 B2 | 1/2009 | Choi | |
| 7,489,303 B1 | 2/2009 | Pryor | |
| 7,542,302 B1 | 6/2009 | Curnalia et al. | |
| 7,750,821 B1 | 7/2010 | Taborisskiy et al. | |
| 7,955,470 B2 | 6/2011 | Kapp et al. | |
| 8,298,431 B2 | 10/2012 | Chwu et al. | |
| 8,344,369 B2 | 1/2013 | Yamazaki et al. | |
| 8,521,955 B2 | 8/2013 | Arulambalam et al. | |
| 8,549,885 B2 | 10/2013 | Dannoux et al. | |
| 8,586,492 B2 | 11/2013 | Barefoot et al. | |
| 8,652,978 B2 | 2/2014 | Dejneka et al. | |
| 8,692,787 B2 | 4/2014 | Imazeki | |
| 8,702,253 B2 | 4/2014 | Lu et al. | |
| 8,765,262 B2 | 7/2014 | Gross | |
| 8,814,372 B2 | 8/2014 | Vandal et al. | |
| 8,833,106 B2 | 9/2014 | Dannoux et al. | |
| 8,912,447 B2 | 12/2014 | Leong et al. | |
| 8,923,693 B2 | 12/2014 | Yeates | |
| 8,962,084 B2 | 2/2015 | Brackley et al. | |
| 8,967,834 B2 | 3/2015 | Timmerman et al. | |
| 8,969,226 B2 | 3/2015 | Dejneka et al. | |
| 8,978,418 B2 | 3/2015 | Balduin et al. | |
| 9,007,226 B2 | 4/2015 | Chang | |
| 9,061,934 B2 | 6/2015 | Bisson et al. | |
| 9,090,501 B2 | 7/2015 | Okahata et al. | |
| 9,109,881 B2 | 8/2015 | Roussev et al. | |
| 9,140,543 B1 | 9/2015 | Allan et al. | |
| 9,156,724 B2 | 10/2015 | Gross | |
| 9,223,162 B2 | 12/2015 | Deforest et al. | |
| 9,240,437 B2 | 1/2016 | Shieh et al. | |
| 9,278,500 B2 | 3/2016 | Filipp | |
| 9,278,655 B2 | 3/2016 | Jones et al. | |
| 9,290,413 B2 | 3/2016 | Dejneka et al. | |
| 9,346,703 B2 | 5/2016 | Bookbinder et al. | |
| 9,346,706 B2 | 5/2016 | Bazemore et al. | |
| 9,357,638 B2 | 5/2016 | Lee et al. | |
| 9,442,028 B2 | 9/2016 | Roussev et al. | |
| 9,446,723 B2 | 9/2016 | Stepanski | |
| 9,469,561 B2 | 10/2016 | Kladias et al. | |
| 9,517,967 B2 | 12/2016 | Dejneka et al. | |
| 9,573,843 B2 | 2/2017 | Keegan et al. | |
| 9,593,042 B2 | 3/2017 | Hu et al. | |
| 9,595,960 B2 | 3/2017 | Wilford | |
| 9,606,625 B2 | 3/2017 | Levesque et al. | |
| 9,617,180 B2 | 4/2017 | Bookbinder et al. | |
| 9,663,396 B2 | 5/2017 | Miyasaka et al. | |
| 9,694,570 B2 | 7/2017 | Levasseur et al. | |
| 9,700,985 B2 | 7/2017 | Kashima et al. | |
| 9,701,564 B2 | 7/2017 | Bookbinder et al. | |
| 9,720,450 B2 | 8/2017 | Choi et al. | |
| 9,724,727 B2 | 8/2017 | Domey et al. | |
| 9,802,485 B2 | 10/2017 | Masuda et al. | |
| 9,815,730 B2 | 11/2017 | Marjanovic et al. | |
| 9,821,509 B2 | 11/2017 | Kastell | |
| 9,895,975 B2 | 2/2018 | Lee et al. | |
| 9,902,640 B2 | 2/2018 | Dannoux et al. | |
| 9,931,817 B2 | 4/2018 | Rickerl | |
| 9,933,820 B2 | 4/2018 | Helot et al. | |
| 9,947,882 B2 | 4/2018 | Zhang et al. | |
| 9,955,602 B2 | 4/2018 | Wildner et al. | |

(56) References Cited

U.S. PATENT DOCUMENTS

| | | |
|---|---|---|
| 9,957,190 B2 | 5/2018 | Finkeldey et al. |
| 9,963,374 B2 | 5/2018 | Jouanno et al. |
| 9,972,645 B2 | 5/2018 | Kim |
| 9,975,801 B2 | 5/2018 | Maschmeyer et al. |
| 9,992,888 B2 | 6/2018 | Moon et al. |
| 10,005,246 B2 | 6/2018 | Stepanski |
| 10,017,033 B2 | 7/2018 | Fisher et al. |
| 10,042,391 B2 | 8/2018 | Yun et al. |
| 10,074,824 B2 | 9/2018 | Han et al. |
| 10,086,762 B2 | 10/2018 | Uhm |
| 10,131,118 B2 | 11/2018 | Kang et al. |
| 10,140,018 B2 | 11/2018 | Kim et al. |
| 10,153,337 B2 | 12/2018 | Lee et al. |
| 10,175,802 B2 | 1/2019 | Boggs et al. |
| 10,211,416 B2 | 2/2019 | Jin et al. |
| 10,222,825 B2 | 3/2019 | Wang et al. |
| 10,273,184 B2 | 4/2019 | Garner et al. |
| 10,303,223 B2 | 5/2019 | Park et al. |
| 10,303,315 B2 | 5/2019 | Jeong et al. |
| 10,326,101 B2 | 6/2019 | Oh et al. |
| 10,328,865 B2 | 6/2019 | Jung |
| 10,343,377 B2 | 7/2019 | Levasseur et al. |
| 10,347,700 B2 | 7/2019 | Yang et al. |
| 10,377,656 B2 | 8/2019 | Dannoux et al. |
| 10,421,683 B2 | 9/2019 | Schillinger et al. |
| 10,427,383 B2 | 10/2019 | Levasseur et al. |
| 10,444,427 B2 | 10/2019 | Bookbinder et al. |
| 10,483,210 B2 | 11/2019 | Gross et al. |
| 10,500,958 B2 | 12/2019 | Cho et al. |
| 10,606,395 B2 | 3/2020 | Boggs et al. |
| 10,649,267 B2 | 5/2020 | Tuan et al. |
| 10,788,707 B2 | 9/2020 | Ai et al. |
| 10,976,607 B2 | 4/2021 | Huang et al. |
| 2001/0031365 A1* | 10/2001 | Anderson ............ C03C 27/10 428/432 |
| 2002/0030882 A1* | 3/2002 | Vitt .................... C03C 17/3417 359/350 |
| 2002/0039229 A1 | 4/2002 | Hirose et al. |
| 2003/0021033 A9* | 1/2003 | Mitsuishi ............ G02B 1/115 359/586 |
| 2003/0027001 A1 | 2/2003 | Kang et al. |
| 2003/0076465 A1* | 4/2003 | Shimoda ........... G02F 1/133502 349/113 |
| 2003/0175557 A1* | 9/2003 | Anderson ............. G02B 1/16 428/432 |
| 2004/0026021 A1 | 2/2004 | Groh et al. |
| 2004/0069770 A1 | 4/2004 | Cary et al. |
| 2004/0071969 A1* | 4/2004 | Okamoto ............. B60J 1/002 428/428 |
| 2004/0076835 A1* | 4/2004 | Watanabe ............ G02B 1/11 428/432 |
| 2004/0107731 A1 | 6/2004 | Doehring et al. |
| 2004/0114248 A1* | 6/2004 | Hokazono ............ G02B 1/14 359/603 |
| 2004/0258929 A1 | 12/2004 | Glaubitt et al. |
| 2005/0030629 A1* | 2/2005 | Kursawe ............. G02B 1/116 359/586 |
| 2005/0178158 A1 | 8/2005 | Moulding et al. |
| 2005/0219724 A1* | 10/2005 | Teramoto ............ G02B 1/113 359/883 |
| 2006/0165963 A1* | 7/2006 | Fleury ................ G02B 1/116 428/212 |
| 2006/0227125 A1 | 10/2006 | Wong et al. |
| 2007/0178315 A1* | 8/2007 | Thomas .............. G02B 5/205 428/432 |
| 2007/0188871 A1 | 8/2007 | Fleury et al. |
| 2007/0193876 A1* | 8/2007 | Chu .................... C23C 14/022 204/192.1 |
| 2007/0195419 A1 | 8/2007 | Tsuda et al. |
| 2007/0210621 A1 | 9/2007 | Barton et al. |
| 2007/0221313 A1 | 9/2007 | Franck et al. |
| 2007/0223121 A1 | 9/2007 | Franck et al. |
| 2007/0259161 A1* | 11/2007 | Kato ................... G02B 1/14 428/447 |
| 2007/0291384 A1 | 12/2007 | Wang |
| 2008/0002260 A1* | 1/2008 | Arrouy ............... C23C 14/08 359/359 |
| 2008/0031991 A1 | 2/2008 | Choi et al. |
| 2008/0093753 A1 | 4/2008 | Schuetz |
| 2008/0285134 A1 | 11/2008 | Closset et al. |
| 2008/0303976 A1 | 12/2008 | Nishizawa et al. |
| 2009/0096937 A1 | 4/2009 | Bauer et al. |
| 2009/0101208 A1 | 4/2009 | Vandal et al. |
| 2009/0104385 A1* | 4/2009 | Reymond ........... C03C 17/3435 428/34 |
| 2009/0117332 A1 | 5/2009 | Ellsworth et al. |
| 2009/0179840 A1 | 7/2009 | Tanaka et al. |
| 2009/0185127 A1 | 7/2009 | Tanaka et al. |
| 2009/0201443 A1 | 8/2009 | Sasaki et al. |
| 2009/0246514 A1* | 10/2009 | Chiu ................... C23C 14/022 427/255.7 |
| 2009/0311497 A1 | 12/2009 | Aoki |
| 2010/0000259 A1 | 1/2010 | Ukrainczyk et al. |
| 2010/0031590 A1 | 2/2010 | Buchwald et al. |
| 2010/0065342 A1 | 3/2010 | Shaikh |
| 2010/0103138 A1 | 4/2010 | Huang et al. |
| 2010/0182143 A1 | 7/2010 | Lynam |
| 2010/0245253 A1 | 9/2010 | Rhyu et al. |
| 2010/0328605 A1* | 12/2010 | Suzuki ................ C23C 14/10 427/164 |
| 2011/0033681 A1* | 2/2011 | Adachi ................ G02B 1/115 428/212 |
| 2011/0057465 A1 | 3/2011 | Beau et al. |
| 2011/0148267 A1 | 6/2011 | McDaniel et al. |
| 2011/0228214 A1* | 9/2011 | von Blanckenhagen .................... B29D 11/00923 351/159.24 |
| 2012/0050975 A1 | 3/2012 | Garelli et al. |
| 2012/0075705 A1* | 3/2012 | Beinat ................. G02B 1/116 359/585 |
| 2012/0111056 A1 | 5/2012 | Prest |
| 2012/0128952 A1 | 5/2012 | Miwa et al. |
| 2012/0134025 A1 | 5/2012 | Hart |
| 2012/0144866 A1 | 6/2012 | Liu et al. |
| 2012/0152897 A1 | 6/2012 | Cheng et al. |
| 2012/0196110 A1 | 8/2012 | Murata et al. |
| 2012/0202030 A1 | 8/2012 | Kondo et al. |
| 2012/0212826 A1* | 8/2012 | Henn ................. C03C 17/3435 359/586 |
| 2012/0218640 A1 | 8/2012 | Gollier et al. |
| 2012/0263945 A1 | 10/2012 | Yoshikawa |
| 2012/0280368 A1 | 11/2012 | Garner et al. |
| 2012/0320509 A1 | 12/2012 | Kim et al. |
| 2013/0020007 A1 | 1/2013 | Niiyama et al. |
| 2013/0033885 A1 | 2/2013 | Oh et al. |
| 2013/0070340 A1 | 3/2013 | Shelestak et al. |
| 2013/0081428 A1 | 4/2013 | Liu et al. |
| 2013/0088441 A1 | 4/2013 | Chung et al. |
| 2013/0120850 A1 | 5/2013 | Lambert et al. |
| 2013/0135741 A1* | 5/2013 | Lee .................... C23C 14/505 118/500 |
| 2013/0155496 A1* | 6/2013 | Mauvernay .......... C03C 17/366 359/359 |
| 2013/0186141 A1 | 7/2013 | Henry |
| 2013/0209824 A1 | 8/2013 | Sun et al. |
| 2013/0271836 A1* | 10/2013 | Fukaya ................ G02B 1/18 359/507 |
| 2013/0279188 A1 | 10/2013 | Entenmann et al. |
| 2013/0314642 A1 | 11/2013 | Timmerman et al. |
| 2013/0329346 A1 | 12/2013 | Dannoux et al. |
| 2013/0330495 A1 | 12/2013 | Maatta et al. |
| 2014/0014260 A1* | 1/2014 | Chowdhury .......... B32B 15/08 156/60 |
| 2014/0065374 A1 | 3/2014 | Tsuchiya et al. |
| 2014/0141206 A1 | 5/2014 | Gillard et al. |
| 2014/0146538 A1 | 5/2014 | Zenker et al. |
| 2014/0153234 A1 | 6/2014 | Knoche et al. |
| 2014/0153894 A1 | 6/2014 | Jenkins et al. |
| 2014/0168153 A1 | 6/2014 | Deichmann et al. |
| 2014/0168546 A1 | 6/2014 | Magnusson et al. |
| 2014/0186598 A1* | 7/2014 | Ding .................. C03C 17/3644 427/164 |

(56) References Cited

U.S. PATENT DOCUMENTS

| | | |
|---|---|---|
| 2014/0234581 A1 | 8/2014 | Immerman et al. |
| 2014/0308464 A1 | 10/2014 | Levasseur et al. |
| 2014/0312518 A1 | 10/2014 | Levasseur et al. |
| 2014/0333848 A1 | 11/2014 | Chen |
| 2014/0334006 A1* | 11/2014 | Adib ............... C03C 17/006 359/580 |
| 2014/0335330 A1* | 11/2014 | Bellman ............ G02B 1/113 428/428 |
| 2014/0340609 A1 | 11/2014 | Taylor et al. |
| 2014/0376094 A1* | 12/2014 | Bellman ............ G02B 1/10 428/428 |
| 2014/0377522 A1* | 12/2014 | Koch, III ......... C03C 17/3435 428/428 |
| 2015/0015807 A1 | 1/2015 | Franke et al. |
| 2015/0020745 A1* | 1/2015 | Imamura ............ A01K 63/003 119/265 |
| 2015/0072129 A1 | 3/2015 | Okahata et al. |
| 2015/0077429 A1 | 3/2015 | Eguchi et al. |
| 2015/0138638 A1* | 5/2015 | Mashimo ............ G02B 1/18 359/581 |
| 2015/0166394 A1 | 6/2015 | Marjanovic et al. |
| 2015/0168768 A1 | 6/2015 | Nagatani |
| 2015/0177443 A1 | 6/2015 | Faecke et al. |
| 2015/0210588 A1 | 7/2015 | Chang et al. |
| 2015/0246424 A1 | 9/2015 | Venkatachalam et al. |
| 2015/0246507 A1 | 9/2015 | Brown et al. |
| 2015/0249424 A1* | 9/2015 | Hody Le Caer .. B32B 17/10761 428/141 |
| 2015/0274585 A1 | 10/2015 | Rogers et al. |
| 2015/0299470 A1* | 10/2015 | Ngo ............ C09D 5/006 345/173 |
| 2015/0322270 A1* | 11/2015 | Amin ............ C03C 21/002 428/141 |
| 2015/0323705 A1* | 11/2015 | Hart ............ G02B 1/115 359/601 |
| 2015/0336357 A1 | 11/2015 | Kang et al. |
| 2015/0351272 A1 | 12/2015 | Wildner et al. |
| 2015/0357387 A1 | 12/2015 | Lee et al. |
| 2015/0369966 A1* | 12/2015 | Kishi ............ G02B 1/113 428/212 |
| 2016/0002099 A1* | 1/2016 | Manz ............ B32B 17/10036 427/160 |
| 2016/0009066 A1 | 1/2016 | Nieber et al. |
| 2016/0009068 A1 | 1/2016 | Garner |
| 2016/0016849 A1 | 1/2016 | Allan |
| 2016/0039705 A1 | 2/2016 | Kato et al. |
| 2016/0052241 A1 | 2/2016 | Zhang |
| 2016/0054479 A1* | 2/2016 | Ho ............ G02B 1/18 359/601 |
| 2016/0066463 A1 | 3/2016 | Yang et al. |
| 2016/0081204 A1 | 3/2016 | Park et al. |
| 2016/0083282 A1 | 3/2016 | Jouanno et al. |
| 2016/0083292 A1 | 3/2016 | Tabe et al. |
| 2016/0091645 A1 | 3/2016 | Birman et al. |
| 2016/0102015 A1 | 4/2016 | Yasuda et al. |
| 2016/0113135 A1 | 4/2016 | Kim et al. |
| 2016/0207290 A1 | 7/2016 | Cleary et al. |
| 2016/0214889 A1 | 7/2016 | Garner et al. |
| 2016/0216434 A1 | 7/2016 | Shih et al. |
| 2016/0250982 A1 | 9/2016 | Fisher et al. |
| 2016/0252656 A1 | 9/2016 | Waldschmidt et al. |
| 2016/0259365 A1 | 9/2016 | Wang et al. |
| 2016/0272529 A1 | 9/2016 | Hong et al. |
| 2016/0297176 A1 | 10/2016 | Rickerl |
| 2016/0306451 A1 | 10/2016 | Isoda et al. |
| 2016/0313494 A1 | 10/2016 | Hamilton et al. |
| 2016/0354996 A1 | 12/2016 | Alder et al. |
| 2016/0355091 A1 | 12/2016 | Lee et al. |
| 2016/0355901 A1 | 12/2016 | Isozaki et al. |
| 2016/0375808 A1 | 12/2016 | Etienne et al. |
| 2017/0008377 A1* | 1/2017 | Fisher ............ B32B 17/10761 |
| 2017/0010393 A1* | 1/2017 | Varanasi ............ G02B 5/0833 |
| 2017/0021661 A1 | 1/2017 | Pelucchi |
| 2017/0031063 A1* | 2/2017 | Kim ............ C03C 17/3435 |
| 2017/0066223 A1 | 3/2017 | Notsu et al. |
| 2017/0081238 A1 | 3/2017 | Jones et al. |
| 2017/0088454 A1 | 3/2017 | Fukushima et al. |
| 2017/0090071 A1* | 3/2017 | Fukaya ............ G02B 1/115 |
| 2017/0094039 A1 | 3/2017 | Lu |
| 2017/0115944 A1 | 4/2017 | Oh et al. |
| 2017/0129806 A1* | 5/2017 | Fujii ............ C09D 5/1675 |
| 2017/0158551 A1 | 6/2017 | Bookbinder et al. |
| 2017/0160434 A1 | 6/2017 | Hart et al. |
| 2017/0184762 A1* | 6/2017 | Fujii ............ G02B 1/10 |
| 2017/0185289 A1 | 6/2017 | Kim et al. |
| 2017/0190152 A1 | 7/2017 | Notsu et al. |
| 2017/0197561 A1 | 7/2017 | McFarland |
| 2017/0213872 A1 | 7/2017 | Jinbo et al. |
| 2017/0217290 A1 | 8/2017 | Yoshizumi et al. |
| 2017/0217815 A1 | 8/2017 | Dannoux et al. |
| 2017/0235020 A1* | 8/2017 | Bolshakov ............ G02B 1/16 351/159.01 |
| 2017/0240772 A1 | 8/2017 | Dohner et al. |
| 2017/0247291 A1 | 8/2017 | Hatano et al. |
| 2017/0262057 A1 | 9/2017 | Knittl et al. |
| 2017/0263690 A1 | 9/2017 | Lee et al. |
| 2017/0274627 A1 | 9/2017 | Chang et al. |
| 2017/0285227 A1 | 10/2017 | Chen et al. |
| 2017/0299887 A1* | 10/2017 | Maury ............ C23C 14/3407 |
| 2017/0305786 A1 | 10/2017 | Roussev et al. |
| 2017/0307790 A1 | 10/2017 | Bellman et al. |
| 2017/0327402 A1* | 11/2017 | Fujii ............ C03B 23/023 |
| 2017/0334770 A1 | 11/2017 | Luzzato et al. |
| 2017/0349473 A1 | 12/2017 | Moriya et al. |
| 2018/0009197 A1 | 1/2018 | Gross et al. |
| 2018/0014420 A1 | 1/2018 | Amin et al. |
| 2018/0031743 A1 | 2/2018 | Wakatsuki et al. |
| 2018/0050948 A1 | 2/2018 | Faik et al. |
| 2018/0067338 A1* | 3/2018 | Höfener et al. ....... G02B 1/116 |
| 2018/0069053 A1 | 3/2018 | Bok |
| 2018/0072022 A1 | 3/2018 | Tsai et al. |
| 2018/0081085 A1* | 3/2018 | Ge ............ G02B 1/18 |
| 2018/0103132 A1 | 4/2018 | Prushinskiy et al. |
| 2018/0111569 A1* | 4/2018 | Faik ............ B60R 13/02 |
| 2018/0122863 A1 | 5/2018 | Bok |
| 2018/0125228 A1 | 5/2018 | Porter et al. |
| 2018/0134232 A1 | 5/2018 | Helot |
| 2018/0136367 A1* | 5/2018 | Fujii ............ G02B 1/11 |
| 2018/0141850 A1 | 5/2018 | Dejneka et al. |
| 2018/0147985 A1 | 5/2018 | Brown et al. |
| 2018/0149777 A1 | 5/2018 | Brown |
| 2018/0149907 A1 | 5/2018 | Gahagan et al. |
| 2018/0164850 A1 | 6/2018 | Sim et al. |
| 2018/0186674 A1 | 7/2018 | Kumar et al. |
| 2018/0188869 A1 | 7/2018 | Boggs et al. |
| 2018/0208131 A1* | 7/2018 | Mattelet ............ C03C 3/085 |
| 2018/0208494 A1 | 7/2018 | Mattelet et al. |
| 2018/0210118 A1 | 7/2018 | Gollier et al. |
| 2018/0215125 A1 | 8/2018 | Gahagan |
| 2018/0217296 A1* | 8/2018 | Weng ............ C03B 27/012 |
| 2018/0245125 A1 | 8/2018 | Tsai et al. |
| 2018/0304825 A1* | 10/2018 | Mattelet ............ C03C 3/087 |
| 2018/0324964 A1 | 11/2018 | Yoo et al. |
| 2018/0345644 A1 | 12/2018 | Kang et al. |
| 2018/0364760 A1 | 12/2018 | Ahn et al. |
| 2018/0374906 A1 | 12/2018 | Everaerts et al. |
| 2019/0034017 A1 | 1/2019 | Boggs et al. |
| 2019/0039352 A1 | 2/2019 | Zhao et al. |
| 2019/0039935 A1 | 2/2019 | Couillard et al. |
| 2019/0069451 A1 | 2/2019 | Myers et al. |
| 2019/0077337 A1 | 3/2019 | Gervelmeyer |
| 2019/0079339 A1* | 3/2019 | Fujii ............ G02B 1/115 |
| 2019/0152831 A1 | 5/2019 | An et al. |
| 2019/0223309 A1 | 7/2019 | Amin et al. |
| 2019/0295494 A1 | 9/2019 | Wang et al. |
| 2019/0315648 A1 | 10/2019 | Kumar et al. |
| 2019/0329531 A1 | 10/2019 | Brennan et al. |
| 2019/0383971 A1* | 12/2019 | Tachibana ............ G02B 1/11 |
| 2020/0018872 A1* | 1/2020 | Fujii ............ C23C 16/466 |
| 2020/0064535 A1 | 2/2020 | Haan et al. |
| 2020/0231495 A1* | 7/2020 | Lee ............ E06B 9/24 |

(56) References Cited

U.S. PATENT DOCUMENTS

| | | |
|---|---|---|
| 2020/0301192 A1 | 9/2020 | Huang et al. |
| 2020/0346973 A1* | 11/2020 | Akao ............... C03C 3/068 |
| 2021/0055599 A1 | 2/2021 | Chen et al. |

FOREIGN PATENT DOCUMENTS

| | | | |
|---|---|---|---|
| CN | 1587132 A | 3/2005 | |
| CN | 1860081 A | 11/2006 | |
| CN | 101600846 A | 12/2009 | |
| CN | 101684032 A | 3/2010 | |
| CN | 101898871 A * | 12/2010 | |
| CN | 201989544 U | 9/2011 | |
| CN | 102341356 A | 2/2012 | |
| CN | 102464456 A | 5/2012 | |
| CN | 102566841 A | 7/2012 | |
| CN | 102909918 A * | 2/2013 | |
| CN | 103136490 A | 6/2013 | |
| CN | 103395247 A * | 11/2013 | |
| CN | 103587161 A | 2/2014 | |
| CN | 203825589 U | 9/2014 | |
| CN | 104302589 A | 1/2015 | |
| CN | 204111583 U | 1/2015 | |
| CN | 104553126 A * | 4/2015 | ............ B32B 17/00 |
| CN | 104656999 A | 5/2015 | |
| CN | 104679341 A | 6/2015 | |
| CN | 104691040 A * | 6/2015 | ............ B32B 17/06 |
| CN | 204451390 U * | 7/2015 | |
| CN | 204463066 U | 7/2015 | |
| CN | 104843976 A | 8/2015 | |
| CN | 104908377 A * | 9/2015 | |
| CN | 105118391 A | 12/2015 | |
| CN | 105511127 A | 4/2016 | |
| CN | 105585253 A * | 5/2016 | |
| CN | 205239166 U | 5/2016 | |
| CN | 105705330 A | 6/2016 | |
| CN | 205501124 U * | 8/2016 | |
| CN | 106256794 A | 12/2016 | |
| CN | 205905907 U | 1/2017 | |
| CN | 106458683 A | 2/2017 | |
| CN | 206114596 U | 4/2017 | |
| CN | 206114956 U | 4/2017 | |
| CN | 107076875 A | 8/2017 | |
| CN | 107382090 A * | 11/2017 | |
| CN | 107613809 A | 1/2018 | |
| CN | 107703567 A * | 2/2018 | ............... G02B 1/14 |
| CN | 107735697 A | 2/2018 | |
| CN | 107757516 A | 3/2018 | |
| CN | 108519831 A | 9/2018 | |
| CN | 108550587 A | 9/2018 | |
| CN | 108725350 A | 11/2018 | |
| CN | 109135605 A | 1/2019 | |
| CN | 109383083 A * | 2/2019 | ............ B32B 17/00 |
| CN | 109690662 A | 4/2019 | |
| CN | 109743421 A | 5/2019 | |
| CN | 113391380 A * | 9/2021 | ............... C08J 7/06 |
| DE | 4415787 A1 | 11/1995 | |
| DE | 4415878 A1 | 11/1995 | |
| DE | 69703490 T2 | 5/2001 | |
| DE | 102004022008 A1 | 12/2004 | |
| DE | 102004002208 A1 | 8/2005 | |
| DE | 102009021938 A1 | 11/2010 | |
| DE | 102010007204 A1 | 8/2011 | |
| DE | 102013214108 A1 | 2/2015 | |
| DE | 102014116798 A1 | 5/2016 | |
| DE | 102015114877 A1 * | 3/2017 | ......... C03C 17/3417 |
| EP | 0076924 A2 | 4/1983 | |
| EP | 0316224 A1 | 5/1989 | |
| EP | 0347049 A2 | 12/1989 | |
| EP | 0418700 A1 | 3/1991 | |
| EP | 0423698 A1 | 4/1991 | |
| EP | 0525970 A1 | 2/1993 | |
| EP | 0664210 A1 | 7/1995 | |
| EP | 1013622 A1 | 6/2000 | |
| EP | 1031409 A1 | 8/2000 | |
| EP | 1046493 A2 | 10/2000 | |
| EP | 0910721 B1 | 11/2000 | |
| EP | 1647663 A1 | 4/2006 | |
| EP | 2236281 A1 | 10/2010 | |
| EP | 2385630 A2 | 11/2011 | |
| EP | 2521118 A2 | 11/2012 | |
| EP | 2852502 A2 | 4/2015 | |
| EP | 2933718 A1 | 10/2015 | |
| EP | 3093181 A2 | 11/2016 | |
| EP | 3100854 A1 | 12/2016 | |
| EP | 3118174 A1 | 1/2017 | |
| EP | 3118175 A1 | 1/2017 | |
| EP | 3144141 A1 | 3/2017 | |
| EP | 3156286 A1 | 4/2017 | |
| EP | 3189965 A1 | 7/2017 | |
| EP | 3288791 A1 | 3/2018 | |
| EP | 3426614 A1 | 1/2019 | |
| EP | 3532442 A1 | 9/2019 | |
| FR | 2750075 A1 | 12/1997 | |
| FR | 2918411 A1 | 1/2009 | |
| FR | 3012073 A1 | 4/2015 | |
| GB | 0805770 A | 12/1958 | |
| GB | 0991867 A | 5/1965 | |
| GB | 1319846 A | 6/1973 | |
| GB | 2011316 A | 7/1979 | |
| GB | 2281542 A | 3/1995 | |
| JP | 55-154329 | 12/1980 | |
| JP | 57-048082 A | 3/1982 | |
| JP | 58-073681 A | 5/1983 | |
| JP | 58-194751 | 11/1983 | |
| JP | 59-076561 A | 5/1984 | |
| JP | 63-089317 A | 4/1988 | |
| JP | 63-190730 | 8/1988 | |
| JP | 3059337 U | 6/1991 | |
| JP | 03-059337 B2 | 9/1991 | |
| JP | 03-228840 A | 10/1991 | |
| JP | 04-119931 | 4/1992 | |
| JP | 05-116972 A | 5/1993 | |
| JP | 06-340029 A | 12/1994 | |
| JP | 10-218630 A | 8/1998 | |
| JP | 11-001349 A | 1/1999 | |
| JP | 11-006029 A | 1/1999 | |
| JP | 11-060293 A | 3/1999 | |
| JP | 11171596 A * | 6/1999 | |
| JP | 11204065 A * | 7/1999 | |
| JP | 2000-260330 A | 9/2000 | |
| JP | 2002014203 A * | 1/2002 | |
| JP | 2002-255574 A | 9/2002 | |
| JP | 2003-500260 A | 1/2003 | |
| JP | 2003-276571 A | 10/2003 | |
| JP | 2003-321257 A | 11/2003 | |
| JP | 2004-101712 A | 4/2004 | |
| JP | 2004138662 A * | 5/2004 | |
| JP | 2004-284839 A | 10/2004 | |
| JP | 2005031297 A * | 2/2005 | |
| JP | 2005031298 A * | 2/2005 | |
| JP | 2005283730 A * | 10/2005 | |
| JP | 2006017870 A * | 1/2006 | |
| JP | 2006-181936 A | 7/2006 | |
| JP | 2007-188035 A | 7/2007 | |
| JP | 2007-197288 A | 8/2007 | |
| JP | 2007256346 A * | 10/2007 | |
| JP | 2009075325 A * | 4/2009 | |
| JP | 2009122416 A * | 6/2009 | |
| JP | 2009244623 A * | 10/2009 | |
| JP | 2010-145731 A | 7/2010 | |
| JP | 2011069995 A * | 4/2011 | |
| JP | 4739470 B2 * | 8/2011 | ............ C03C 17/36 |
| JP | 2012-111661 A | 6/2012 | |
| JP | 2013-084269 A | 5/2013 | |
| JP | 2014-126564 A | 7/2014 | |
| JP | 2015-502901 A | 1/2015 | |
| JP | 2015-092422 A | 5/2015 | |
| JP | 5748082 B2 | 7/2015 | |
| JP | 5796561 B2 | 10/2015 | |
| JP | 2016-500458 A | 1/2016 | |
| JP | 2016-031696 A | 3/2016 | |
| JP | 2016080857 A * | 5/2016 | |
| JP | 2016-517380 A | 6/2016 | |
| JP | 2016-130810 A | 7/2016 | |

(56) References Cited

FOREIGN PATENT DOCUMENTS

| | | | | |
|---|---|---|---|---|
| JP | 2016-144008 A | 8/2016 | | |
| JP | 5976561 B2 | 8/2016 | | |
| JP | 2016-173794 A | 9/2016 | | |
| JP | 2016-530204 A | 9/2016 | | |
| JP | 2016-203609 A | 12/2016 | | |
| JP | 2016-207200 A | 12/2016 | | |
| JP | 2017021293 A | * 1/2017 | | |
| JP | 2017206392 A | * 11/2017 | | |
| JP | 6281825 B2 | 2/2018 | | |
| JP | 6340029 B2 | 6/2018 | | |
| KR | 2002-0019045 A | 3/2002 | | |
| KR | 10-0479282 B1 | 8/2005 | | |
| KR | 10-2008-0023888 A | 3/2008 | | |
| KR | 10-2013-0005776 A | 1/2013 | | |
| KR | 10-2014-0111403 A | 9/2014 | | |
| KR | 10-2015-0026911 A | 3/2015 | | |
| KR | 10-2015-0033969 A | 4/2015 | | |
| KR | 10-2015-0051458 A | 5/2015 | | |
| KR | 10-1550833 B1 | 9/2015 | | |
| KR | 10-2015-0121101 A | 10/2015 | | |
| KR | 10-2016-0118746 A | 10/2016 | | |
| KR | 10-1674060 B1 | 11/2016 | | |
| KR | 10-2016-0144008 A | 12/2016 | | |
| KR | 10-2017-0000208 A | 1/2017 | | |
| KR | 10-2017-0106263 A | 9/2017 | | |
| KR | 10-2017-0107124 A | 9/2017 | | |
| KR | 10-2017-0113822 A | 10/2017 | | |
| KR | 10-2017-0121674 A | 11/2017 | | |
| KR | 10-2018-0028597 A | 3/2018 | | |
| KR | 10-2018-0049484 A | 5/2018 | | |
| KR | 10-2018-0049780 A | 5/2018 | | |
| KR | 10-2019-0001864 A | 1/2019 | | |
| KR | 10-2019-0081264 A | 7/2019 | | |
| TW | 200704268 A | 1/2007 | | |
| TW | 201438895 A | 10/2014 | | |
| TW | 201546006 A | 12/2015 | | |
| TW | 201636309 A | 10/2016 | | |
| TW | 201637857 A | 11/2016 | | |
| TW | 201715257 A | 5/2017 | | |
| VN | 58334 | 7/2018 | | |
| WO | 94/25272 A1 | 11/1994 | | |
| WO | 97/39074 A1 | 10/1997 | | |
| WO | 98/01649 A1 | 1/1998 | | |
| WO | 00/73062 A1 | 12/2000 | | |
| WO | WO-2006009065 A1 | * 1/2006 | ............... | G02B 1/11 |
| WO | 2006/095005 A1 | 9/2006 | | |
| WO | 2007/108861 A1 | 9/2007 | | |
| WO | 2008/042731 A1 | 4/2008 | | |
| WO | 2008/153484 A1 | 12/2008 | | |
| WO | 2009/072530 A1 | 6/2009 | | |
| WO | 2011/029852 A1 | 3/2011 | | |
| WO | 2011/144359 A1 | 11/2011 | | |
| WO | 2011/155403 A1 | 12/2011 | | |
| WO | 2012/005307 A1 | 1/2012 | | |
| WO | 2012/058084 A2 | 5/2012 | | |
| WO | WO-2012147876 A1 | * 11/2012 | ............... | G02B 1/11 |
| WO | 2012/166343 A2 | 12/2012 | | |
| WO | 2013/072611 A1 | 5/2013 | | |
| WO | 2013/072612 A1 | 5/2013 | | |
| WO | WO-2013140811 A1 | * 9/2013 | ............. | G02B 1/111 |
| WO | WO-2013141478 A1 | * 9/2013 | ............... | B32B 7/02 |
| WO | 2013/174715 A1 | 11/2013 | | |
| WO | 2013/175106 A2 | 11/2013 | | |
| WO | 2014/085663 A1 | 6/2014 | | |
| WO | 2014/107640 A1 | 7/2014 | | |
| WO | 2014/172237 A2 | 10/2014 | | |
| WO | 2014/175371 A1 | 10/2014 | | |
| WO | WO-2015000534 A1 | * 1/2015 | ............... | G02B 1/11 |
| WO | 2015/031594 A2 | 3/2015 | | |
| WO | 2015/055583 A1 | 4/2015 | | |
| WO | 2015/057552 A2 | 4/2015 | | |
| WO | WO-2015070254 A1 | * 5/2015 | ............. | C23C 16/345 |
| WO | 2015/084902 A1 | 6/2015 | | |
| WO | WO-2015085283 A1 | * 6/2015 | ............. | G02B 1/115 |
| WO | 2015/141966 A1 | 9/2015 | | |
| WO | 2016/007815 A1 | 1/2016 | | |
| WO | 2016/007843 A1 | 1/2016 | | |
| WO | 2016/010947 A1 | 1/2016 | | |
| WO | 2016/010949 A1 | 1/2016 | | |
| WO | 2016/044360 A1 | 3/2016 | | |
| WO | 2016/069113 A1 | 5/2016 | | |
| WO | 2016/070974 A1 | 5/2016 | | |
| WO | 2016/115311 A1 | 7/2016 | | |
| WO | 2016/125713 A1 | 8/2016 | | |
| WO | 2016/136758 A1 | 9/2016 | | |
| WO | WO-2016152691 A1 | * 9/2016 | ............... | B05D 5/06 |
| WO | 2016/173699 A1 | 11/2016 | | |
| WO | 2016/183059 A1 | 11/2016 | | |
| WO | 2016/195301 A1 | 12/2016 | | |
| WO | 2016/196531 A1 | 12/2016 | | |
| WO | 2016/196546 A1 | 12/2016 | | |
| WO | 2016/202605 A1 | 12/2016 | | |
| WO | 2017/015392 A1 | 1/2017 | | |
| WO | 2017/019851 A1 | 2/2017 | | |
| WO | 2017/023673 A1 | 2/2017 | | |
| WO | 2017/106081 A1 | 6/2017 | | |
| WO | 2017/146866 A1 | 8/2017 | | |
| WO | 2017/155932 A1 | 9/2017 | | |
| WO | 2017/158031 A1 | 9/2017 | | |
| WO | 2018/005646 A1 | 1/2018 | | |
| WO | 2018/009504 A1 | 1/2018 | | |
| WO | 2018/015392 A1 | 1/2018 | | |
| WO | 2018/075853 A1 | 4/2018 | | |
| WO | 2018/081068 A1 | 5/2018 | | |
| WO | 2018/102332 A1 | 6/2018 | | |
| WO | 2018/125683 A1 | 7/2018 | | |
| WO | 2018/160812 A2 | 9/2018 | | |
| WO | WO-2018158464 A1 | * 9/2018 | ......... | C03C 17/3417 |
| WO | 2018/200454 A1 | 11/2018 | | |
| WO | 2018/200807 A1 | 11/2018 | | |
| WO | 2018/213267 A1 | 11/2018 | | |
| WO | 2019/055469 A1 | 3/2019 | | |
| WO | 2019/055652 A1 | 3/2019 | | |
| WO | 2019/074800 A1 | 4/2019 | | |
| WO | 2019/075065 A1 | 4/2019 | | |
| WO | WO-2019064969 A1 | * 4/2019 | ............... | B32B 7/02 |
| WO | 2019/151618 A1 | 8/2019 | | |
| WO | WO-2020116757 A1 | * 6/2020 | ......... | C03C 17/3417 |

OTHER PUBLICATIONS

Machine Translation of CN-105585253-A, May 2016 (Year: 2016).*
Machine Translation of JP-2017206392-A, Jan. 2017 (Year: 2017).*
Machine Translation of WO-2018158464-A1, Sep. 2018 (Year: 2018).*
Author Unknown; "Stress Optics Laboratory Practice Guide" 2012; 11 Pages.
Belis et al; "Cold Bending of Laminated Glass Panels"; Heron vol. 52 (2007) No. 1/2; 24 Pages.
Doyle et al; "Manual on Experimental Stress Analysis"; Fifth Edition, Society for Experimental Mechanics; Unknown Year; 31 Pages.
Elziere; "Laminated Glass: Dynamic Rupture of Adhesion"; Polymers; Universite Pierre Et Marie Curie—Paris VI, 2016. English; 181 Pages.
Fildhuth et al; "Considerations Using Curved, Heat or Cold Bent Glass for Assembling Full Glass Shells", Engineered Transparency, International Conference at Glasstec, Dusseldorf, Germany, Oct. 25 and 26, 2012; 11 Pages.
Fildhuth et al; "Interior Stress Monitoring of Laminated Cold Bent Glass With Fibre Bragg Sensors", Challenging Glass 4 & Cost Action TU0905 Final Conference Louter, Bos & Belis (Eds), 2014; 8 Pages.
Fildhuth et al; "Layout Strategies and Optimisation of Joint Patterns in Full Glass Shells", Challenging Glass 3—Conference on Architectural and Structural Applications of Glass, Bos, Louter, Nijsse, Veer (Eds.), Tu Delft, Jun. 2012; 13 Pages.
Fildhuth et al; "Recovery Behaviour of Laminated Cold Bent Glass—Numerical Analysis and Testing"; Challenging Glass 4 & Cost Action TU0905 Final Conference—Louter, Bos & Beus (Eds) (2014); 9 Pages.

(56) References Cited

OTHER PUBLICATIONS

Fildhuth; "Design and Monitoring of Cold Bent Lamination—Stabilised Glass"; ITKE 39 (2015) 270 Pages.
Galuppi et al; "Cold-Lamination—Bending of Glass: Sinusoidal is Better Than Circular", Composites Part B 79 (2015) 285-300.
Galuppi et al; "Optical Cold Bending of Laminated Glass"; Internaitonal Journal of Solids and Structures, 67-68 (2015) pp. 231-243.
Millard; "Bending Glass in the Parametric Age"; Enclos; (2015); pp. 1-6; http://www.enclos.com/site-info/news/bending-glass-in-the-parametric-age.
Neugebauer et al; "Let Thin Glass in the FAADE Move Thin Glass—New Possibilities for Glass in the FAADE", Conference Paper Jun. 2018; 12 Pages.
Vakar et al; "Cold Bendable, Laminated Glass—New Possibilities in Design"; Structural Engineering International, Feb. 2004 pp. 95-97.
Weijde; "Graduation Plan"; Jan. 2017; 30 Pages.
Werner; "Display Materials and Processes," Information Display; May 2015; 8 Pages.
Chinese Patent Application No. 201980023273.9, Office Action dated Dec. 23, 2021, 13 pages English Translation, Chinese Patent Office.
European Patent Application No. 19714264.9 Communication pursuant to Article 94(3) EPC dated Apr. 6, 2023; 9 Pages; European Patent Office.
"Standard Test Method for Measurement of Glass Stress—Optical Coefficient", ASTM International, Designation: C770-16, 2016.
ASTM C1279-13 "Standard Test Method for Non-Destructive Photoelastic Measurement of Edge and Surface Stresses in Annealed, Heat-Strengthened, and Fully Tempered Flat Glass"; Downloaded Jan. 24, 2018; 11 Pages.
ASTM C1422/C1422M-10 "Standard Specification for Chemically Strengthened Flat Glass"; Downloaded Jan. 24, 2018; 5 pages.
Ferwerda et al., "Perception of sparkle in anti-glare display screens", Journal of the SID, vol. 22, Issue 2, 2014, pp. 129-136.
Gollier et al., "Display Sparkle Measurement and Human Response", SID Symposium Digest of Technical Papers, vol. 44, Issue 1, 2013, pp. 295-297.
International Search Report and Written Opinion of the International Searching Authority; PCT/US19/020343; Mailed Jul. 19, 2019; 18 Pages; European Patent Office.
Invitation to Pay Additional Fees of the International Searching Authority; PCT/US2019/020343; Mailed May 24, 2019; 15 Pages; European Patent Office.
Li et al., "Effective Surface Treatment on the Cover Glass for AutoInterior Applications", SID Symposium Digest of Technical Papers, vol. 47, 2016, pp. 467-469.
Taiwanese Patent Application No. 108107064, Office Action dated Jan. 16, 2023, 2 pages (English Translation Only); Taiwanese Patent Office.
"Stainless Steel—Grade 410 (UNS S41000)", available online at <https://www.azom.com/article.aspx?ArticleID=970>, Oct. 23, 2001, 5 pages.
Ashley Klamer, "Dead front overlays", Marking Systems, Inc., Jul. 8, 2013, 2 pages.
ASTM Standard C770-98 (2013), "Standard Test Method for Measurement of Glass Stress-Optical Coefficient".
Burchardt et al., (Editorial Team), Elastic Bonding: The basic principles of adhesive technology and a guide to its cost-effective use in industry, 2006, 71 pages.
Byun et al; "A Novel Route for Thinning of LCD Glass Substrates"; SID 06 Digest; pp. 1786-1788, v37, 2006.
Datsiou et al., "Behaviour of cold bent glass plates during the shaping process", Engineered Transparency. International Conference atglasstec, Dusseldorf, Germany, Oct. 21 and 22, 2014, 9 pages.
Engineering ToolBox, "Coefficients of Linear Thermal Expansion", available online at <https://www.engineeringtoolbox.com/linear-expansion-coefficients-d_95.html>, 2003, 9 pages.
Fauercia "Intuitive HMI for a Smart Life on Board" (2018); 8 Pages http://www.faurecia.com/en/innovation/smart-life-board/intuitive-HMI.
Faurecia: Smart Pebbles, Nov. 10, 2016 (Nov. 10, 2016), XP055422209, Retrieved from the Internet: URL:https://web.archive.org/web/20171123002248/http://www.faurecia.com/en/innovation/discover-our-innovations/smart-pebbles [retrieved on Nov. 23, 2017].
Galuppi et al; "Buckling Phenomena in Double Curved Cold-Bent Glass;" Intl. J. Non-Linear Mechanics 64 (2014) pp. 70-84.
Galuppi et al; "Large Deformations and Snap-Through Instability of Cold-Bent Glass"; Challenging Glass 4 & Cost Action TU0905 Final Conference; (2014) pp. 681-689.
Galuppi L et al: "Optimal cold bending of laminated glass", Jan. 1, 2007 vol. 52, No. 1/2 Jan. 1, 2007 (Jan. 1, 2007), pp. 123-146.
Indian Patent Application No. 201917031293 Office Action dated May 24, 2021; 6 pages; Indian Patent Office.
Jalopnik, "This Touch Screen Car Interior is a Realistic Vision of the Near Future", jalopnik.com, Nov. 19, 2014, https://jalopnik.com/this-touch-screen-car-interior-is-a-realistic-vision-of-1660846024 (Year: 2014).
Pambianchi et al; "Corning Incorporated: Designing a New Future With Glass and Optics"; Chapter 1 in "Materials Research for Manufacturing: An Industrial Perspective of Turning Materials Into New Products"; Springer Series Material Science 224, p. 12 (2016).
Pegatron Corp. "Pegaton Navigate the Future"; Ecockpit/Center CNsole Work Premiere; Automotive World; Downloaded Jul. 12, 2017; 2 Pages.
Photodon, "Screen Protectors for Your Car's Navi System That You're Gonna Love", photodon.com, Nov. 6, 2015, https://www.photodon.com/blog/archives/screen-protectors-for-your-cars-navi-system-that-youre-gonna-love) (Year: 2015).
Product Information Sheet: Corning® Gorilla® Glass 3 with Native Damage Resistance™, Corning Incorporated, 2015, Rev: F_090315, 2 pages.
Scholze, H., "Glass-Water Interactions", Journal of Non-Crystalline Solids vol. 102, Issues 1-3, Jun. 1, 1988, pp. 1-10.
Stattler; "New Wave—Curved Glass Shapes Design"; Glass Magazine; (2013); 2 Pages.
Stiles Custom Metal, Inc., Installation Recommendations, 2010 https://stilesdoors.com/techdata/pdf/Installation%20Recommendations%20HM%20Windows,%20Transoms%20&%>OSidelites%200710.pdf) (Year: 2010).
Tomozawa et al., "Hydrogen-to-Alkali Ratio in Hydrated Alkali Aluminosilicate Glass Surfaces", Journal of Non-Crystalline Solids, vol. 358, Issue 24, Dec. 15, 2012, pp. 3546-3550.
Zhixin Wang, Polydimethylsiloxane mechanical properties measured by macroscopic compression and nanoindentation techniques, Graduate Theses and Dissertations, University of South Florida, 2011, 79 pages.

* cited by examiner

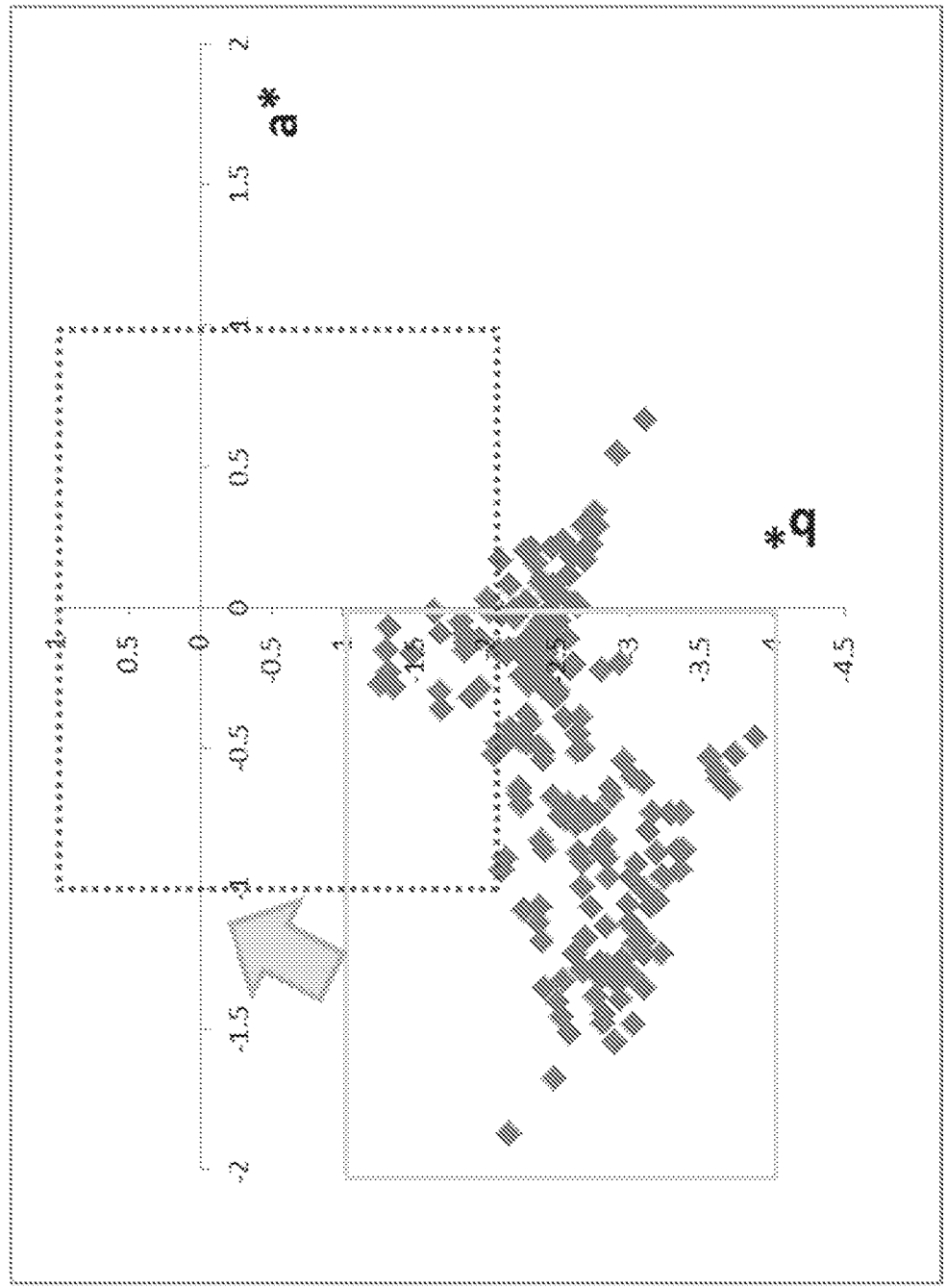

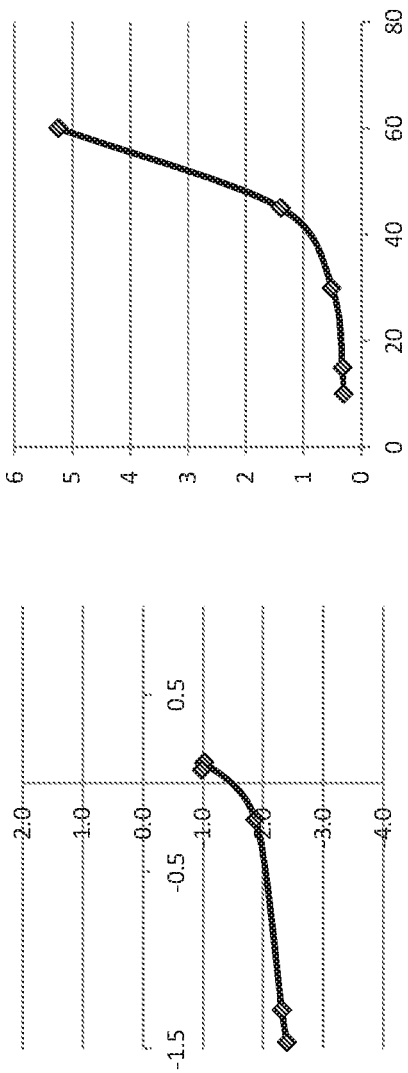
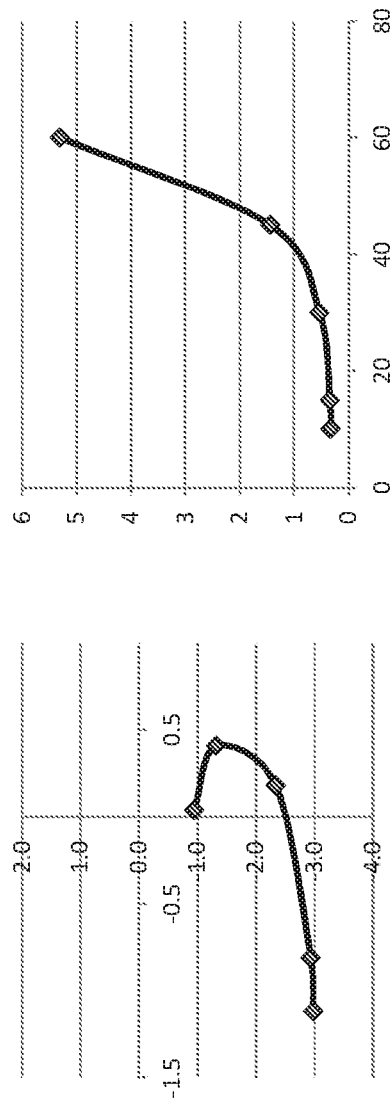
FIGURE 12I
FIGURE 12J
FIGURE 12K
FIGURE 12L

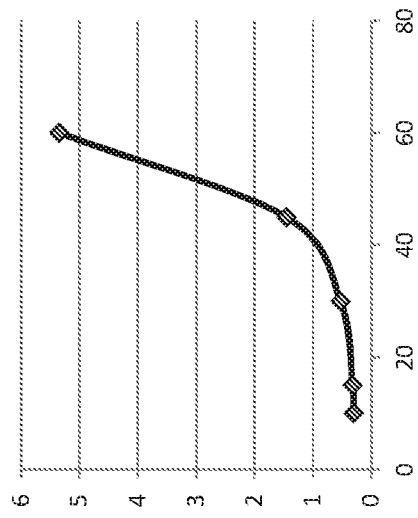
FIGURE 12M
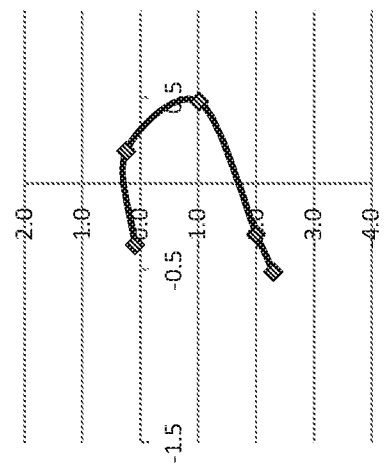
FIGURE 12O
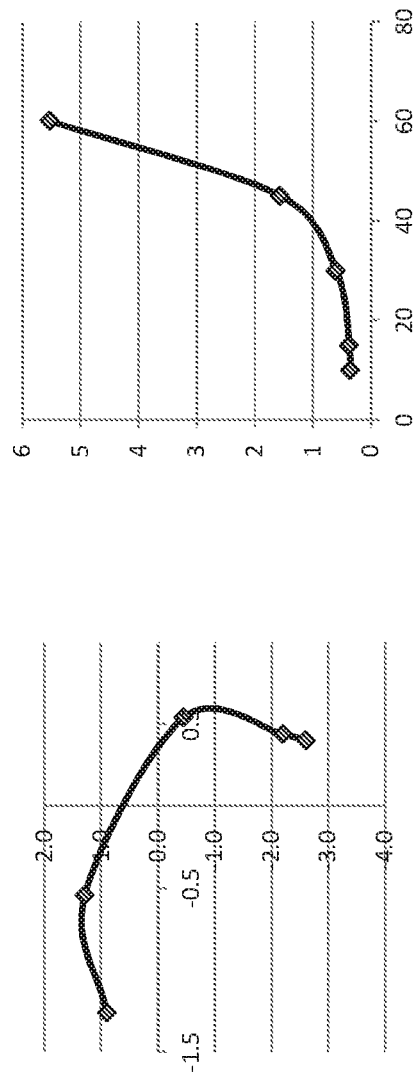
FIGURE 12N
FIGURE 12P

ANTI-REFLECTIVE COATINGS AND ARTICLES AND METHODS OF FORMING THE SAME

CROSS-REFERENCE TO RELATED APPLICATIONS

This application is a national stage application under 35 U.S.C. § 371 of International Application No.: PCT/US2019/020343 filed on Mar. 1, 2019, which claims the benefit of priority under 35 U.S.C. § 119 of U.S. Provisional Application Ser. No. 62/637,666 filed on Mar. 2, 2018, the content of which is relied upon and incorporated herein by reference in its entirety.

BACKGROUND

This disclosure relates to anti-reflective coatings, articles including anti-reflective coatings, and methods of forming the same. In particular, this disclosure relates to articles having anti-reflective coatings, and more particularly to articles having anti-reflective coatings with reduced color shift across a wide range of viewing angles.

Cover articles are often used to protect critical devices within electronic products, to provide a user interface for input and/or display, and/or many other functions. Such products include mobile devices, such as smart phones, mp3 players, and computer tablets. Cover articles also include architectural articles, transportation articles (e.g., articles used in automotive applications, trains, aircraft, sea craft, etc.), and appliance articles. Some applications require that the color exhibited or perceived, in reflection and/or transmission, does not change appreciably as the viewing angle is changed. If the color in reflection or transmission does change with viewing angle to an appreciable degree, the user of the product will perceive a change in color or brightness of the display, which can diminish the perceived quality of the display. In other applications, changes in color may negatively impact the aesthetic requirements or other functional requirements.

The optical performance of cover articles can be improved by using various anti-reflective coatings. However, even when using anti-reflective coatings, color in reflection or transmission may still change appreciably with different viewing angles, particularly when extended to wide viewing angles. In some applications, this decreased optical performance at wide viewing angles can be mitigated because the user of the product can somewhat control the viewing angle to minimize noticeable color changes. For example, when using a mobile device such as a phone or tablet, the user can easily orient the display of the device to reduce viewing angles or variations in viewing angle. In other applications, however, a user may not have the same level of control of the viewing angle due to, for example, the user's viewpoint being fixed relative to the article, the orientation of the article being fixed relative to the user, or both. This can be the case in automobile or other vehicular applications, were the user's viewpoint is relatively fixed and a given article, such as a dashboard, control panel or display, may extend across a wide range of viewing angles from user's perspective and/or may be relatively fixed in orientation relative to the user.

Accordingly, there is a need for new anti-reflective coatings, cover articles with anti-reflective coatings, and methods for their manufacture, which have improved color uniformity at wide ranges of viewing angles.

SUMMARY

Embodiments of an anti-reflective article are described. In one or more embodiments, the article includes an anti-reflective coating that is near-neutral in color across a wide range of viewing angles. In one or more embodiments, the article is a substrate on which the anti-reflective coating is disposed.

In one or more embodiments, the substrate includes a first major surface and a second major surface opposite the first major surface and separated from the first major surface by a thickness of the substrate. The anti-reflective coating is disposed on the first major surface of the substrate, and at a point on the anti-reflective coating opposite the first major surface (at the reflective surface, described herein), the article exhibits a single-surface reflectance under a D65 illuminant having an angular color variation, $\Delta E_\theta$, defined as:

$$\Delta E_\theta = \sqrt{\{(a^*_{\theta 1} - a^*_{\theta 2})^2 + (b^*_{\theta 1} - b^*_{\theta 2})^2\}}$$

where $a^*_{\theta 1}$ and $b^*_{\theta 1}$ are $a^*$ and $b^*$ values of the point measured from a first angle $\theta_1$, and $a^*_{\theta 2}$ and $b^*_{\theta 2}$ are $a^*$ and $b^*$ values of the point measured from a second angle $\theta_2$, $\theta_1$ and $\theta_2$ being any two different viewing angles at least 5 degrees apart in a range from about 10° to about 60° relative to a normal vector of the reflective surface. In one or more embodiments, $\Delta E_\theta$ is less than 5.

In one or more embodiments, the reflective surface of the substrate exhibits a single-sided reflected color with an $a^*$ value from about −2 to about 1, and a $b^*$ value from about −4 to about 1 at a viewing angle in a range from about 10° to about 60°, or at all viewing angels in a range from about 10° to about 60°. In some embodiments, the reflective surface exhibits a single-side reflected color with an $a^*$ value from about −2 to about 0, and a $b^*$ value from about −4 to about −1 at a viewing angle of about 10°, and/or a single-sided reflected color with an $a^*$ value from about −1 to about 1, and a $b^*$ value from about −2 to about 1 at a viewing angle of about 60°.

According to one or more embodiments, the anti-reflective coating includes a stack of alternating high- and low-index materials. The low index material can be silica ($SiO_2$), and the high index material can be niobium oxide ($Nb_2O_5$) or titanium oxide ($TiO_x$). In some embodiments, the stack is a four-layer stack, and can be a four-layer stack including a first niobium oxide ($Nb_2O_5$) layer disposed on the buffer layer, a first silica ($SiO_2$) layer disposed on the first niobium oxide layer, a second niobium oxide ($Nb_2O_5$) layer disposed on the first silica layer, and a second silica ($SiO_2$) layer disposed on the second niobium oxide layer.

In one or more embodiments, a vehicle includes the substrate discussed above, where the substrate is a vehicle interior surface such as a dashboard cover, an instrument panel cover, a control panel cover, a center console cover, a steering wheel cover, a side door component cover, an entertainment unit over, or a graphical or video display cover.

According to one or more embodiments, an anti-reflective coating is provided. The anti-reflective coating includes a stack of alternating high- and low-index materials, and includes a reflective surface configured to face an observer. At a point on the reflective surface, the anti-reflective coating exhibits a single-surface reflectance under a D65 illuminant having an angular color variation, $\Delta E_\theta$, defined as:

$$\Delta E_\theta = \sqrt{\{(a^*_{\theta 1} - a^*_{\theta 2})^2 + (b^*_{\theta 1} - b^*_{\theta 2})^2\}}$$

where $a^*_{\theta 1}$ and $b^*_{\theta 1}$ are $a^*$ and $b^*$ values of the point measured from a first angle $\theta_1$, and $a^*_{\theta 2}$ and $b^*_{\theta 2}$ are $a^*$ and $b^*$ values of the point measured from a second angle $\theta_2$, $\theta_1$ and $\theta_2$ being any two different viewing angles at least 5 degrees apart in a range from about 10° to about 60° relative to a normal vector of the reflective surface, and where $\Delta E_\theta$ is less than 5.

One or more embodiments include a method of producing an anti-reflective coating. The method includes providing a substrate having a first major surface, and depositing an anti-reflective coating on the first major surface. The anti-reflective coating including a stack disposed on the first major surface, and having alternating layers of silica ($SiO_2$) and niobium oxide ($Nb_2O_5$). At a point on the first major surface having the anti-reflective coating, the anti-reflective coating exhibits a single-surface reflectance under a D65 illuminant having an angular color variation, $\Delta E_\theta$, defined as:

$$\Delta E_\theta = \sqrt{\{(a^*_{\theta 1} - a^*_{\theta 2})^2 + (b^*_{\theta 1} - b^*_{\theta 2})^2\}}$$

where $a^*_{\theta 1}$ and $b^*_{\theta 1}$ are $a^*$ and $b^*$ values of the point measured from a first angle $\theta_1$, and $a^*\theta_2$ and $b^*\theta_2$ are $a^*$ and $b^*$ values of the point measured from a second angle $\theta_2$, $\theta_1$ and $\theta_2$ being any two different viewing angles at least 5 degrees apart in a range from about 10° to about 60° relative to a normal vector of the first major surface, and where $\Delta E_\theta$ is less than 5.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 11 is a plot of measured color values of the single-sided reflectance of examples, according to some embodiments of the present disclosure;

DETAILED DESCRIPTION

Reference will now be made in detail to various embodiments, examples of which are illustrated in the accompanying drawings.

Embodiments discussed herein are directed to anti-reflective (AR) coatings with substantially no color change at a variety of viewing angles, including large viewing angles. As a result, it is possible to achieve an improved, stable reflective-color surface coating that provides uniform neutral color, especially for wide view angle and/or over a large surface area or curved surface. Such AR coatings can be used with large cover glass that may have inked decoration or other decorative or design elements. By providing uniform neutral color over wide viewing angles and/or a large or curved surface area, such decorations or designs can be enjoyed by users without distracting or unpleasing color variation across the surface or at different viewing angles.

The above concerns are particularly relevant in automotive or vehicle interiors, where the interior surfaces of the vehicle are exposed to harsh and dynamic lighting conditions. In addition, vehicles are being equipped with an increasing number of displays and other surfaces having cover glass. For example, current or future vehicles may have cover glass covering all or part of a vehicle dashboard, instrument panel, center console, steering wheel, side doors, roofs, seat backs, and other vehicle interior surfaces. Displays may be present in any or all of these surfaces. However, users of vehicles are relatively fixed in position and/or viewing angle relative to vehicle interior surfaces. This lack of control of viewing position and/or angle, coupled with the harsh and ever-changing lighting conditions, create special challenges in vehicle interiors. For instance, in addition to the desire of manufacturers and users of vehicles to have uniform and aesthetically pleasing vehicle interior surfaces and displays, the utility of vehicle interior surfaces and displays is important. Poor optical performance or color variation over ranging viewing angles or large surface areas can negatively impact a user's ability to take full advantage of information that may be displayed on these vehicle interior surfaces. Accordingly, the ability to provide uniform neutral color over wide viewing angles and/or a large surface area, as provided by embodiments disclosed herein, can allow for improved user experiences in vehicles.

While vehicle interiors represent a particularly useful application of the AR coatings described herein, embodiments of the present disclosure are not limited to these scenarios and can be used in any scenario in which an anti-reflective coating can be applied. Thus, the following discusses AR coatings on articles, which can include any number of objects, substrates, or surfaces, including glass surfaces and glass used in vehicle interiors.

Figure 1:
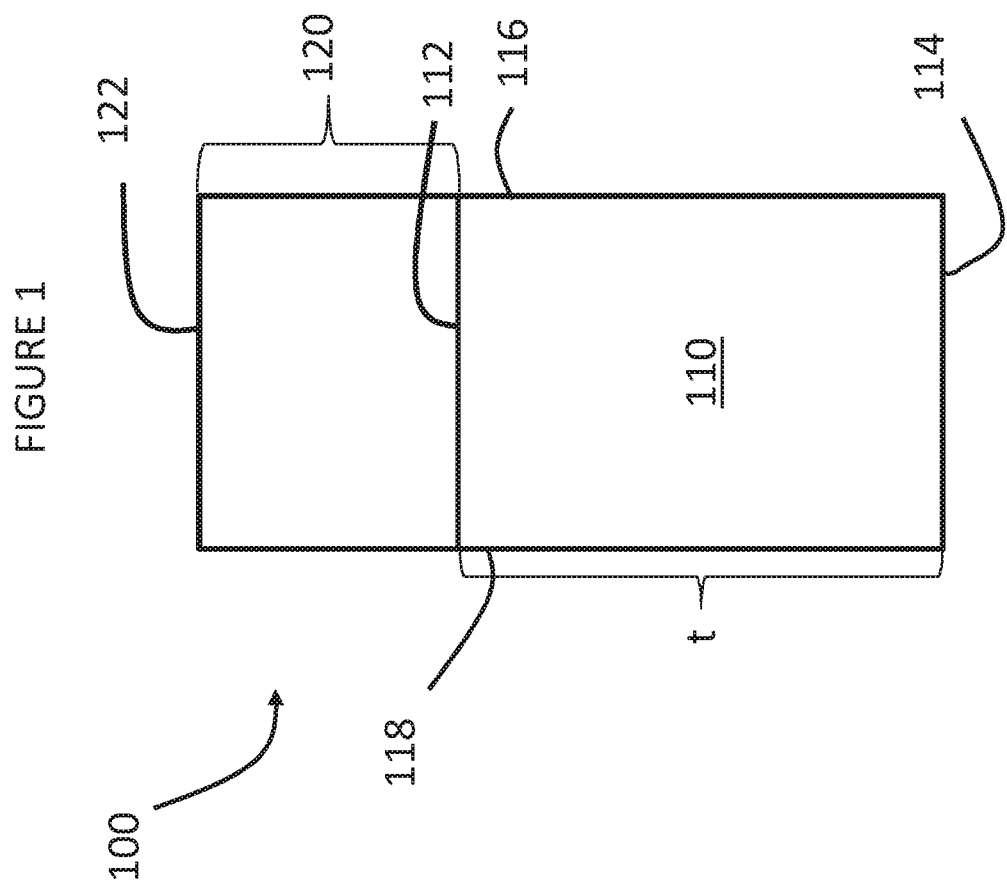
FIG. 1 is a side view of an article with an anti-reflective coating, according to one or more embodiments.

Referring to FIG. 1, the article 100 according to one or more embodiments may include a substrate 110, and an anti-reflective coating 120 disposed on the substrate. The substrate 110 includes opposing major surfaces 112, 114 and opposing minor surfaces 116, 118, where the length of the minor surfaces 116, 118 define a thickness t of the substrate 110. The anti-reflective coating 120 is shown in FIG. 1 as being disposed on a first major surface 112; however, the anti-reflective coating 120 may be disposed on the second major surface 114 and/or one or both of the opposing minor surfaces, in addition to or instead of being disposed on the first major surface 112. The anti-reflective coating 120 forms an anti-reflective surface 122.

The anti-reflective coating 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments a layer may include one or more contiguous and uninterrupted layers and/or one or more discontinuous and interrupted layers (i.e., a layer having different materials formed adjacent to one another). A layer or sub-layers may be formed by any known method in the art, including discrete deposition or continuous deposition processes. In one or more embodiments, the layer may be formed using only continuous deposition processes, or, alternatively, only discrete deposition processes.

The thickness of the anti-reflective coating 120 may be about 200 nm or greater while still providing an article that exhibits the optical performance described herein. In some examples, the optical coating 120 thickness may be in the range from about 200 nm to about 300 nm, from about 240 nm to about 300 nm, from about 240 nm to about 280 nm, from about 240 nm to about 260 nm, about 250 nm to about 260 nm, or about 250 nm to about 255 nm, and all ranges and sub-ranges therebetween.

As used herein, the term "dispose" includes coating, depositing, and/or forming a material onto a surface using any known method in the art. The disposed material may constitute a layer, as defined herein. The phrase "disposed on" includes the instance of forming a material onto a surface such that the material is in direct contact with the surface and also includes the instance where the material is formed on a surface, with one or more intervening material(s) between the disposed material and the surface. The intervening material(s) may constitute a layer, as defined herein.

Figure 2:
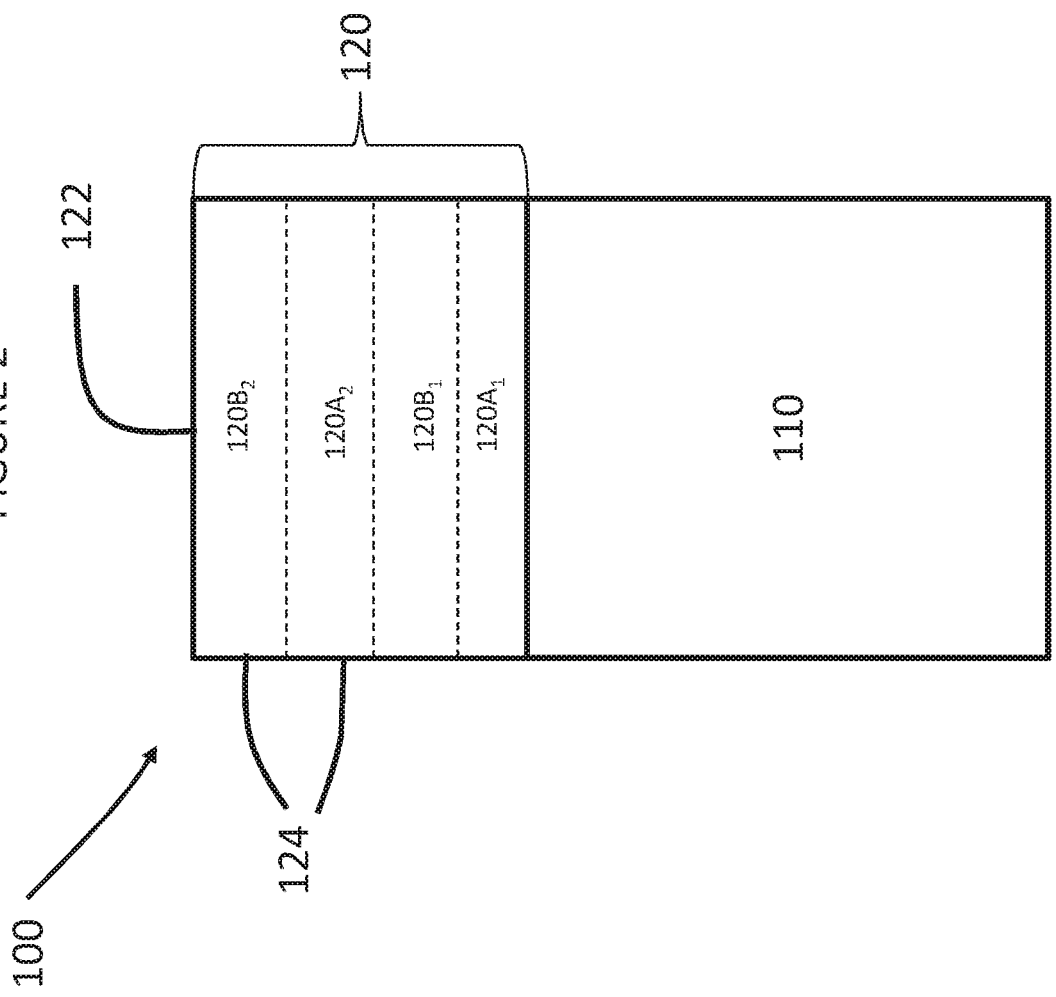
FIG. 2 is a side view of an article with a detailed view of a multi-layer anti-reflective coating of FIG. 1, according to one or more embodiments.

As shown in FIG. 2, the anti-reflective coating 120 may include a plurality of layers (120A, 120B). In one or more embodiments, the two or more layers may be characterized as having different refractive indices from each another. For example, in some embodiments the plurality of layers can include a first layer 120A having a relatively high refractive index, and a second layer 120B having a relatively low refractive index. The difference in the refractive index of the first layer and the second layer may be about 0.01 or greater, 0.05 or greater, 0.1 or greater or even 0.2 or greater. In the embodiment shown in FIG. 2, the anti-reflective coating includes two periods each having two layers (120A, 120B).

In general, anti-reflective coatings can include a variety of numbers of layers (e.g., 4 layers, 6 layers, etc.). One or more embodiments disclosed herein can achieve the advantage of the improved color neutrality and limited or no angular color variation with only four layers in the anti-reflective coating. The embodiment in FIG. 2 is such an example, wherein the anti-reflective coating 120 includes four layers: a first high-index layer $120A_1$, a first low-index layer $120B_1$, a second high-index layer $120A_2$, and a second low-index layer $120B_2$. By only using four layers to achieve the improved optical performance, embodiments of this disclosure can offer a simple and/or thin, and cost-effective anti-reflective coating with superior performance.

As used herein, the term "RI" refers to refractive index, and the terms "low RI" and "high RI" refer to the relative magnitude of RI values to one another (e.g., low RI<high RI). In one or more embodiments, the term "low RI" when used with the first layer 120B includes a range from about 1.3 to about 1.7 or 1.75, or from about 1.4 to about 1.55 or 1.5. In one or more embodiments, the term "high RI" when used with the second layer 120A includes a range from about 1.7 to about 2.5 (e.g., about 1.85 or greater). In some instances, the ranges for low RI and high RI may overlap; however, in most instances, the layers of the anti-reflective coating 120 have the general relationship regarding RI of: low RI<high RI.

Exemplary materials suitable for use in the anti-reflective coating 120 include: silica ($SiO_2$) and niobium oxide ($Nb_2O_5$). Other suitable materials include $Al_2O_3$, $GeO_2$, SiO, AlOxNy, AlN, SiNx, $SiO_xN_y$, $Si_uAl_vO_xN_y$, $Ta_2O_5$, $TiO_x$ or $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, other materials cited below as suitable for use in a scratch-resistant layer, and other materials known in the art. Some examples of suitable materials for use in the first layer 120A include $Nb_2O_5$, $Si_uAl_vO_xN_y$, $Ta_2O_5$, AlN, $Si_3N_4$, $AlO_xN_y$, $SiO_xN_y$, $HfO_2$, $TiO_2$, $ZrO_2$, $Y_2O_3$, $Al_2O_3$, $MoO_3$ and diamond-like carbon. The oxygen content of the materials for the first layer 120A may be minimized, especially in SiNx or AlNx materials. $AlO_xN_y$ materials may be considered to be oxygen-doped AlNx, such that they may have an AlNx crystal structure (e.g. wurtzite) and need not have an AlON crystal structure. Some examples of suitable materials for use in the second layer 120B include $SiO_2$, $Al_2O_3$, $GeO_2$, SiO, $AlO_xN_y$, $SiO_xN_y$, $Si_uAl_vO_xN_y$, MgO, $MgAl_2O_4$, $MgF_2$, $BaF_2$, $CaF_2$, $DyF_3$, $YbF_3$, $YF_3$, and $CeF_3$. The nitrogen content of the materials for use in the second layer 120B may be minimized (e.g., in materials such as $Al_2O_3$ and $MgAl_2O_4$). Where a material having a medium refractive index is desired, some embodiments may utilize AlN and/or $SiO_xN_y$.

Figure 3:
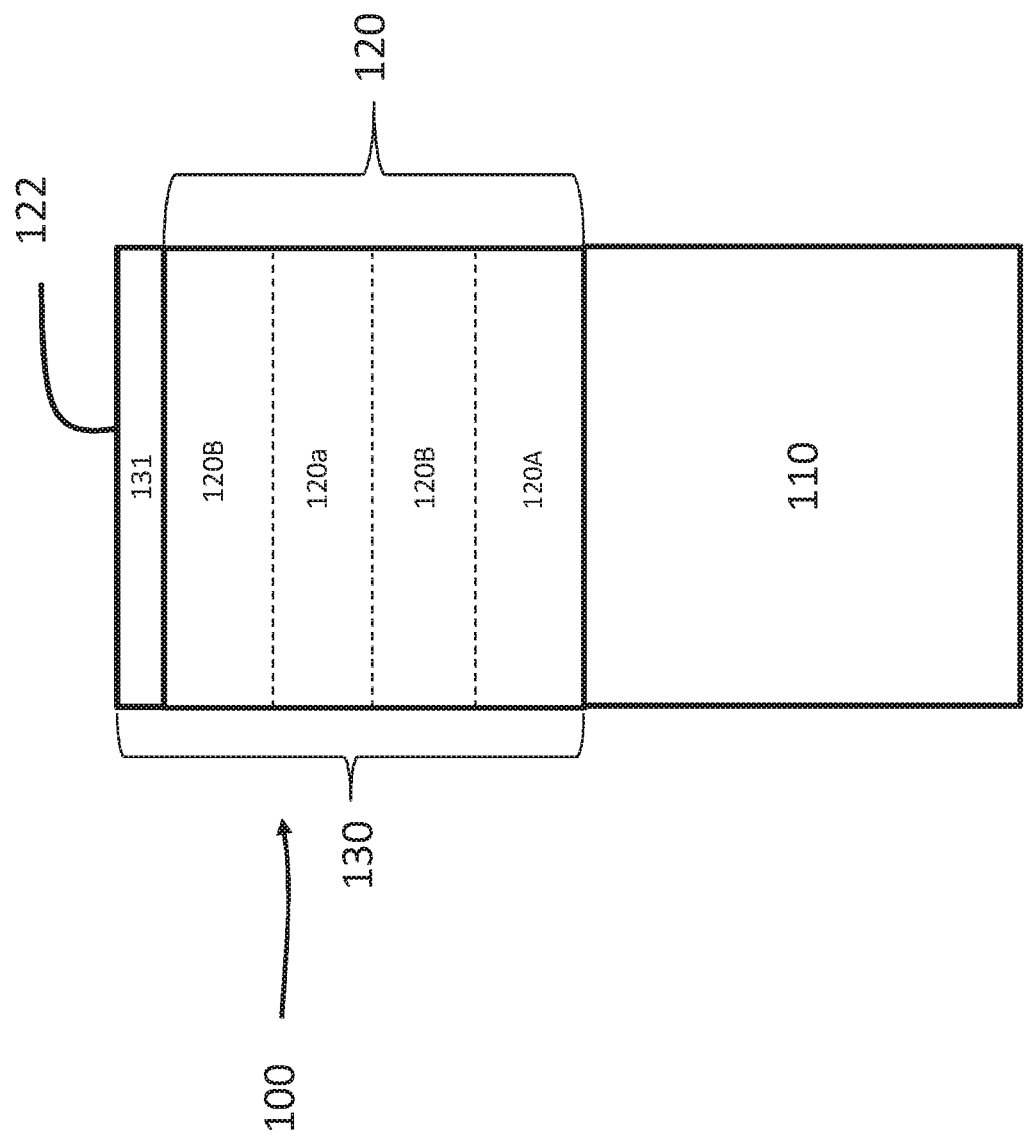
FIG. 3 is a side view of an article with an optical coating including the anti-reflective coating of FIG. 2 and an additional coating, according to one or more embodiments.

In the embodiment shown in FIG. 3, an optical coating 130 disposed on the substrate 110 may include a functional layer 131 on top of the anti-reflective coating 120. The functional layer 131 may include low-friction coating, an oleophobic coating, or an easy-to-clean coating. The functional layer 131 may include a material having a lower refractive index than the second layer 120B. In some embodiments, the functional layer 131 may comprise a high RI layer that also exhibits high hardness. In some embodiments, the functional layer 131 may include an additional coating disposed on top of this top-most air-side low RI layer (e.g., the additional coating may include low-friction coating, an oleophobic coating, or an easy-to-clean coating). Moreover, the addition of a low RI layer having a very low thickness (e.g., about 10 nm or less, about 5 nm or less or about 2 nm or less) has minimal influence on the optical performance when added to the top-most air-side layer comprising a low RI layer. The low RI layer having a very low thickness may include $SiO_2$, an oleophobic or low-friction layer, or a combination of $SiO_2$ and an oleophobic material. Exemplary low-friction layers may include diamond-like carbon, such materials (or one or more layers of the optical coating) may exhibit a coefficient of friction less than 0.4, less than 0.3, less than 0.2, or even less than 0.1.

Figure 4:
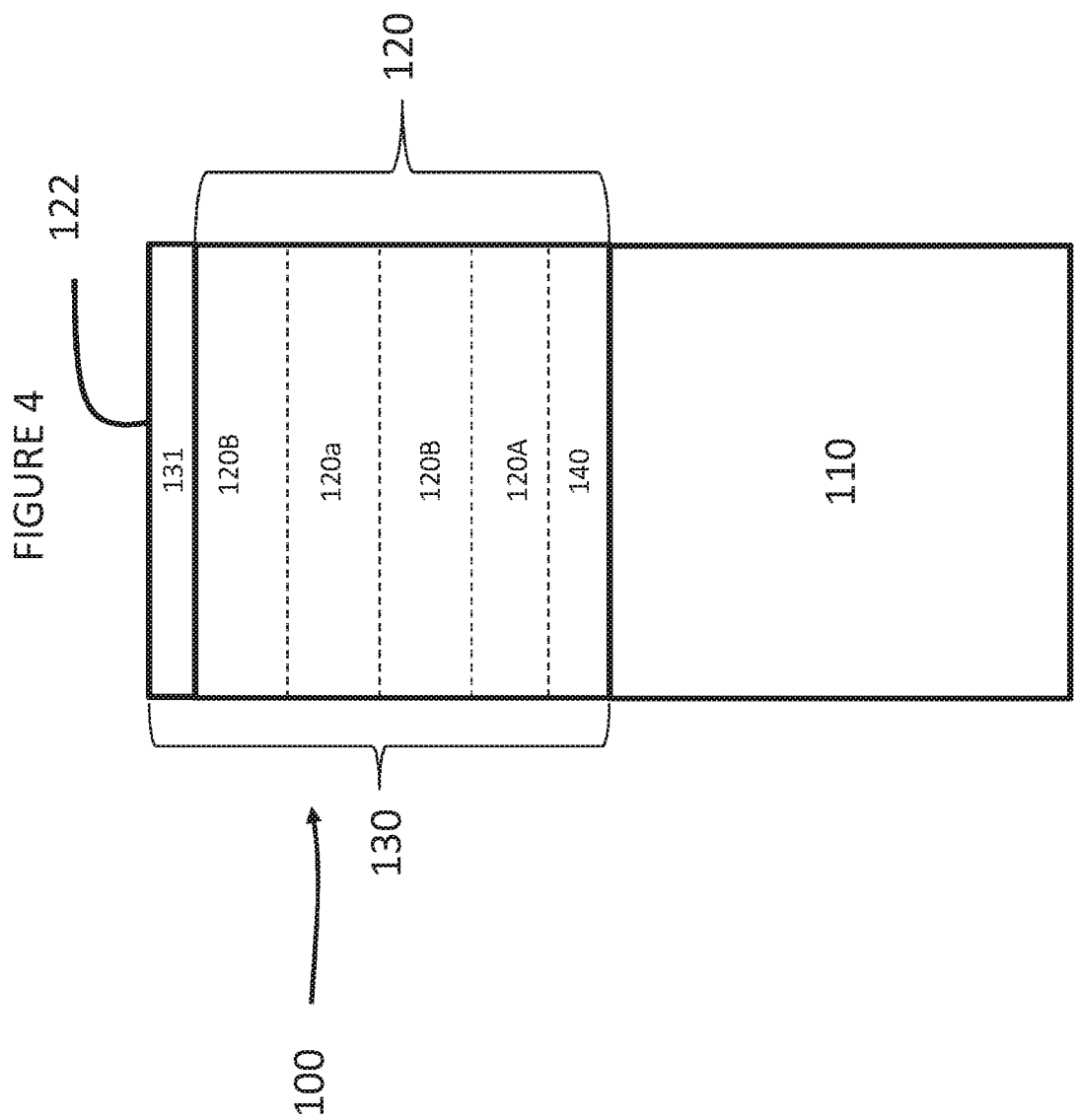
FIG. 4 is a side view of an article with an optical coating including an anti-reflective coating with a buffer layer, according to one or more embodiments.

As shown in FIG. 4, the anti-reflective coating 120 may include a buffer layer 140 disposed on the substrate 110, such that the buffer layer 140 is disposed between the substrate 110 and the two or more layers (120A, 120B). A thickness of the buffer layer 140 may be from about 0 nm to about 50 nm, from about 20 nm to about 30 nm, or greater than or equal to about 25 nm. Exemplary suitable materials for the buffer layer 140 include silica ($SiO_2$). However, other suitable materials exist for the buffer layer. For example, exemplary materials may have a refractive index close to the refractive index of the substrate, or within about 5% of the refractive index of the substrate.

Figure 5:
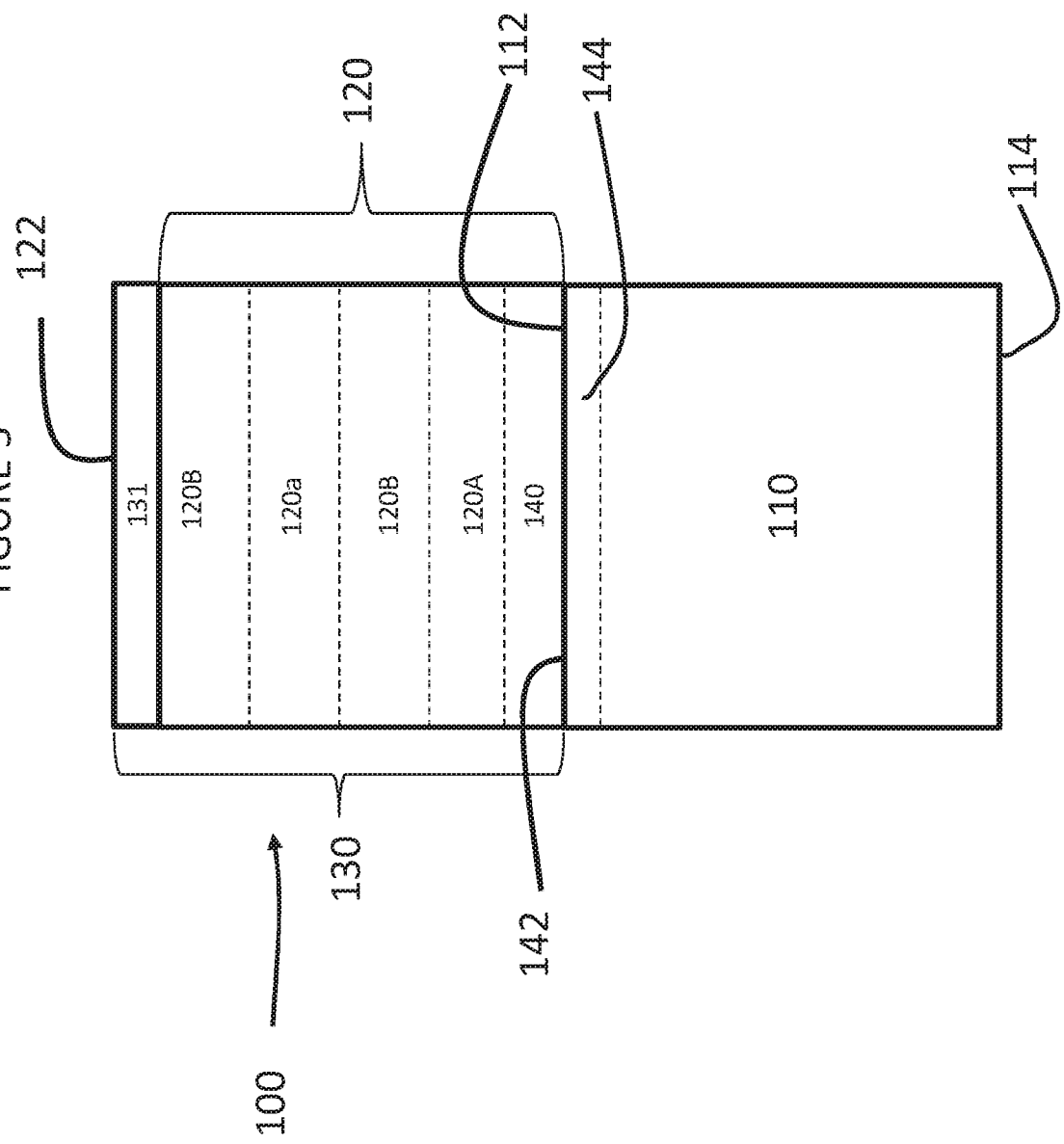
FIG. 5 is a side view of an article with an optical coating on a substrate with an anti-glare surface, according to one or more embodiments.

As shown in FIG. 5, the first major surface 112 of the substrate 110 may be an anti-glare surface 142, according to one or more embodiments. The anti-glare surface 142 of one or more embodiments may be formed by a film or coating disposed on the first major surface of the substrate 110. The film may have particulates or a textured surface that provides anti-glare functionality. In one or more embodiments, the anti-glare surface 142 may be provided by treating the first major surface 112 of the substrate 110 with an anti-glare treatment of the first major surface 112. For example, an anti-glare treatment can include a chemical or physical surface treatment to form irregularities and/or etching the first major surface 112 to create an etched region 144. The etched region can be created by etching with, for example, hydrofluoric acid. According to some embodiments, the anti-glare surface 142 can include particular surface features, as described below, that provide improved optical performance in combination with the anti-reflective coating 120. Although FIG. 5 shows the first major surface 112 as having the anti-glare surface 142, embodiments are not limited to the arrangement shown. The anti-glare surface can be provided on the second major surface 114 instead of the first major surface 112, or may be provided on both the first and second major surfaces 112, 114.

The anti-reflective coatings of the present disclosure can be used with any type of anti-glare surface, or without an anti-glare surface. According to one or more preferred embodiments, an anti-glare treatment is used that is a two-step etching of a substrate surface and the treated surface is characterized by a "flat bottom" topography as opposed to some anti-glare surfaces having a hemispherical texture. The combination of such an anti-glare surface with the anti-reflective coating can result in increased ghost image reduction compared to bare glass or an anti-reflective coating without an anti-glare surface. For example, the ghost image reduction factor for such an anti-glare surface on its own can be about 4, while for an anti-reflection surface alone the ghost image reduction factor can be about 2.5. With the combination of anti-glare and anti-reflection, the ghost image reduction factor can be about 3 to about 3.5. The contrast ratio of the combination AG and AR can be about 5.1, compared to 5.4 for AR alone, about 2 for AG alone, or about 3 for bare glass. The tactile feel for combined AG and AR can be about 7, compared to 6 for AG alone, 3 for AR alone, or 1 for bare glass.

In some embodiments, the anti-reflective coating 120 exhibits an average light reflectance of about 9% or less, about 8% or less, about 7% or less, about 6% or less, about 5% or less, about 4% or less, about 3% or less, or about 2% or less over the optical wavelength regime, when measured at the anti-reflective surface 122 only (e.g., when removing the reflections from an uncoated back surface (e.g., 114 in FIG. 1) of the article, such as through using index-matching oils on the back surface coupled to an absorber, or other known methods). The average reflectance (which may be a photopic average) may be in the range from about 0.4% to about 9%, from about 0.4% to about 8%, from about 0.4% to about 7%, from about 0.4% to about 6%, or from about 0.4% to about 5%, or from about 0.4% to about 2%, and all ranges therebetween. In some embodiments, the average reflectance (which may be a photopic average) may be in the range from about 0.2% to about 9%, from about 0.2% to about 8%, from about 0.2% to about 7%, from about 0.2% to about 6%, or from about 0.2% to about 5%, or from about 0.2% to about 2%, and all ranges therebetween. In some instances, the anti-reflective coating 120 may exhibit such average light reflectance over other wavelength ranges such as from about 450 nm to about 650 nm, from about 420 nm to about 680 nm, from about 420 nm to about 700 nm, from about 420 nm to about 740 nm, from about 420 nm to about 850 nm, or from about 420 nm to about 950 nm. In some embodiments, the anti-reflective surface 122 exhibits an average light transmission of about 90% or greater, 92% or greater, 94% or greater, 96% or greater, or 98% or greater, over the optical wavelength regime. Unless otherwise specified, the average reflectance is measured at an incident illumination angle from about 0 degrees to about 10 degrees, or about 8° (however, such measurements may be provided at incident illumination angles of 45 degrees or 60 degrees).

Optical interference between reflected waves from the optical coating 130/air interface and the optical coating 130/substrate 110 interface can lead to spectral reflectance and/or transmittance oscillations that create apparent color in the article 100. As used herein, the term "transmittance" is defined as the percentage of incident optical power within a given wavelength range transmitted through a material (e.g., the article, the substrate or the optical film or portions thereof). The term "reflectance" is similarly defined as the percentage of incident optical power within a given wavelength range that is reflected from a material (e.g., the article, the substrate, or the optical film or portions thereof). Transmittance and reflectance are measured using a specific linewidth. In one or more embodiments, the spectral resolution of the characterization of the transmittance and reflectance is less than 5 nm or 0.02 eV. The color may be more pronounced in reflection. The angular color shifts in reflection with viewing angle due to a shift in the spectral reflectance oscillations with incident illumination angle.

Angular color shifts in transmittance with viewing angle are also due to the same shift in the spectral transmittance oscillation with incident illumination angle. The observed color and angular color shifts with incident illumination angle are often distracting or objectionable to device users, particularly under illumination with sharp spectral features such as fluorescent lighting and some LED lighting, or in conditions with uncontrollable ambient lighting conditions and/or a wide range of viewing angles, which can occur in vehicle interiors. Angular color shifts in transmission may also play a factor in color shift in reflection and vice versa. Factors in angular color shifts in transmission and/or reflection may also include angular color shifts due to viewing angle or angular color shifts away from a certain white point that may be caused by material absorption (somewhat independent of angle) defined by a particular illuminant or test system.

The oscillations may be described in terms of amplitude. As used herein, the term "amplitude" includes the peak-to-valley change in reflectance or transmittance. The phrase "average amplitude" includes the peak-to-valley change in reflectance or transmittance averaged over several oscillation cycles or wavelength sub-ranges within the optical wavelength regime. As used herein, the "optical wavelength regime" includes the wavelength range from about 400 nm to about 800 nm (and more specifically from about 450 nm to about 650 nm).

The embodiments of this disclosure include an anti-reflective coating to provide improved optical performance, in terms of colorlessness or neutral color, and/or little to no color shift when viewed at varying viewing angles and/or wide viewing angles under an illuminant. Exemplary illuminants include any one of CIE F2, CIE F10, CIE F11, CIE F12 and CIE D65. In one or more embodiments, the article exhibits an angular color shift (or angular color variation) in reflectance of about 5 or less, about 4 or less, about 3 or less, or about 2 or less between a reference viewing angle and any other viewing angle in the ranges provided herein. As used herein, the phrase "color shift" or "color variation" (angular or reference point) refers to the change in both a* and b*, under the CIE L*, a*, b* colorimetry system in reflectance. It should be understood that unless otherwise noted, the L* coordinate of the articles described herein are the same at any angle or reference point and do not influence color shift. For example, angular color shift $\Delta E_\theta$ may be determined using the following Equation (1):

$$\Delta E_\theta(a^*, b^*) = \sqrt{\{(a^*_{\theta 1} - a^*_{\theta 2})^2 + (b^*_{\theta 1} - b^*_{\theta 2})^2\}}, \quad (1)$$

with $a^*_{\theta 1}$ and $b^*_{\theta 1}$ representing the a* and b* coordinates of a point on the article when viewed at a first viewing angle $\theta_1$ or reference viewing angle (which may include normal incidence or any viewing angle in the ranges described herein) and $a^*_{\theta 2}$ and $b^*_{\theta 2}$ representing the a* and b* coordinates of the same point on the article when viewed at a second viewing angle $\theta_2$, where the first viewing angle $\theta_1$ and the second viewing angle $\theta_2$ are different. In some instances, an angular color shift in reflectance of about 10 or less (e.g., 5 or less, 4 or less, 3 or less, or 2 or less) is exhibited by the article when viewed at various viewing angles from a reference viewing angle, under an illuminant. In some instances the angular color shift in reflectance is about 4.1 or less, about 4.0 or less, about 3.9 or less, about 3.8 or less, about 3.7 or less, about 3.6 or less, about 3.5 or less, about 3.4 or less, about 3.3 or less, about 3.2 or less, about 3.1 or less, about 3.0 or less, about 2.9 or less, about 2.8 or less, about 2.7 or less, about 2.6 or less, about 2.5 or less, about 2.4 or less, about 2.3 or less, about 2.2 or less, about 2.1 or less, about 2.0 or less, about 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, 0.1 or less. In some embodiments, the angular color shift may be about 0. The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting). In specific examples, the articles exhibit an angular color shift in reflectance of about 4 or less, about 3 or less, about 2 or less, or about 1 or less when viewed at incident illumination angle from the reference illumination angle under a CIE F2, F10, F11, F12 or D65 illuminant, or more specifically, under a CIE D65 illuminant. In particular, the angular color shift is measured under a CIE D65 1964 illuminant. More specifically, in some examples of embodiments, the angular color shift in reflectance according to Equation (1) is about 4 or less when viewed at angles in a range from about 10° to about 60°, about 3 or less when viewed at angles in a range from about 10° to about 60°, or about 2 or less when viewed at angles in a range from about 10° and about 60°, where the reference viewing angle can range from about 10° to about 60° and is different than the viewing angle upon which the color shift is based. For example, for a reference viewing angle of about 10°, the angular color shift can fall within the above series of ranges for viewing angles from about 10° to about 60°. Similarly, for reference viewing angles of about 15°, about 30°, about 45°, or about 60°, the angular color shift can fall within the above series of ranges for viewing angles from about 10° to about 60°. Examples are included below for viewing angles of 10°, 15°, 30°, 45°, and 60°, but the viewing angle is not limited to these specific examples and can include any angle in the range from about 10° to about 60°.

Although reference viewing angles of 10°, 15°, 30°, 45°, and 60° are mentioned above, these are used as examples only and embodiments of this disclosure can include any reference viewing angle in the range from about 0° to about 60°, or from about 10° to about 60°. For example, the reference viewing angle may include normal incidence (i.e., from about 0 degrees to about 10 degrees), or 5 degrees from normal incidence, 10 degrees from normal incidence, 15 degrees from normal incidence, 20 degrees from normal incidence, 25 degrees from normal incidence, 30 degrees from normal incidence, 35 degrees from normal incidence, 40 degrees from normal incidence, 50 degrees from normal incidence, 55 degrees from normal incidence, or 60 degrees from normal incidence, provided the difference between the first or reference viewing angle and the second viewing angle is at least about 1 degree, 2 degrees or about 5 degrees. The incident viewing angle may be, with respect to the reference illumination angle, in the range from about 5 degrees to about 80 degrees, from about 5 degrees to about 70 degrees, from about 5 degrees to about 65 degrees, from about 5 degrees to about 60 degrees, from about 5 degrees to about 55 degrees, from about 5 degrees to about 50 degrees, from about 5 degrees to about 45 degrees, from about 5 degrees to about 40 degrees, from about 5 degrees to about 35 degrees, from about 5 degrees to about 30 degrees, from about 5 degrees to about 25 degrees, from about 5 degrees to about 20 degrees, from about 5 degrees to about 15 degrees, and all ranges and sub-ranges therebetween, away from the reference illumination angle.

In one or more embodiments, the article exhibits a color in the CIE L*, a*, b* colorimetry system in reflectance such that the distance or reference point color shift at a given angle between the reflectance coordinates from a reference point is less than about 5 or less than about 2 under an illuminant (which can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting)). In specific examples, the articles exhibit a color shift in reflectance of about 2 or less when viewed at incident illumination angle from the reference illumination angle under a CIE F2, F10, F11, F12 or D65 illuminant or more specifically under a CIE F2 illuminant. Stated another way, the article may exhibit a reflectance color (or reflectance color coordinates) measured at the anti-reflective surface 122 having a reference point color shift of less than about 2 from a reference point, as defined herein. Unless otherwise noted, the reflectance color or reflectance color coordinates are measured on only the anti-reflective surface 122 of the article. However, the reflectance color or reflectance color coordinates described herein can be measured on both the anti-reflective surface 122 of the article and the opposite side of the article (i.e., major surface 114 in FIG. 1) using either a 2-surface measurement (reflections from two sides of an article are both included) or a 1-surface measurement (reflection only from the anti-reflective surface 122 of the article is measured). Of these, the 1-surface reflectance measurement is typically the more challenging metric to achieve low color or low-color shift values for anti-reflective coatings, and this has relevance to applications where the back surface of the article is bonded to a light absorbing medium such as black ink or an LCD or OLED device.

In one or more embodiments, the reference point may be the origin (0, 0) in the CIE L*, a*, b* colorimetry system (or the color coordinates a*=0, b*=0), the coordinates (a*=−2, b*=−2), or the reflectance color coordinates of the substrate. It should be understood that unless otherwise noted, the L* coordinate of the articles described herein are the same as the reference point and do not influence color shift. Where the reference point color shift of the article is defined with respect to the substrate, the reflectance color coordinates of the article are compared to the reflectance color coordinates of the substrate.

In one or more specific embodiments, the reference point color shift of the reflectance color may be less than 1 or even less than 0.5. In one or more specific embodiments, the reference point color shift for the reflectance color may be 1.8, 1.6, 1.4, 1.2, 0.8, 0.6, 0.4, 0.2, 0 and all ranges and sub-ranges therebetween. Where the reference point is the color coordinates a*=0, b*=0, the reference point color shift is calculated by Equation (2).

$$\text{reference point color shift} = \sqrt{((a^*_{article})^2 + (b^*_{article})^2)} \quad (2)$$

Where the reference point is the color coordinates a*=−2, b*=−2, the reference point color shift is calculated by Equation (3).

$$\text{reference point color shift} = \sqrt{((a^*_{article}+2)^2 + (b^*_{article}+2)^2)} \quad (3)$$

Where the reference point is the color coordinates of the substrate, the reference point color shift is calculated by Equation (4).

$$\text{reference point color shift} = \sqrt{((a^*_{article} - a^*_{substrate})^2 + (b^*_{article} - b^*_{substrate})^2)} \quad (4)$$

In some embodiments, the article may exhibit a reflectance color (or reflectance color coordinates) such that the reference point color shift is less than 2 when the reference point is any one of the color coordinates of the substrate, the color coordinates a*=0, b*=0 and the coordinates a*=−2, b*=−2.

In one or more embodiment, the article may exhibit a b* value in reflectance (as measured at the anti-reflective surface only) in the range from about −5 to about 1, from about −5 to about 0, from about −4 to about 1, or from about −4 to about 0, in the CIE L*, a*, b* colorimetry system at all incidence illumination angles in the range from about 0 to about 60 degrees (or from about 0 degrees to about 40 degrees or from about 0 degrees to about 30 degrees).

In some embodiments, the article exhibits an a* value in reflectance (at only the anti-reflective surface) in the range from about −5 to about 2 (e.g., −4.5 to 1.5, −3 to 0, −2.5 to 0.25) at incident illumination angles in the range from about 0 degrees to about 60 degrees under illuminants D65, A, and F2. In some embodiments, the article exhibits a b* value in reflectance (at only the anti-reflective surface) in the range from about −7 to about 0 at incident illumination angles in the range from about 0 degrees to about 60 degrees under illuminants D65, A, and F2.

In some preferred embodiments, the article may exhibit color coordinate values in single-sided reflectance with an a* value in the range of about −2 to about 0 and a b* value in the range of about −4 to about −1 at a viewing angle of about 10 degrees. The article of these embodiments may further also exhibit an a* value in reflectance in the range of about −2.5 to about 1 and a b* value in the range of about −3.5 to about 1 at a viewing angle of about 60 degrees.

The article of one or more embodiments, or the anti-reflective surface 122 of one or more articles, may exhibit an average light transmittance of about 95% or greater (e.g., about 9.5% or greater, about 96% or greater, about 96.5% or greater, about 97% or greater, about 97.5% or greater, about 98% or greater, about 98.5% or greater or about 99% or greater) over the optical wavelength regime in the range from about 400 nm to about 800 nm. In some embodiments, the article, or the anti-reflective surface 122 of one or more articles, may exhibit an average light reflectance of about 2% or less (e.g., about 1.5% or less, about 1% or less, about 0.75% or less, about 0.5% or less, or about 0.25% or less) over the optical wavelength regime in the range from about 400 nm to about 800 nm. These light transmittance and light reflectance values may be observed over the entire optical wavelength regime or over selected ranges of the optical wavelength regime (e.g., a 100 nm wavelength range, 150 nm wavelength range, a 200 nm wavelength range, a 250 nm wavelength range, a 280 nm wavelength range, or a 300 nm wavelength range, within the optical wavelength regime). In some embodiments, these light reflectance and transmittance values may be a total reflectance or total transmittance (taking into account reflectance or transmittance on both the anti-reflective surface 122 and the opposite major surface 114) or may be observed on a single side of the article, as measured on the anti-reflective surface 122 only (without taking into account the opposite surface). Unless otherwise specified, the average reflectance or transmittance is measured at an incident illumination angle in the range from about 0 degrees to about 10 degrees (however, such measurements may be provided at incident illumination angles of 45 degrees or 60 degrees).

In some embodiments, the article of one or more embodiments, or the anti-reflective surface 122 of one or more articles, may exhibit an average visible photopic reflectance of about 1% or less, about 0.7% or less, about 0.5% or less, or about 0.45% or less over the optical wavelength regime. These photopic reflectance values may be exhibited at viewing angles in the range from about 0° to about 20°, from about 0° to about 40° or from about 0° to about 60°. As used herein, photopic reflectance mimics the response of the human eye by weighting the reflectance versus wavelength spectrum according to the human eye's sensitivity. Photopic reflectance may also be defined as the luminance, or tristimulus Y value of reflected light, according to known conventions such as CIE color space conventions. The average photopic reflectance is defined in Equation (5) as the spectral reflectance R(λ) multiplied by the illuminant spectrum I(λ) and the CIE's color matching function $\bar{y}(\lambda)$, related to the eye's spectral response:

$$\{R_p\} = \int_{380\,nm}^{720\,nm} R(\lambda) \times I(\lambda) \times \bar{y}(\lambda) d\lambda \qquad (5)$$

In some embodiments, the article exhibits a single-side average photopic reflectance, measured at normal or near-normal incidence (e.g. 0-10 degrees) on the anti-reflective surface only of less than about 10%. In some embodiments, the single-side average photopic reflectance is about 9% or less, about 8% or less, about 7% or less, about 6% or less, about 5% or less, about 4% or less, about 3%, or about 2% or less. In a specific embodiment, the anti-reflective surface 122 of one or more articles (i.e., when measuring the anti-reflective surface only through a single-sided measurement), may exhibit the above average photopic reflectance values, while simultaneously exhibiting a maximum reflectance color shift, over the entire viewing angle range from about 10 degrees to about 60 degrees using D65 illumination, of less than about 5.0, less than about 4.0, less than about 3.0, less than about 2.0, less than about 1.5, less than about 1.3, less than about 1.2, less than about 1.1, less than about 1.0, less than about 0.9, or less than about 0.8. These maximum reflectance color shift values represent the lowest color point value measured at any angle from about 10 degrees to about 60 degrees from normal incidence, subtracted from the highest color point value measured at any angle in the same range. The values may represent a maximum change in a* value ($a^*_{highest} - a^*_{lowest}$), a maximum change in b* value ($b^*_{highest} - b^*_{lowest}$), a maximum change in both a* and b* values, or a maximum change in the quantity $\sqrt{(a^*_{highest} - a^*_{lowest})^2 + (b^*_{highest} - b^*_{lowest})^2}$.

Substrate

The substrate 110 may include an inorganic material and may include an amorphous substrate, a crystalline substrate or a combination thereof. The substrate 110 may be formed from man-made materials and/or naturally occurring materials (e.g., quartz and polymers). For example, in some instances, the substrate 110 may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the substrate 110 may specifically exclude polymeric, plastic and/or metal substrates. The substrate may be characterized as alkali-including substrates (i.e., the substrate includes one or more alkalis). In one or more embodiments, the substrate exhibits a refractive index in the range from about 1.45 to about 1.55.

In one or more embodiments, the amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate 110 may include crystalline substrates such as glass ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

The substrate 110 may be substantially planar or sheet-like, or may be a curved or otherwise shaped or sculpted substrate. In some preferred embodiments, the substrate 110 is a glass and glass-based material as described above, including a glass-ceramic material, and have a thickness of less than 2.0 mm, or from about 0.1 mm to about 2.0 mm, or from about 0.3 mm to about 1.7 mm, or about 0.5 mm to a about 1.1 mm, or about 0.7 mm to about 1.0 mm. The glass material of the substrate may be chemically strengthened. In some embodiments, the substrate 110 includes a glass or glass-based material that is conformable to a surface at a temperature below the glass-transition temperature of the glass or glass-based material, which is referred to herein as a glass, material, or substrate that is "cold-formable," "cold-formed," "cold-bent," or "cold-bendable." The surface to which the material is cold-formed can be non-planar, and may include a radius of curvature over all or part of the surface that is at least 900 mm, at least 500 mm, or at least 100 mm. The surface may include multiple radii of curvature in one or more areas of the surface, and the multiple radii of curvature may be one or more axes of curvature that are parallel, non-parallel, co-planar, or non-co-planar. In such a case, the substrate 110 may be cold-formable to one or more of those curved portions resulting in a complexly-curved substrate.

The substrate 110 may be substantially optically clear, transparent and free from light scattering. In such embodiments, the substrate may exhibit an average light transmission over the optical wavelength regime of about 85% or greater, about 86% or greater, about 87% or greater, about 88% or greater, about 89% or greater, about 90% or greater, about 91% or greater or about 92% or greater. In one or more alternative embodiments, the substrate 110 may be opaque or exhibit an average light transmission over the optical wavelength regime of less than about 10%, less than about 9%, less than about 8%, less than about 7%, less than about 6%, less than about 5%, less than about 4%, less than about 3%, less than about 2%, less than about 1%, or less than about 0%. In some embodiments, these light reflectance and transmittance values may be a total reflectance or total transmittance (taking into account reflectance or transmittance on both major surfaces of the substrate) or may be observed on a single side of the substrate (i.e., on the anti-reflective surface 122 only, without taking into account the opposite surface). Unless otherwise specified, the average reflectance or transmittance is measured at an incident illumination angle of 0 degrees (however, such measurements may be provided at incident illumination angles of 45 degrees or 60 degrees). The substrate 110 may optionally exhibit a color, such as white, black, red, blue, green, yellow, orange, etc.

The substrate 110 may be provided using a variety of different processes. For instance, where the substrate 110 includes an amorphous substrate such as glass, various forming methods can include float glass processes and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

The degree of chemical strengthening achieved by ion exchange may be quantified based on the parameters of central tension (CT), surface CS, and depth of layer (DOL). Surface CS may be measured near the surface or within the strengthened glass at various depths. A maximum CS value may include the measured CS at the surface ($CS_s$) of the strengthened substrate. The CT, which is computed for the inner region adjacent the compressive stress layer within a glass substrate, can be calculated from the CS, the physical thickness t, and the DOL. CS and DOL are measured using those means known in the art. Such means include, but are not limited to, measurement of surface stress (FSM) using commercially available instruments such as the FSM-6000, manufactured by Luceo Co., Ltd. (Tokyo, Japan), or the like, and methods of measuring CS and DOL are described in ASTM 1422C-99, entitled "Standard Specification for Chemically Strengthened Flat Glass," and ASTM 1279.19779 "Standard Test Method for Non-Destructive Photoelastic Measurement of Edge and Surface Stresses in Annealed, Heat-Strengthened, and Fully-Tempered Flat Glass," the contents of which are incorporated herein by reference in their entirety. Surface stress measurements rely upon the accurate measurement of the stress optical coefficient (SOC), which is related to the birefringence of the glass substrate. SOC in turn is measured by those methods that are known in the art, such as fiber and four point bend methods, both of which are described in ASTM standard C770-98 (2008), entitled "Standard Test Method for Measurement of Glass Stress-Optical Coefficient," the contents of which are incorporated herein by reference in their entirety, and a bulk cylinder method. The relationship between CS and CT is given by the expression (1):

$$CT=(CS \cdot DOL)/(t-2DOL) \quad (1),$$

wherein t is the physical thickness (μm) of the glass article. In various sections of the disclosure, CT and CS are expressed herein in megaPascals (MPa), physical thickness t is expressed in either micrometers (μm) or millimeters (mm) and DOL is expressed in micrometers (μm).

In one embodiment, a strengthened substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOL of 10 μm or greater, 15 μm or greater, 20 μm or greater (e.g., 25 μm, 30 μm, 35 μm, 40 μm, 45 μm, 50 μm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened substrate has one or more of the following: a surface CS greater than 500 MPa, a DOL greater than 15 μm, and a CT greater than 18 MPa.

Example glasses that may be used in the substrate may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq (MgO+CaO) \leq 10$ mol. %.

A still further example glass composition suitable for the substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+K_2O) \leq 18$ mol. % and 2 mol. % $\leq (MgO+CaO) \leq 7$ mol. %.

In a particular embodiment, an alkali aluminosilicate glass composition suitable for the substrate comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $(Al_2O_3+B_2O_3)/\Sigma$modifiers (i.e., sum of modifiers) is greater than 1, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $(Al_2O_3+B_2O_3)/\Sigma$modifiers (i.e., sum of modifiers) is greater than 1.

In still another embodiment, the substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. %≤$SiO_2+B_2O_3$+CaO≤69 mol. %; Na2O+$K_2O$+$B_2O_3$+MgO+CaO+SrO>10 mol. %; 5 mol. %≤MgO+CaO+SrO≤8 mol. %; $(Na_2O+B_2O_3)$–$Al_2O_3{\leq}2$ mol. %; 2 mol. %≤$Na_2O$–$Al_2O_3$≤6 mol. %; and 4 mol. % $(Na_2O+K_2O)$–$Al_2O_3$≤10 mol. %.

In an alternative embodiment, the substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

EXAMPLES

Various embodiments will be further clarified by the following examples.

Figure 6:
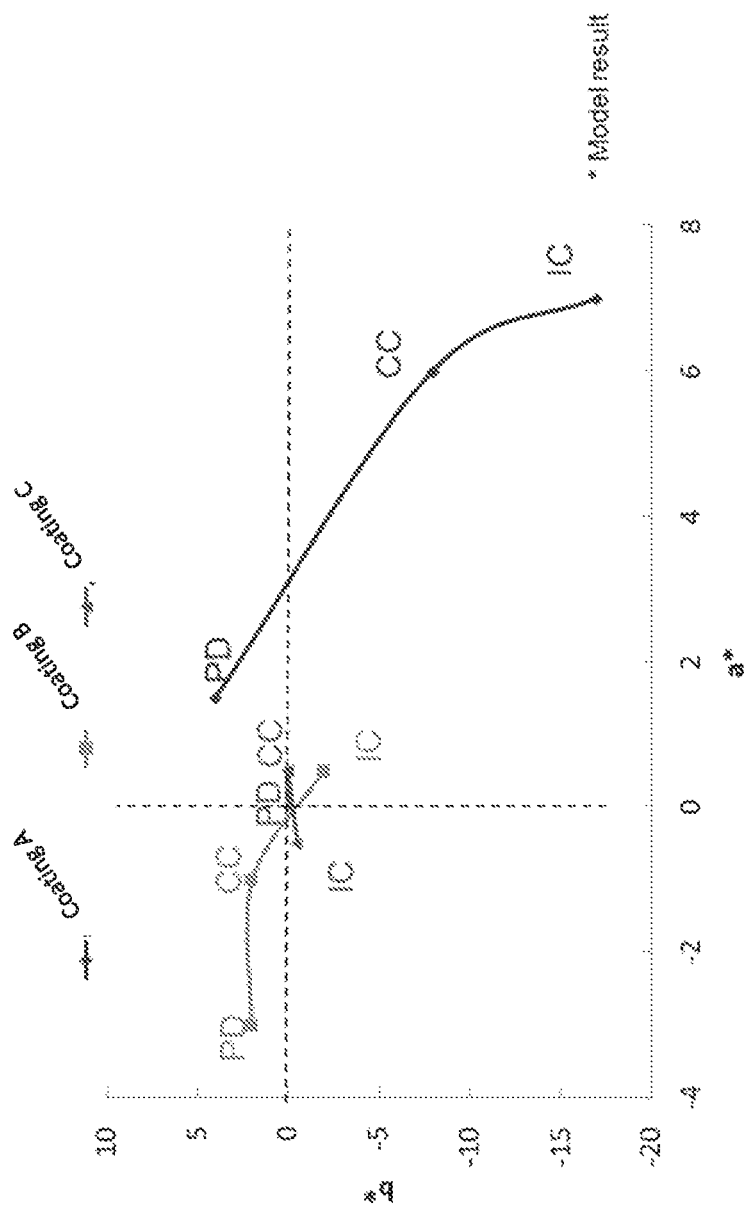
FIG. 6 is a graph of the modeled angular color variation of an anti-reflective coating, according to one or more embodiments, as compared to alternative anti-reflective coatings.

According to one or more embodiments, an anti-reflective coating is provided that has superior optical performance, in terms of color shift in single-side reflectance, as compared to alternative or pre-existing anti-reflective coatings. For example, as shown in FIG. 6, the angular color variation of an AR coating according to an embodiment of the present disclosure (Coating C) is compared to two other coatings: Coating A, corresponding to a conventional AR coating that has four layers and deep blue color, and Coating B, which is another alternative coating according to an embodiment of this disclosure that has four layers and a light blue color. The color variation for each coating was measured according to three viewing angles of 0°, 30°, and 60°, which roughly correspond to viewing angles of a driver of an automobile when viewing (1) an instrument cluster ("IC") behind the steering wheel, (2) center console ("CC"), and (3) passenger-side dashboard ("PD") or display, respectively. The AR coating of the present disclosure demonstrates significantly more neural color, as demonstrated by the clustering of Coating C's data points around the origin in FIG. 6, and lower variation in color across the range of viewing angles, as demonstrated by the narrow spread of data points IC, CC, and PD in FIG. 6.

Examples of one or more embodiments were produced using a reactive sputtering coater. Exemplary embodiments of the anti-reflective coatings are described herein and provided below in Table 1, for example. Anti-reflective coating Example 1 and Example 2 are inventive examples both having a buffer layer of silica, followed by a $1^{st}$ $Nb_2O_5$ layer, a $1^{st}$ $SiO_2$ layer, a $2^{nd}$ $Nb_2O_5$ layer, and a $2^{nd}$ $SiO_2$ layer, in that order.

TABLE 1

Examples 1 and 2 of an anti-reflective coating.

| Layer of Coating | Thickness (nm) | |
|---|---|---|
| | Example 1 | Example 2 |
| Buffer Layer ($SiO_2$) | 25 | 25 |
| $1^{st}$ $Nb_2O_5$ Layer | 12.4 | 11.9 |
| $1^{st}$ $SiO_2$ Layer | 40.4 | 40.4 |
| $2^{nd}$ $Nb_2O_5$ Layer | 116 | 116.8 |
| $2^{nd}$ $SiO_2$ Layer | 83.8 | 80.8 |

Figure 7:
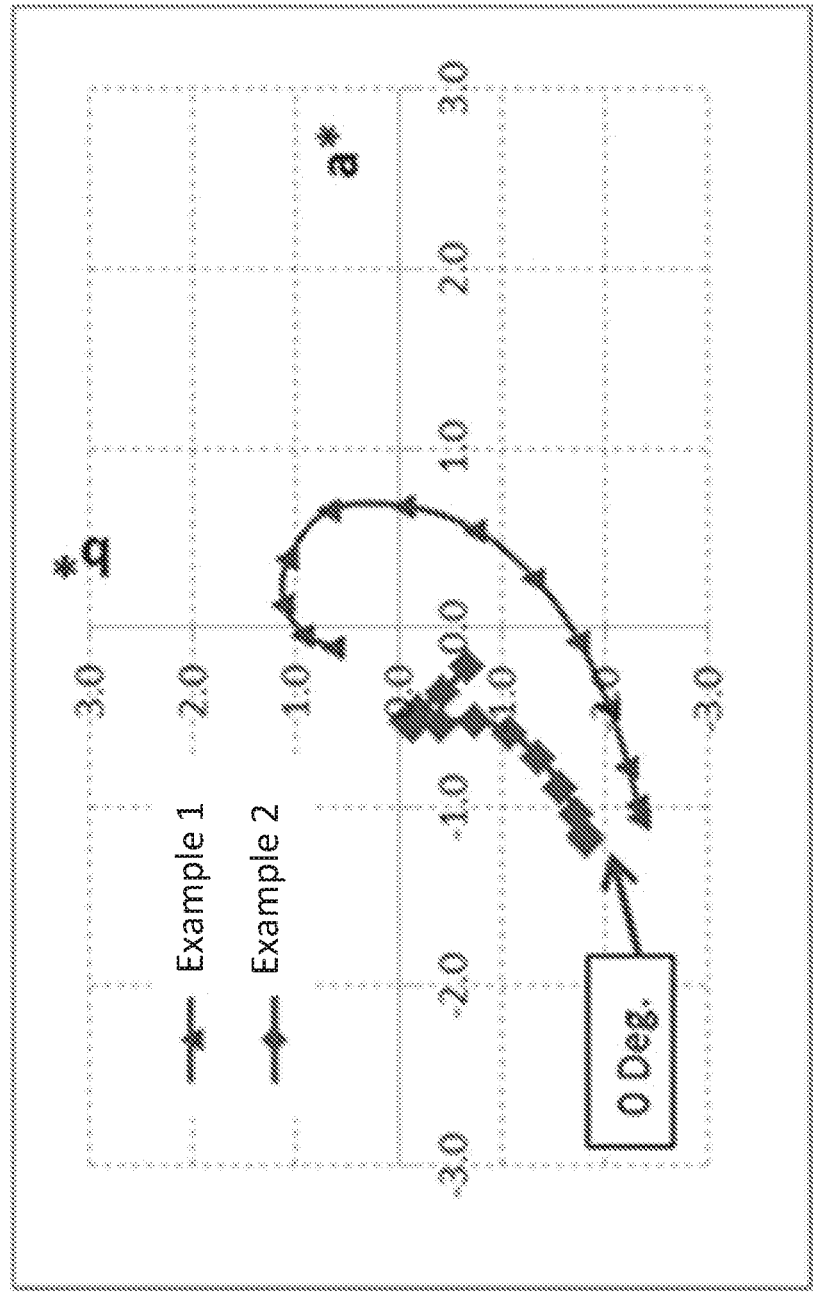
FIG. 7 is a graph of the modeled angular color variation of anti-reflective coatings according to some embodiments of the present disclosure.
Figure 8:
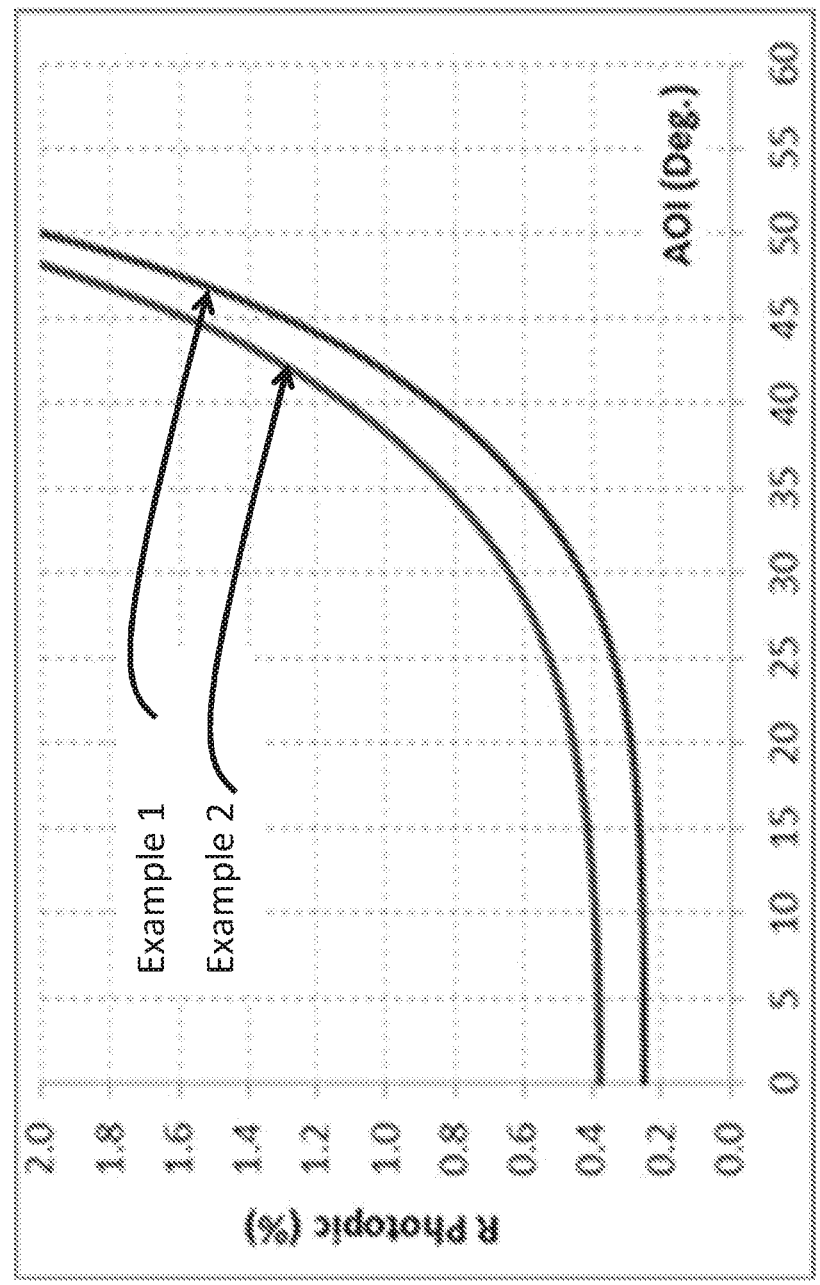
FIG. 8 is a graph of the single-sided reflectance of the anti-reflective coatings of FIG. 7, according to one or more embodiments.

Examples 1 and 2 from Table 1 were analyzed for their optical performance in terms of angular color shift from 0° to 60°, and the optical performance results are shown in FIGS. 7 and 8. FIG. 7 shows that the angular color shift for both Examples 1 and 2 over the range from 0° to 60°. In particular, the color for both Examples 1 and 2 starts with a* values in a range from about –2 to about 0, or more specifically from about –1.5 to about –1.0 at viewing angles near 0°, and b* values in a range from about –2.5 to about –1.5 in the same viewing angle range. As the viewing angle increases, the a* and b* values of both of Examples 1 and 2 shifts upward and to the right (as viewed on the page). As shown in FIG. 8, Examples 1 and 2 have low reflectance, as measured by R Photopic (%), across a wide angle of incidence ("AOI"), measured in degrees. In particular, the R value is less than 2.0 from about 0° to about 50°, is less than 1.0 from about 0° to about 43°, and is from about 0.2 to 0.4 at 0°.

Figure 9A:
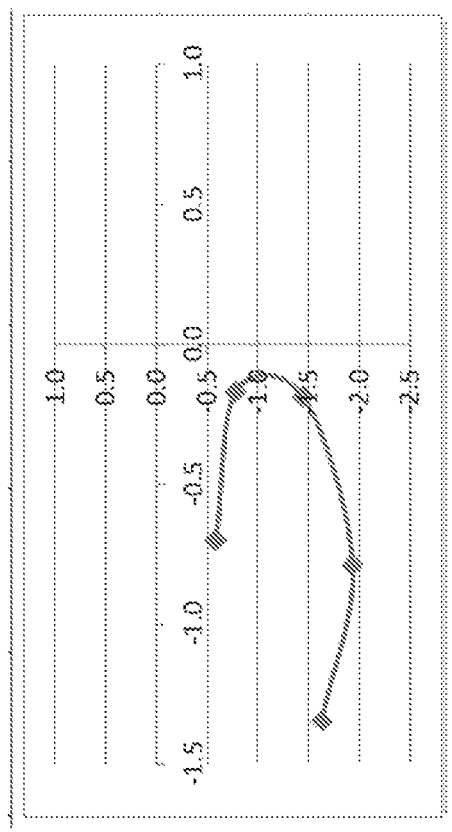
FIGS. 9A and 9B are graphs of the measured $a^*$ and $b^*$ values and reflectance at various angles of an example according to one or more embodiments.
Figure 9B:
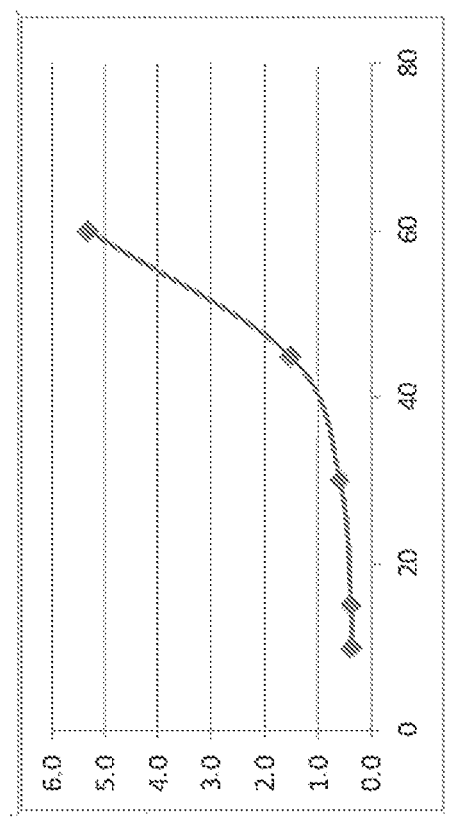
Figure 10A:
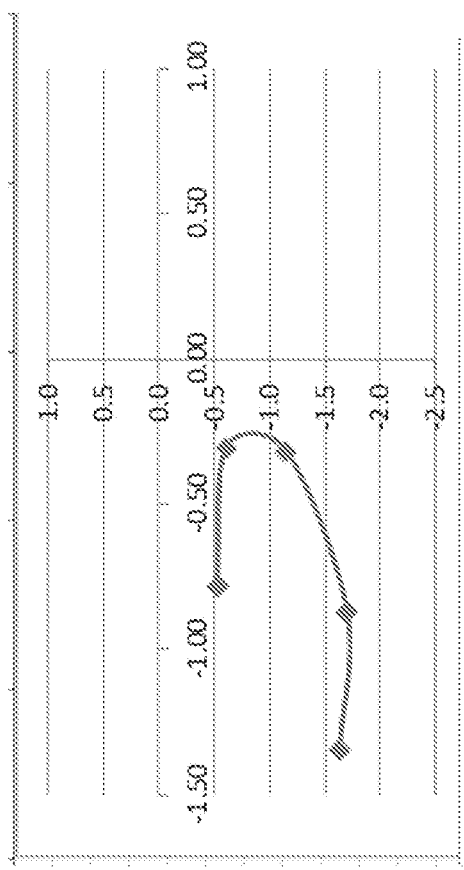
FIGS. 10A and 10B are graphs of the measured $a^*$ and $b^*$ values and reflectance at various angles of an example according to one or more embodiments.
Figure 10B:
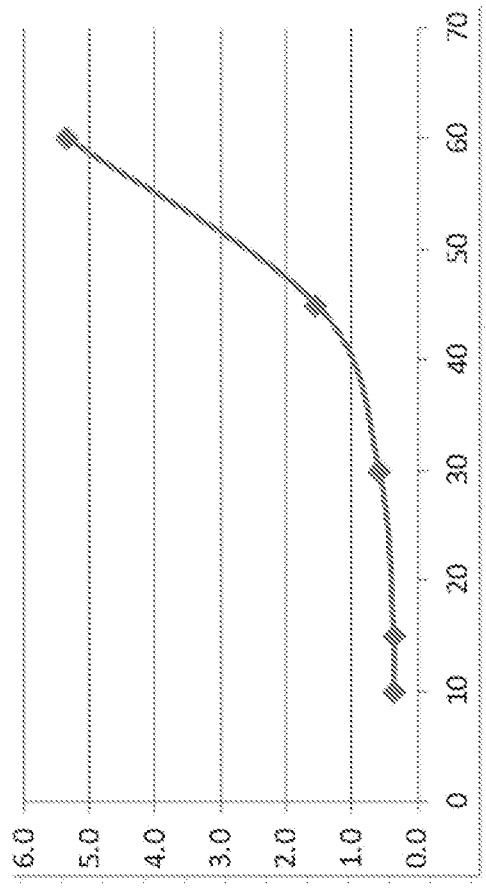
Figure 12A:
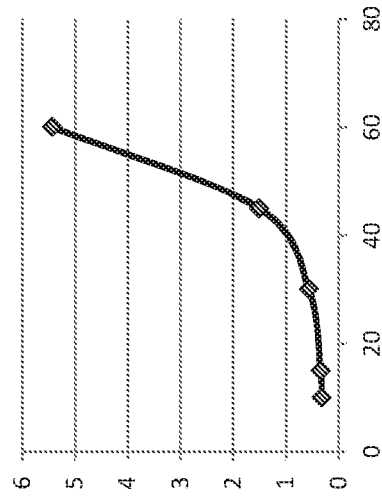
FIGS. 12A-12HH are graphs of the measured $a^*$ and $b^*$ values and reflectance of samples at various angles, according to one or more embodiments.
Figure 12B:
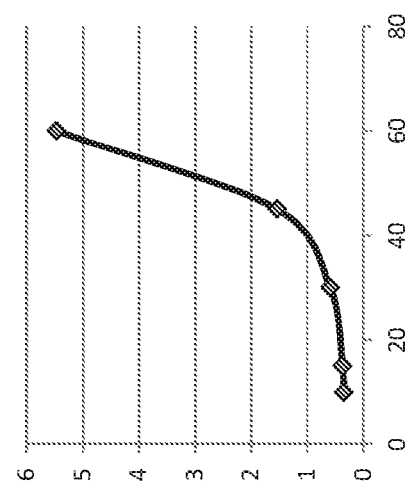
Figure 12C:
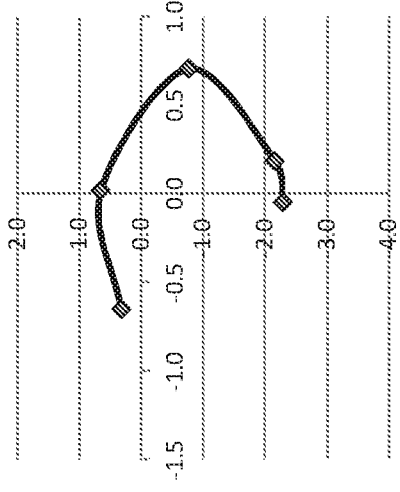
Figure 12D:
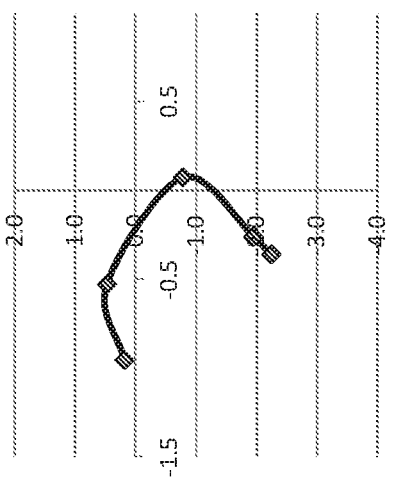
Figure 12E:
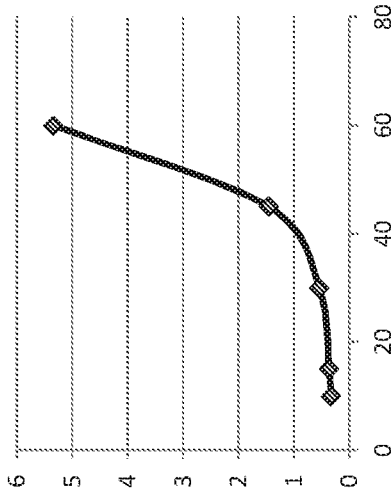
Figure 12F:
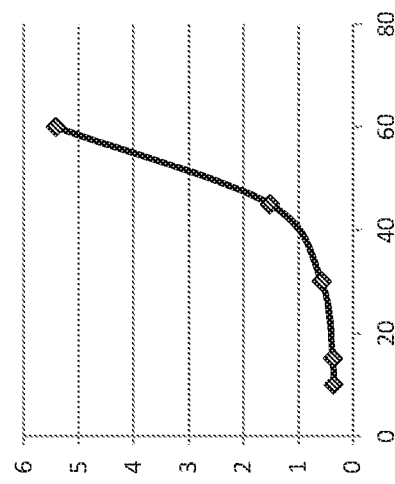
Figure 12G:
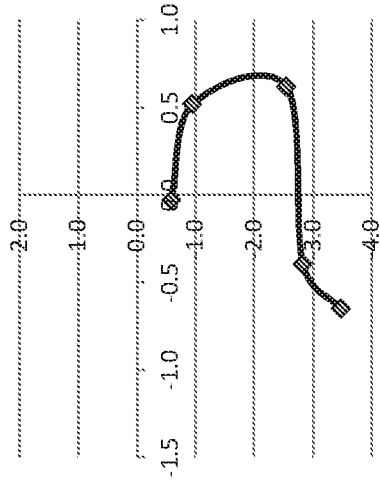
Figure 12H:
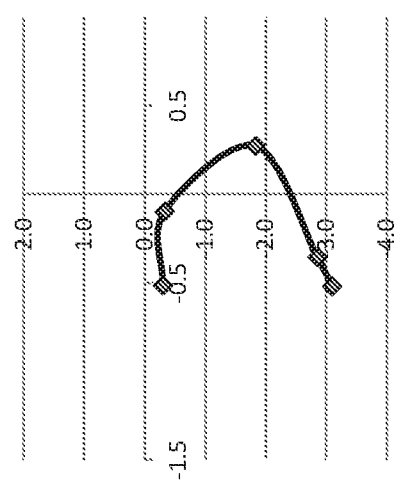
Figure 12Q:
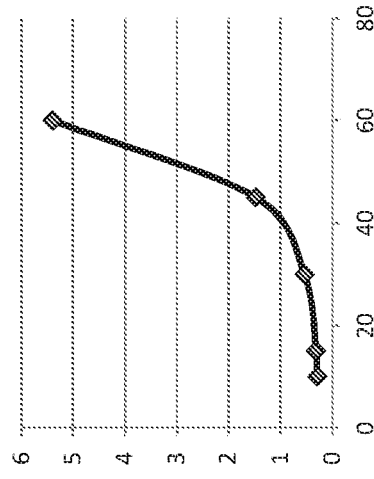
Figure 12R:
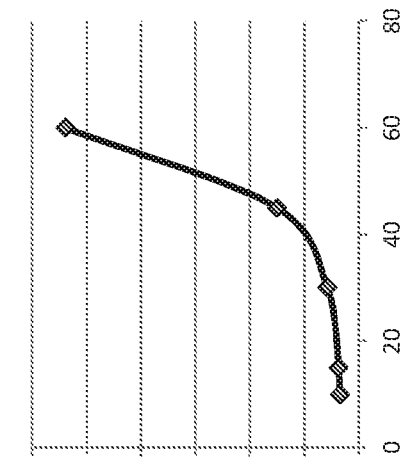
Figure 12S:
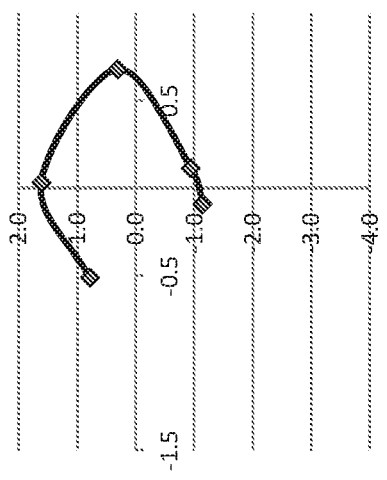
Figure 12T:
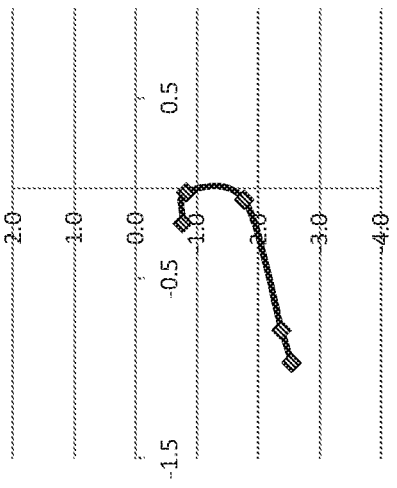
Figure 12U:
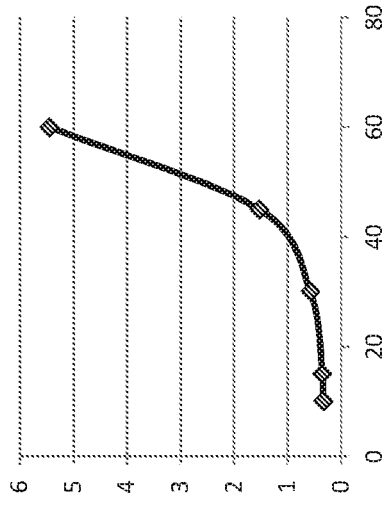
Figure 12V:
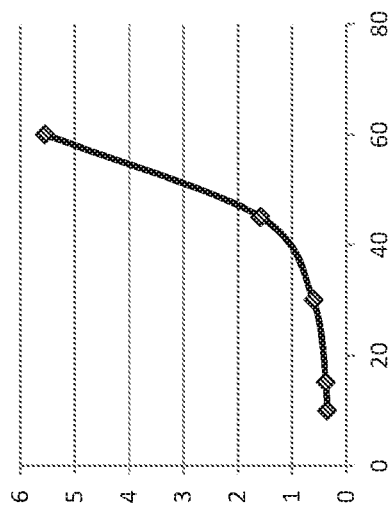
Figure 12W:
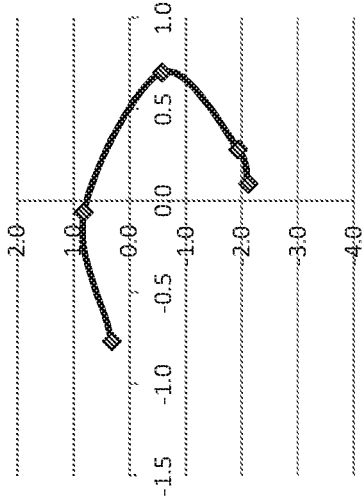
Figure 12X:
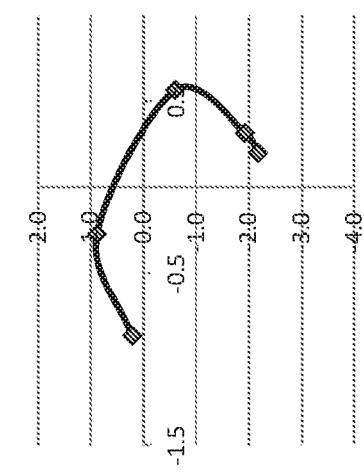
Figure 12Y:
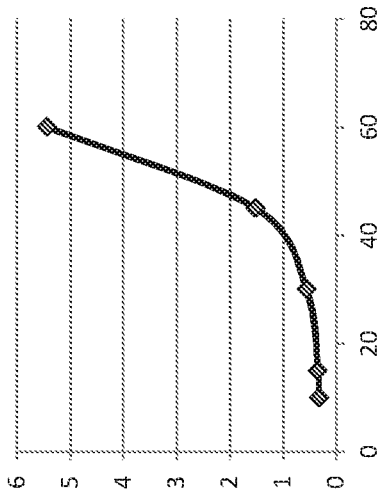
Figure 12A:
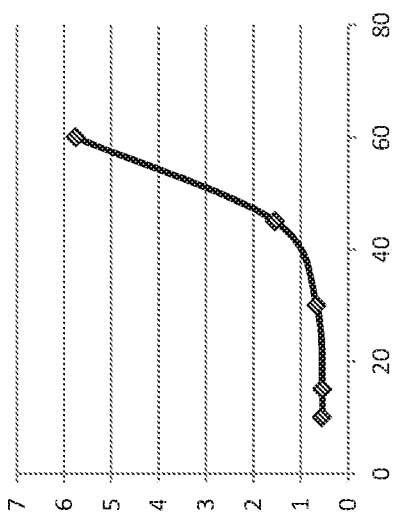
Figure 12Z:
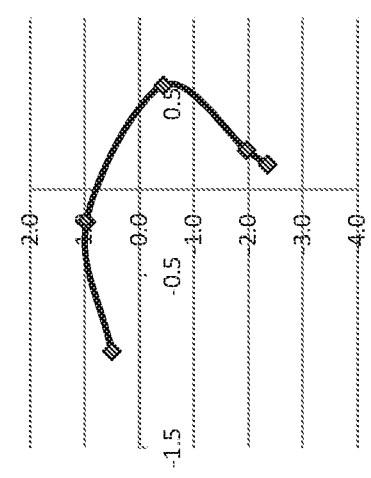
Figure 12B:
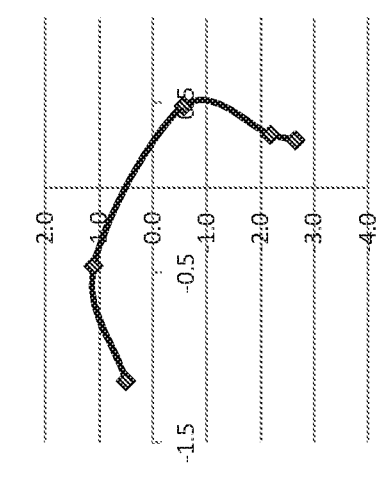
Figure 12C:
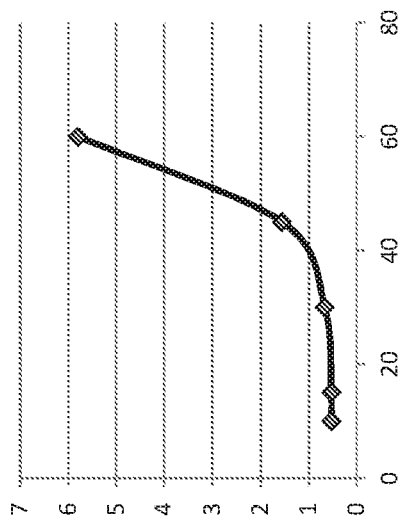
Figure 12E:
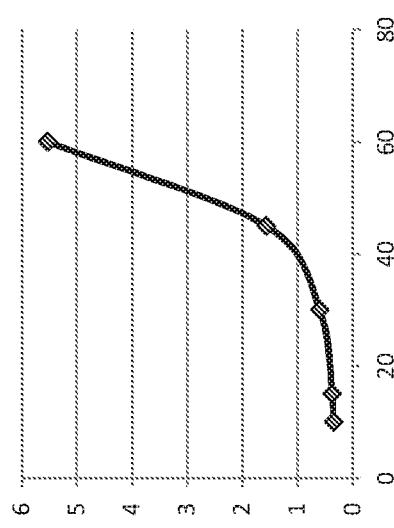
Figure 12D:
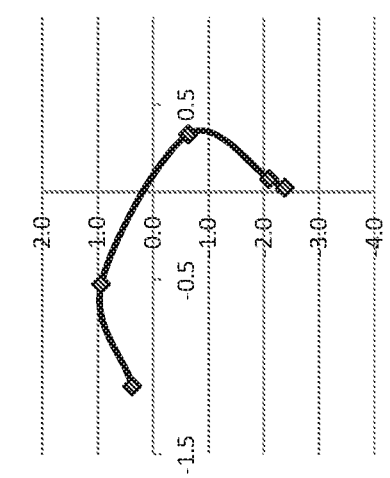
Figure 12F:
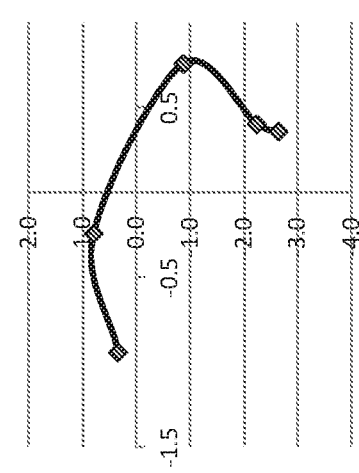
Figure 12G:
Figure 12H:
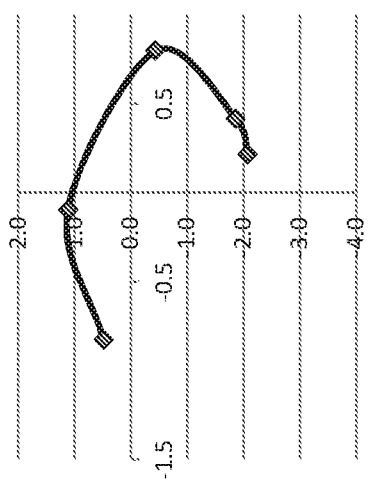

The optical performance of Examples 1 and 2 were measured for confirmation, and the results are provided in Table 2, and the results for Example 1 are shown in FIGS. 9A and 9B, and for Example 2 in FIGS. 10A and 10B. Specifically, Table 2 shows the CIE L*, a*, b* color coordinates in reflection at angles of 10°, 15°, 30°, 45°, and 60° for Examples 1 and 2 under a D65, CIE 1964 illuminant at an angle of illumination of 10°. The a* and b* coordinates for Example 1 are shown in FIG. 9A, and the measured reflectance, Y, is shown in FIG. 9B. Similarly, the a* and b* coordinates for Example 2 are shown in FIG. 10A, and the measured reflectance, Y, is shown in FIG. 10B.

TABLE 2

Color coordinates in reflection for Examples 1 and 2.

| Example | Reflectance Value | Viewing Angle | | | | |
|---|---|---|---|---|---|---|
| | | 10° | 15° | 30° | 45° | 60° |
| 1 | a* | –1.34 | –0.79 | –0.19 | –0.17 | –0.70 |
| | b* | –1.63 | –1.94 | –1.45 | –0.79 | –0.59 |
| | L* | 3.32 | 3.40 | 5.32 | 12.80 | 27.67 |
| 2 | a* | –1.34 | –0.87 | –0.32 | –0.31 | –0.78 |
| | b* | –1.68 | –1.70 | –1.15 | –0.60 | –0.52 |
| | L* | 3.32 | 3.31 | 5.30 | 12.82 | 27.66 |

Due in part to the above-described upward and rightward shift in values of a* and b* in FIG. 7, embodiments of the present disclosure are designed to have values of a* and b* that start within specified ranges at low angles of incidence (e.g., about 0° or about 10°). That is, embodiments of the present disclosure are not necessarily designed to have the "most neutral" color at low angles of incidence, which would be at the origin of the graph in FIG. 7 (i.e., a*=0 and b*=0), because the shift in color as the angle of incidence increases would result in a color shift away from neutral. Accordingly, in one or more embodiments, the anti-reflective coating is designed to have color values that are down and/or to the left of the origin, as viewed in the graph in FIG. 7. Even though the color values at low angles of incidence may be purposefully shifted from the origin in FIG. 7, the range of color values over the range of viewing angles may nonetheless be considered to be neutral or near-neutral. As used herein, "neutral" and "near-neutral" are intended to refer to color values that appear neutral to the human eye.

Further examples and comparative examples of the thicknesses of the anti-reflective coating are provided below in Tables 3 and 4. In particular, one hundred anti-reflective coating samples were prepared according to various aspects of embodiments of this disclosure. The AR coating samples were designed to have a* values in a range from about −2 to about 0, and b* values in a range from about −4 to about −1 at a viewing angle of about 10°. This target range for a* and b* at the viewing angle of 10° is represented in FIG. 11 as the rectangle in the lower-left quadrant of the graph (as viewed on the page). As shown in Table 3, the color of each sample was analyzed according to the Specular Component Included (SCI) method at a viewing angle of 8° using a Konica Minolta CM700d integrating sphere spectrometer. Two independent measurements were made for each sample, and the values of L*, a*, b*, and Y in Table 3 for each of these measurement for the one hundred samples.

TABLE 3

Measured color data for 100 anti-reflective coating samples.

| Sample | L* | a* | b* | Y |
|---|---|---|---|---|
| #01 | 3.44 | −1.51 | −2.58 | 0.378703 |
|  | 3.55 | −1.29 | −2.91 | 0.390841 |
| #02 | 3.69 | −1.04 | −3.21 | 0.40629 |
|  | 3.65 | −0.95 | −3.24 | 0.401876 |
| #03 | 3.63 | −1.06 | −3.14 | 0.399669 |
|  | 3.68 | −1 | −3.1 | 0.405186 |
| #04 | 3.4 | −0.15 | −2.41 | 0.37429 |
|  | 3.48 | −0.05 | −2.51 | 0.383117 |
| #05 | 3.43 | −1.28 | −2.67 | 0.3776 |
|  | 3.39 | −1.29 | −2.77 | 0.373186 |
| #06 | 3.68 | −0.38 | −2.28 | 0.405186 |
|  | 3.67 | −0.24 | −2.24 | 0.404083 |
| #07 | 3.85 | −0.13 | −2.31 | 0.423945 |
|  | 3.76 | −0.19 | −2.4 | 0.414014 |
| #08 | 3.72 | −0.27 | −2.41 | 0.4096 |
|  | 3.8 | −0.19 | −2.4 | 0.418428 |
| #09 | 4.02 | 0.02 | −2.61 | 0.442703 |
|  | 3.7 | −0.17 | −2.38 | 0.407393 |
| #10 | 3.97 | −0.11 | −2.48 | 0.437186 |
|  | 3.81 | −0.21 | −2.4 | 0.419531 |
| #11 | 3.63 | −0.39 | −2.55 | 0.399669 |
|  | 3.53 | −0.49 | −2.37 | 0.388634 |
| #12 | 3.68 | −0.58 | −3.61 | 0.405186 |
|  | 3.68 | −0.64 | −3.7 | 0.405186 |
| #13 | 3.31 | −1.31 | −2.82 | 0.364359 |
|  | 3.28 | −1.29 | −2.68 | 0.361048 |
| #14 | 3.66 | −0.91 | −3.05 | 0.402979 |
|  | 3.66 | −0.96 | −3.25 | 0.402979 |
| #15 | 3.51 | −0.02 | −2.48 | 0.386428 |
|  | 3.43 | −0.09 | −2.44 | 0.3776 |
| #16 | 3.38 | −0.43 | −2.17 | 0.372083 |
|  | 3.41 | −0.48 | −2.14 | 0.375393 |
| #17 | 3.63 | −0.04 | −2.49 | 0.399669 |
|  | 3.6 | −0.02 | −2.48 | 0.396359 |
| #18 | 3.28 | −1.13 | −2.84 | 0.361048 |
|  | 3.33 | −1.19 | −3.04 | 0.366566 |
| #19 | 3.66 | −0.61 | −3.63 | 0.402979 |
|  | 3.69 | −0.53 | −3.56 | 0.40629 |
| #20 | 3.69 | −0.54 | −2.96 | 0.40629 |
|  | 3.81 | −0.62 | −3.09 | 0.419531 |
| #21 | 3.41 | −1.35 | −2.41 | 0.375393 |
|  | 3.43 | −1.45 | −2.53 | 0.3776 |

TABLE 3-continued

Measured color data for 100 anti-reflective coating samples.

| Sample | L* | a* | b* | Y |
|---|---|---|---|---|
| #22 | 3.56 | −1.14 | −3.04 | 0.391945 |
|  | 3.48 | −1.26 | −2.8 | 0.383117 |
| #23 | 3.58 | −0.21 | −2.43 | 0.394152 |
|  | 3.58 | −0.1 | −2.35 | 0.394152 |
| #24 | 3.66 | −0.96 | −3.01 | 0.402979 |
|  | 3.68 | −1.05 | −2.99 | 0.405186 |
| #25 | 3.41 | −0.51 | −2.4 | 0.375393 |
|  | 3.39 | −0.64 | −2.23 | 0.373186 |
| #26 | 3.39 | −0.32 | −2.48 | 0.373186 |
|  | 3.42 | −0.41 | −2.32 | 0.376497 |
| #27 | 3.45 | −0.28 | −2.4 | 0.379807 |
|  | 3.34 | −0.29 | −2.47 | 0.367669 |
| #28 | 3.38 | −0.31 | −2.5 | 0.372083 |
|  | 3.4 | −0.2 | −2.44 | 0.37429 |
| #29 | 3.87 | −0.11 | −2.57 | 0.426152 |
|  | 3.77 | −0.22 | −2.59 | 0.415117 |
| #30 | 3.46 | −0.28 | −2.46 | 0.38091 |
|  | 3.46 | −0.2 | −2.61 | 0.38091 |
| #31 | 3.96 | −0.46 | −3.88 | 0.436083 |
|  | 3.85 | −0.52 | −3.74 | 0.423945 |
| #32 | 3.87 | −1.23 | −3.23 | 0.426152 |
|  | 3.83 | −1.33 | −2.92 | 0.421738 |
| #33 | 3.94 | 0.2 | −2.27 | 0.433876 |
|  | 3.75 | −0.02 | −2.11 | 0.41291 |
| #34 | 3.92 | −0.93 | −3.36 | 0.431669 |
|  | 3.9 | −0.86 | −3.38 | 0.429462 |
| #35 | 3.6 | −1.54 | −2.9 | 0.396359 |
|  | 3.59 | −1.48 | −3.03 | 0.395255 |
| #36 | 3.8 | −0.87 | −3.2 | 0.418428 |
|  | 3.82 | −0.86 | −3.34 | 0.420634 |
| #37 | 3.93 | −0.73 | −3.37 | 0.432772 |
|  | 3.81 | −0.79 | −3.13 | 0.419531 |
| #38 | 3.78 | −1.18 | −3.11 | 0.416221 |
|  | 3.77 | −1.25 | −2.95 | 0.415117 |
| #39 | 3.89 | −0.73 | −3.29 | 0.428359 |
|  | 3.88 | −0.73 | −3.16 | 0.427255 |
| #40 | 3.67 | −1.27 | −2.85 | 0.404083 |
|  | 3.68 | −1.12 | −3.01 | 0.405186 |
| #41 | 3.71 | −1.35 | −3.1 | 0.408497 |
|  | 3.66 | −1.47 | −2.82 | 0.402979 |
| #42 | 3.53 | −0.3 | −1.68 | 0.388634 |
|  | 3.56 | −0.36 | −1.69 | 0.391945 |
| #43 | 3.55 | 0.08 | −2.16 | 0.390841 |
|  | 3.56 | 0.17 | −2.1 | 0.391945 |
| #44 | 3.72 | −0.87 | −2.82 | 0.4096 |
|  | 3.65 | −0.96 | −2.86 | 0.401876 |
| #45 | 3.81 | −0.05 | −2.39 | 0.419531 |
|  | 3.99 | −0.02 | −2.43 | 0.439393 |
| #46 | 3.5 | 0.02 | −2.3 | 0.385324 |
|  | 3.53 | 0.02 | −2.26 | 0.388634 |
| #47 | 3.45 | −1.44 | −2.83 | 0.379807 |
|  | 3.33 | −1.3 | −3.01 | 0.366566 |
| #48 | 3.51 | −0.2 | −2.94 | 0.386428 |
|  | 3.49 | −0.22 | −2.81 | 0.384221 |
| #49 | 3.67 | −1.23 | −2.62 | 0.404083 |
|  | 3.7 | −1.17 | −2.69 | 0.407393 |
| #50 | 3.9 | −0.87 | −2.65 | 0.429462 |
|  | 3.92 | −0.86 | −2.79 | 0.431669 |
| #51 | 3.8 | −0.6 | −3.02 | 0.418428 |
|  | 3.81 | −0.73 | −2.79 | 0.419531 |
| #52 | 3.31 | −0.51 | −2.64 | 0.364359 |
|  | 3.26 | −0.45 | −2.64 | 0.358841 |
| #53 | 3.33 | −0.25 | −2.31 | 0.366566 |
|  | 3.41 | −0.22 | −2.36 | 0.375393 |
| #54 | 3.66 | −0.05 | −1.82 | 0.402979 |
|  | 3.63 | −0.12 | −1.86 | 0.399669 |
| #55 | 3.61 | −0.17 | −2.14 | 0.397462 |
|  | 3.67 | −0.14 | −2.16 | 0.404083 |
| #56 | 3.29 | −0.93 | −2.11 | 0.362152 |
|  | 3.25 | −0.89 | −2.13 | 0.357738 |
| #57 | 3.13 | −0.48 | −2.28 | 0.344497 |
|  | 3.04 | −0.7 | −2.24 | 0.334566 |
| #58 | 3.33 | −0.54 | −2.4 | 0.366566 |
|  | 3.32 | −0.66 | −2.23 | 0.365462 |
| #59 | 3.33 | −0.52 | −2.06 | 0.366566 |
|  | 3.26 | −0.48 | −2.08 | 0.358841 |

TABLE 3-continued

Measured color data for 100 anti-reflective coating samples.

| Sample | L* | a* | b* | Y |
|---|---|---|---|---|
| #60 | 3.42 | −0.19 | −2.43 | 0.376497 |
|  | 3.44 | −0.27 | −2.29 | 0.378703 |
| #61 | 3.57 | 0.2 | −2.6 | 0.393048 |
|  | 3.49 | 0.1 | −2.39 | 0.384221 |
| #62 | 3.62 | −0.18 | −2.26 | 0.398566 |
|  | 3.68 | −0.08 | −2.35 | 0.405186 |
| #63 | 3.71 | −0.01 | −2.03 | 0.408497 |
|  | 3.62 | −0.11 | −1.96 | 0.398566 |
| #64 | 3.89 | 0.22 | −2.73 | 0.428359 |
|  | 3.86 | 0.12 | −2.58 | 0.425048 |
| #65 | 3.89 | 0.55 | −2.92 | 0.428359 |
|  | 4.11 | 0.67 | −3.11 | 0.452634 |
| #66 | 3.65 | 0.21 | −2.46 | 0.401876 |
|  | 3.71 | 0.24 | −2.54 | 0.408497 |
| #67 | 3.75 | 0.21 | −2.7 | 0.41291 |
|  | 3.93 | 0.29 | −2.78 | 0.432772 |
| #68 | 3.54 | −0.03 | −2.2 | 0.389738 |
|  | 3.45 | −0.01 | −2.19 | 0.379807 |
| #69 | 3.84 | 0.2 | −2.67 | 0.422841 |
|  | 3.81 | 0.01 | −2.64 | 0.419531 |
| #70 | 3.49 | −0.11 | −2.28 | 0.384221 |
|  | 3.44 | −0.13 | −2.3 | 0.378703 |
| #71 | 3.85 | 0.29 | −2.68 | 0.423945 |
|  | 3.81 | 0.34 | −2.77 | 0.419531 |
| #72 | 3.62 | 0.21 | −2.32 | 0.398566 |
|  | 3.56 | 0.16 | −2.35 | 0.391945 |
| #73 | 3.84 | 0.05 | −2.51 | 0.422841 |
|  | 3.82 | 0.09 | −2.38 | 0.420634 |
| #74 | 3.54 | −0.15 | −2.09 | 0.389738 |
|  | 3.46 | 0.03 | −2.01 | 0.38091 |
| #75 | 3.83 | 0.18 | −2.6 | 0.421738 |
|  | 3.66 | 0.17 | −2.69 | 0.402979 |
| #76 | 3.42 | −1.67 | −2.48 | 0.376497 |
|  | 3.44 | −1.87 | −2.16 | 0.378703 |
| #77 | 3.8 | −1.19 | −3.05 | 0.418428 |
|  | 3.73 | −1.23 | −3.1 | 0.410703 |
| #78 | 3.52 | −1.39 | −2.94 | 0.387531 |
|  | 3.51 | −1.38 | −2.77 | 0.386428 |
| #79 | 3.84 | −0.2 | −2.37 | 0.422841 |
|  | 3.87 | −0.16 | −2.42 | 0.426152 |
| #80 | 3.66 | −0.47 | −2.24 | 0.402979 |
|  | 3.63 | −0.29 | −2.5 | 0.399669 |
| #81 | 3.95 | −0.9 | −2.67 | 0.434979 |
|  | 3.89 | −1.12 | −2.37 | 0.428359 |
| #82 | 4.03 | −0.7 | −2.58 | 0.443807 |
|  | 3.98 | −0.75 | −2.56 | 0.43829 |
| #83 | 3.21 | −0.83 | −2.39 | 0.353324 |
|  | 3.23 | −0.77 | −2.63 | 0.355531 |
| #84 | 3.35 | −0.86 | −2.41 | 0.368772 |
|  | 3.29 | −1.07 | −2.26 | 0.362152 |
| #85 | 3.25 | −0.01 | −1.64 | 0.357738 |
|  | 3.2 | −0.09 | −1.68 | 0.352221 |
| #86 | 3.62 | −0.39 | −2.66 | 0.398566 |
|  | 3.54 | −0.5 | −2.67 | 0.389738 |
| #87 | 3.28 | −0.16 | −1.49 | 0.361048 |
|  | 3.4 | −0.28 | −1.35 | 0.37429 |
| #88 | 3.49 | −0.74 | −2.52 | 0.384221 |
|  | 3.53 | −0.67 | −2.47 | 0.388634 |
| #89 | 3.15 | −0.27 | −1.26 | 0.346703 |
|  | 3.25 | −0.23 | −1.32 | 0.357738 |
| #90 | 3.34 | −0.07 | −1.32 | 0.367669 |
|  | 3.29 | −0.15 | −1.3 | 0.362152 |
| #91 | 3.83 | −0.99 | −2.67 | 0.421738 |
|  | 3.86 | −1.06 | −2.73 | 0.425048 |
| #92 | 4.14 | −0.67 | −2.88 | 0.455945 |
|  | 4.07 | −0.64 | −2.87 | 0.448221 |
| #93 | 3.75 | −1.06 | −2.38 | 0.41291 |
|  | 3.74 | −1.18 | −2.39 | 0.411807 |
| #94 | 3.95 | −0.75 | −2.7 | 0.434979 |
|  | 3.9 | −0.71 | −2.69 | 0.429462 |
| #95 | 3.6 | −1.4 | −2.5 | 0.396359 |
|  | 3.57 | −1.32 | −2.54 | 0.393048 |
| #96 | 3.85 | −0.89 | −2.85 | 0.423945 |
|  | 3.81 | −0.82 | −2.83 | 0.419531 |
| #97 | 3.91 | 0.08 | −2.47 | 0.430566 |
|  | 3.87 | −0.02 | −2.42 | 0.426152 |
| #98 | 3.71 | −0.15 | −1.86 | 0.408497 |
|  | 3.8 | −0.09 | −1.84 | 0.418428 |
| #99 | 3.85 | 0.04 | −2.46 | 0.423945 |
|  | 3.74 | −0.1 | −2.41 | 0.411807 |
| #100 | 3.41 | −0.32 | −1.89 | 0.375393 |
|  | 3.39 | −0.28 | −1.96 | 0.373186 |

Measurements were also performed using an Agilent Cary5000 UV-Vis-NIR Spectrophotometer from 800 to 380 nm. The spectrophotometer was used with a universal measurement accessory (UMA), in advanced measurement mode of absolute, and at angles of incidence of 10°, 15°, 30°, 45°, and 60°. Specular reflectance measurements were performed with samples inserted in sample holder in UMA compartment. A background scan was performed before each new measurement configuration (i.e. polarization). Measurements performed with samples coated surface incident to instrument beam at varying angles in s and p polarizations. First-surface reflectance was achieved by coupling the sample to a 3390 black glass using index matching oil close to that of the sample. The coupling allows light to enter the sample and pass in to the black glass where it is absorbed, thereby removing the second surface contribution. Reflectance measurements at each polarization and angle were corrected to the corresponding ratio of the calculated (true) 1st surface reflectance of 7980 fused silica to the measured first-surface reflectance of 7980 fused silica. The standard Fresnel equations for reflected intensity of s- and p-polarizations was used (found under 'Corrections' tab). The s and p values were averaged to result in unpolarized light. All measurements made with coated surface incident to incoming beam. The UV-Vis-NIR spectrophotometer was configured with integrating sphere (required for scattering media) or standard axial detector. The wavelength range was typically 380-780 nm, but at least inclusive of 400-700 nm.

For calculations, color or chromaticity is a weighting and summation of the object spectral transmittance (or reflectance), the human eye "standard observer" spectral functions and the illuminant power spectral distribution. D65, A, and F2 illuminants were used at both 2° and 10° observer. The color coordinates for Illuminant D65, A and F2 w/10° observer were calculated from the visible transmittance data. A wavelength range of 770 nm-380 nm (2 nm interval) was used for the color calculations.

The SCI a* and b* values from Table 3 are plotted in FIG. 11, and most samples fall within the targeted range a* and b* values (i.e., within the first rectangle in the lower-left quadrant of FIG. 11). FIG. 11 also includes a second rectangle shown in dotted lines and overlapping all four quadrants of the graph in FIG. 11. This second rectangle represents a desired range of a* and b* values for an AR coating viewed at a wide viewing angle (e.g.,) 60°. This range is defined as values of a* from about −2 to about 1, and values of b* from about −1 to about 1. An AR coating exhibiting color values within the first rectangle at lower viewing angles (i.e., 10°) and within the second rectangle at higher viewing angles (i.e., 60°), and with near-neutral color at viewing angles in-between, will possess desired performance in terms of near-neutral color and minimum color shift across wide viewing angles.

Of the one hundred samples in Table 3, seventeen samples were chosen to determine precise layer thicknesses. These chosen samples were sample nos. 04, 10, 12, 20, 21, 22, 25, 33, 65, 66, 67, 69, 71, 72, 74, 90, and 93. Layer thicknesses were modeled based on the measured optical/color data. The modeled thickness of each samples' silica buffer layer, $1^{st}$ $Nb_2O_5$ layer, $1^{st}$ $SiO_2$ layer, $2^{nd}$ $Nb_2O_5$ layer, and $2^{nd}$ $SiO_2$ layer are shown in Table 4. Table 4 also shows the average thickness of the silica buffer layers, $1^{st}$ $Nb_2O_5$ layers, $1^{st}$ $SiO_2$ layers, $2^{nd}$ $Nb_2O_5$ layers, and $2^{nd}$ $SiO_2$ layers across all seventeen samples, as well as the deviation in thickness for each of those layers, expressed as a difference between the maximum thickness and the average thickness.

TABLE 4

Modeled thicknesses of layers for selected anti-reflective coating samples.

| | Layer Thickness (nm) | | | | |
|---|---|---|---|---|---|
| Sample # | $SiO_2$ Buffer Layer | $1^{st}$ $Nb_2O_5$ Layer | $1^{st}$ $SiO_2$ Layer | $2^{nd}$ $Nb_2O_5$ Layer | $2^{nd}$ $SiO_2$ Layer |
| #04 | 25.15 | 12.61 | 40.97 | 117.79 | 82.58 |
| #10 | 24.68 | 12.58 | 41.21 | 118.70 | 82.84 |
| #12 | 22.42 | 12.43 | 41.90 | 117.95 | 82.67 |
| #20 | 25.00 | 12.59 | 41.46 | 118.58 | 82.63 |
| #21 | 21.40 | 11.99 | 40.85 | 116.21 | 82.62 |
| #22 | 24.32 | 12.10 | 41.46 | 116.57 | 82.41 |
| #25 | 24.44 | 12.44 | 40.45 | 116.85 | 82.71 |
| #33 | 25.31 | 12.71 | 40.7 | 118.55 | 82.16 |
| #65 | 23.00 | 13.11 | 41.17 | 120.99 | 83.95 |
| #66 | 26.42 | 12.94 | 41.38 | 119.57 | 83.34 |
| #67 | 26.90 | 12.98 | 41.59 | 120.08 | 83.36 |
| #69 | 25.50 | 12.96 | 41.41 | 119.91 | 83.59 |
| #71 | 24.06 | 12.88 | 41.38 | 119.52 | 82.86 |
| #72 | 25.10 | 12.99 | 40.81 | 118.85 | 82.90 |
| #74 | 23.45 | 12.73 | 40.56 | 117.93 | 82.40 |
| #90 | 24.68 | 12.63 | 39.86 | 116.35 | 82.47 |
| #93 | 23.99 | 12.16 | 41.10 | 117.03 | 81.96 |
| Average | 24.46 | 12.64 | 41.08 | 118.32 | 82.79 |
| $\Delta_{max-avg}$ | 2.44 | 0.47 | 0.83 | 2.67 | 1.16 |

The thicknesses in Table 4 can be considered physical thicknesses (i.e., the physical dimension, measured in units of distance). However, according to one or more embodiments, the layer thicknesses of the anti-reflective coating can be defined by their optical thickness, as opposed to their physical thicknesses. The optical thickness to, as used herein, is defined as the physical thickness (nm) multiplied by the refractive index, and, unless otherwise specified, the optical thickness is based on a wavelength of 550 nm. Therefore, considering low refractive index materials having a refractive index from about 1.4 to about 1.5, and high refractive index materials having a refractive index from about 1.7 to about 2.5, embodiments of the present disclosure include a four-layer anti-reflective coating with, in order from bottom to top, a $1^{st}$ high-index layer with an optical thickness ranging from about 15 nm to about 40 nm; a $1^{st}$ low-index layer with an optical thickness ranging from about 50 nm to about 70 nm; a $2^{nd}$ high-index layer with an optical thickness ranging from about 75 nm to about 310 nm; and a $2^{nd}$ low-index layer with an optical thickness ranging from about 105 nm to about 135 nm. In further embodiments of the present disclosure, the four-layer anti-reflective coating can have, in order from bottom to top, a $1^{st}$ high-index layer with an optical thickness ranging from about 20 nm to about 35 nm; a $1^{st}$ low-index layer with an optical thickness ranging from about 55 nm to about 65 nm; a $2^{nd}$ high-index layer with an optical thickness ranging from about 80 nm to about 305 nm; and a $2^{nd}$ low-index layer with an optical thickness ranging from about 110 nm to about 130 nm.

As shown in Table 5 below, the samples of Table 4 were further analyzed for their first-surface reflectance values, including the CIE color values of a*, b*, L*, the CIE tristimulus of X, Y, Z, and the CIE chromaticity values of x, y, and z, all at viewing angles of 10°, 15°, 30°, 45°, and 60° under a D65 illuminant. The a* and b* values of Sample Nos. 4, 10, 12, 20, 21, 22, 25, 33, 65, 66, 67, 69, 71, 72, 74, 90, and 93 are shown in FIGS. 12A, 12C, 12E, 12G, 12I, 12K, 12M, 12O, 12Q, 12S, 12U, 12W, 12Y, 12AA, 12CC, 12EE, and 12GG. The Y values are shown in FIGS. 12B, 12D, 12F, 12H, 12J, 12L, 12N, 12P, 12R, 12T, 12V, 12X, 12Z, 12BB, 12DD, 12FF, and 12HH.

TABLE 5

Color coordinates in reflection for selected samples.

| | | | | Viewing Angle | | |
|---|---|---|---|---|---|---|
| Sample | Reflectance Value | 10° | 15° | 30° | 45° | 60° |
| #04 | a* | −0.05 | 0.18 | 0.71 | 0.02 | −0.65 |
| | b* | −2.29 | −2.16 | −0.77 | 0.65 | 0.32 |
| | L* | 2.93 | 3.11 | 5.09 | 12.67 | 27.94 |
| | X | 0.31 | 0.33 | 0.55 | 1.43 | 5.10 |
| | Y | 0.32 | 0.34 | 0.56 | 1.51 | 5.44 |
| | Z | 0.51 | 0.52 | 0.66 | 1.56 | 5.76 |
| | x | 0.2696 | 0.2773 | 0.3111 | 0.3183 | 0.3130 |
| | y | 0.2854 | 0.2886 | 0.3179 | 0.3355 | 0.3336 |
| | z | 0.4451 | 0.4341 | 0.3709 | 0.3462 | 0.3534 |
| #10 | a* | −0.36 | −0.26 | 0.07 | −0.53 | −0.96 |
| | b* | −2.24 | −1.95 | −0.79 | 0.48 | 0.18 |
| | L* | 3.17 | 3.36 | 5.35 | 12.87 | 28.03 |
| | X | 0.32 | 0.35 | 0.56 | 1.44 | 5.11 |
| | Y | 0.35 | 0.37 | 0.59 | 1.54 | 5.47 |
| | Z | 0.53 | 0.53 | 0.69 | 1.61 | 5.83 |
| | x | 0.2686 | 0.2767 | 0.3052 | 0.3142 | 0.3113 |
| | y | 0.2910 | 0.2972 | 0.3209 | 0.3357 | 0.3334 |
| | z | 0.4404 | 0.4261 | 0.3738 | 0.3501 | 0.3552 |
| #12 | a* | −0.65 | −0.39 | 0.62 | 0.52 | −0.03 |
| | b* | −3.48 | −2.83 | −2.55 | −0.94 | −0.59 |
| | L* | 3.04 | 3.33 | 4.94 | 12.35 | 27.69 |
| | X | 0.30 | 0.34 | 0.53 | 1.40 | 5.06 |
| | Y | 0.34 | 0.37 | 0.55 | 1.46 | 5.34 |
| | Z | 0.60 | 0.59 | 0.76 | 1.66 | 5.87 |
| | x | 0.2444 | 0.2617 | 0.2895 | 0.3100 | 0.3111 |
| | y | 0.2712 | 0.2838 | 0.2968 | 0.3229 | 0.3283 |
| | z | 0.4844 | 0.4546 | 0.4137 | 0.3670 | 0.3606 |
| #20 | a* | −0.52 | −0.36 | 0.27 | −0.10 | −0.52 |
| | b* | −3.10 | −2.85 | −1.83 | −0.33 | −0.30 |
| | L* | 3.16 | 3.31 | 5.20 | 12.68 | 27.91 |
| | X | 0.32 | 0.34 | 0.55 | 1.43 | 5.10 |
| | Y | 0.35 | 0.37 | 0.58 | 1.51 | 5.42 |
| | Z | 0.59 | 0.59 | 0.74 | 1.65 | 5.89 |
| | x | 0.2537 | 0.2615 | 0.2951 | 0.3111 | 0.3107 |
| | y | 0.2782 | 0.2829 | 0.3075 | 0.3289 | 0.3304 |
| | z | 0.4681 | 0.4556 | 0.3974 | 0.3600 | 0.3589 |
| #21 | a* | −1.46 | −1.28 | −0.20 | 0.12 | 0.08 |
| | b* | −2.39 | −2.31 | −1.87 | −1.01 | −0.97 |
| | L* | 2.79 | 2.93 | 4.58 | 11.95 | 27.41 |
| | X | 0.26 | 0.28 | 0.48 | 1.33 | 4.98 |
| | Y | 0.31 | 0.32 | 0.51 | 1.40 | 5.24 |
| | Z | 0.50 | 0.51 | 0.67 | 1.60 | 5.85 |
| | x | 0.2422 | 0.2494 | 0.2873 | 0.3074 | 0.3097 |
| | y | 0.2907 | 0.2928 | 0.3062 | 0.3233 | 0.3263 |
| | z | 0.4672 | 0.4578 | 0.4065 | 0.3693 | 0.3640 |
| #22 | a* | −1.12 | −0.81 | 0.18 | 0.41 | 0.04 |
| | b* | −2.98 | −2.94 | −2.34 | −1.32 | −0.94 |
| | L* | 2.98 | 3.11 | 4.83 | 12.21 | 27.59 |
| | X | 0.29 | 0.31 | 0.51 | 1.38 | 5.03 |
| | Y | 0.33 | 0.34 | 0.53 | 1.44 | 5.31 |
| | Z | 0.56 | 0.57 | 0.73 | 1.67 | 5.91 |
| | x | 0.2431 | 0.2508 | 0.2871 | 0.3069 | 0.3098 |
| | y | 0.2808 | 0.2815 | 0.3002 | 0.3204 | 0.3265 |
| | z | 0.4761 | 0.4677 | 0.4128 | 0.3727 | 0.3637 |
| #25 | a* | −0.51 | −0.30 | 0.47 | 0.19 | −0.35 |
| | b* | −2.30 | −2.01 | −1.02 | 0.25 | 0.10 |
| | L* | 2.77 | 2.91 | 4.76 | 12.30 | 27.71 |
| | X | 0.28 | 0.30 | 0.51 | 1.38 | 5.04 |
| | Y | 0.31 | 0.32 | 0.53 | 1.45 | 5.35 |
| | Z | 0.49 | 0.48 | 0.64 | 1.53 | 5.72 |

TABLE 5-continued

Color coordinates in reflection for selected samples.

| Sample | Reflectance Value | 10° | 15° | 30° | 45° | 60° |
|---|---|---|---|---|---|---|
| | x | 0.26 | 0.27 | 0.31 | 0.32 | 0.31 |
| | y | 0.29 | 0.29 | 0.31 | 0.33 | 0.33 |
| | z | 0.45 | 0.44 | 0.38 | 0.35 | 0.35 |
| #33 | a* | 0.20 | 0.32 | 0.56 | −0.27 | −0.86 |
| | b* | −2.17 | −1.93 | −0.60 | 0.88 | 0.22 |
| | L* | 3.21 | 3.40 | 5.52 | 13.09 | 28.24 |
| | X | 0.34 | 0.36 | 0.59 | 1.49 | 5.19 |
| | Y | 0.36 | 0.38 | 0.61 | 1.58 | 5.55 |
| | Z | 0.53 | 0.54 | 0.70 | 1.60 | 5.90 |
| | x | 0.2783 | 0.2854 | 0.3120 | 0.3183 | 0.3118 |
| | y | 0.2894 | 0.2946 | 0.3214 | 0.3379 | 0.3334 |
| | z | 0.4323 | 0.4200 | 0.3666 | 0.3438 | 0.3548 |
| #65 | a* | 0.40 | 0.44 | 0.54 | −0.55 | −1.26 |
| | b* | −2.60 | −2.19 | −0.45 | 1.29 | 0.90 |
| | L* | 3.18 | 3.37 | 5.41 | 13.01 | 28.19 |
| | X | 0.34 | 0.36 | 0.58 | 1.46 | 5.14 |
| | Y | 0.35 | 0.37 | 0.60 | 1.56 | 5.53 |
| | Z | 0.56 | 0.55 | 0.67 | 1.55 | 5.72 |
| | x | 0.2743 | 0.2827 | 0.3134 | 0.3196 | 0.3135 |
| | y | 0.2811 | 0.2895 | 0.3231 | 0.3415 | 0.3373 |
| | z | 0.4447 | 0.4278 | 0.3635 | 0.3389 | 0.3493 |
| #66 | a* | 0.15 | 0.23 | 0.61 | −0.19 | −0.94 |
| | b* | −2.35 | −1.96 | −0.44 | 0.97 | 0.51 |
| | L* | 2.95 | 3.11 | 5.06 | 12.71 | 27.96 |
| | X | 0.31 | 0.33 | 0.55 | 1.43 | 5.08 |
| | Y | 0.33 | 0.34 | 0.56 | 1.52 | 5.44 |
| | Z | 0.51 | 0.50 | 0.63 | 1.53 | 5.72 |
| | x | 0.2719 | 0.2810 | 0.3142 | 0.3194 | 0.3128 |
| | y | 0.2835 | 0.2914 | 0.3224 | 0.3384 | 0.3349 |
| | z | 0.4446 | 0.4275 | 0.3634 | 0.3423 | 0.3523 |
| #67 | a* | 0.28 | 0.31 | 0.48 | −0.46 | −1.14 |
| | b* | −2.64 | −2.18 | −0.57 | 1.10 | 0.50 |
| | L* | 3.13 | 3.32 | 5.30 | 12.85 | 28.07 |
| | X | 0.34 | 0.36 | 0.57 | 1.44 | 5.10 |
| | Y | 0.35 | 0.37 | 0.59 | 1.54 | 5.48 |
| | Z | 0.55 | 0.55 | 0.67 | 1.54 | 5.77 |
| | x | 0.2713 | 0.2808 | 0.3115 | 0.3188 | 0.3121 |
| | y | 0.2803 | 0.2898 | 0.3218 | 0.3400 | 0.3352 |
| | z | 0.4484 | 0.4294 | 0.3668 | 0.3412 | 0.3526 |
| #69 | a* | 0.03 | 0.07 | 0.33 | −0.53 | −1.11 |
| | b* | −2.38 | −2.10 | −0.64 | 0.94 | 0.37 |
| | L* | 3.07 | 3.23 | 5.21 | 12.80 | 28.05 |
| | X | 0.32 | 0.34 | 0.56 | 1.43 | 5.10 |
| | Y | 0.34 | 0.36 | 0.58 | 1.53 | 5.48 |
| | Z | 0.53 | 0.53 | 0.66 | 1.55 | 5.79 |
| | x | 0.2709 | 0.2778 | 0.3092 | 0.3173 | 0.3117 |
| | y | 0.2852 | 0.2915 | 0.3213 | 0.3390 | 0.3345 |
| | z | 0.4439 | 0.4307 | 0.3695 | 0.3436 | 0.3538 |
| #71 | a* | 0.35 | 0.40 | 0.76 | −0.24 | −0.94 |
| | b* | −2.65 | −2.24 | −0.87 | 0.80 | 0.34 |
| | L* | 3.17 | 3.37 | 5.41 | 13.03 | 28.20 |
| | X | 0.34 | 0.36 | 0.59 | 1.48 | 5.17 |
| | Y | 0.35 | 0.37 | 0.60 | 1.57 | 5.53 |
| | Z | 0.56 | 0.55 | 0.70 | 1.60 | 5.86 |
| | x | 0.2728 | 0.2815 | 0.3105 | 0.3179 | 0.3121 |
| | y | 0.2805 | 0.2889 | 0.3172 | 0.3372 | 0.3341 |
| | z | 0.4467 | 0.4296 | 0.3722 | 0.3449 | 0.3538 |
| #72 | a* | 0.21 | 0.42 | 0.80 | −0.09 | −0.82 |
| | b* | −2.07 | −1.86 | −0.44 | 1.12 | 0.49 |
| | L* | 2.93 | 3.16 | 5.17 | 12.76 | 28.05 |
| | X | 0.31 | 0.34 | 0.56 | 1.44 | 5.12 |
| | Y | 0.32 | 0.35 | 0.57 | 1.52 | 5.47 |
| | Z | 0.49 | 0.50 | 0.65 | 1.53 | 5.76 |
| | x | 0.2773 | 0.2860 | 0.3159 | 0.3209 | 0.3131 |
| | y | 0.2876 | 0.2927 | 0.3217 | 0.3392 | 0.3346 |
| | z | 0.4352 | 0.4213 | 0.3623 | 0.3400 | 0.3523 |
| #74 | a* | 0.09 | 0.28 | 0.70 | −0.06 | −0.77 |
| | b* | −2.11 | −1.94 | −0.58 | 0.81 | 0.32 |
| | L* | 2.97 | 3.16 | 5.16 | 12.75 | 27.96 |
| | X | 0.31 | 0.34 | 0.56 | 1.44 | 5.10 |
| | Y | 0.33 | 0.35 | 0.57 | 1.52 | 5.44 |
| | Z | 0.50 | 0.51 | 0.65 | 1.56 | 5.77 |
| | x | 0.28 | 0.28 | 0.31 | 0.32 | 0.31 |
| | y | 0.29 | 0.29 | 0.32 | 0.34 | 0.33 |
| | z | 0.44 | 0.43 | 0.37 | 0.34 | 0.35 |
| #90 | a* | −0.09 | 0.11 | 0.68 | 0.03 | −0.51 |
| | b* | −1.14 | −0.94 | 0.31 | 1.62 | 0.79 |
| | L* | 2.64 | 2.82 | 4.84 | 12.47 | 27.82 |
| | X | 0.27 | 0.30 | 0.52 | 1.48 | 5.07 |
| | Y | 0.29 | 0.31 | 0.54 | 1.48 | 5.39 |
| | Z | 0.39 | 0.40 | 0.55 | 1.43 | 5.61 |
| | x | 0.2866 | 0.2955 | 0.3250 | 0.3250 | 0.3155 |
| | y | 0.3048 | 0.3088 | 0.3319 | 0.3425 | 0.3355 |
| | z | 0.4087 | 0.3957 | 0.3431 | 0.3324 | 0.3489 |
| #93 | a* | −0.97 | −0.79 | −0.07 | −0.02 | −0.19 |
| | b* | −2.54 | −2.38 | −1.77 | −0.82 | −0.77 |
| | L* | 3.15 | 3.33 | 5.21 | 12.62 | 27.82 |
| | X | 0.31 | 0.33 | 0.55 | 1.42 | 5.09 |
| | Y | 0.35 | 0.37 | 0.58 | 1.50 | 5.39 |
| | Z | 0.55 | 0.56 | 0.74 | 1.69 | 5.96 |
| | x | 0.2548 | 0.2625 | 0.2927 | 0.3081 | 0.3098 |
| | y | 0.2894 | 0.2929 | 0.3096 | 0.3252 | 0.3277 |
| | z | 0.4558 | 0.4446 | 0.3977 | 0.3667 | 0.3625 |

According to some specific embodiments, certain ranges of a* and b* values may be considered exemplary. Therefore, some embodiments of the present disclosure can be interpreted as being exemplary for certain application, due to the a* and b* values staying within certain ranges, either at one or more particular viewing angles or over a range of viewing examples. For example, in one or more embodiments, the a* value can range from about −2 to about 0 and a b* value from about −4 to about −1 at a viewing angle of 10°. In one or more embodiments, the a* value can range from about −1 to about 1 and a b* value from about −2 to about 1 at a viewing angle of 60°. In one or more embodiments, the a* value can range from about −2 to about 1, and a b* value from about −4 to about 1 at a particular viewing angle in a range from about 10° to about 60°, or at all viewing angels in a range from about 10° to about 60°. These exemplary ranges are determined to be useful for applications discussed herein, such as anti-reflective coatings in vehicle interiors. However, it is possible for the desirable ranges of a* and b* for various viewing angles to vary based on the desired use, as some users or designers may prefer certain color shifts, or certain viewing angles may less likely in some application. In any case, the a* and b* values in Table 5 can be used to determine if the anti-reflective coating of a sample is desirable for a given use. For example, Sample Nos. 33, 65, 66, 67, 69, 71, 72, and 74 have a* values that are greater than 0 at 10°, which falls outside of the above-discussed preferred range. Sample Nos. 65, 67, and 69 have a* values less than −1 at 60°, which also falls outside of the above-discussed preferred range. Sample Nos. 65, 67, and 90 also have maximum a* values of 1.29, 1.10, and 1.62, respectively, at a viewing angle of 45°, which fall outside of the above-discussed preferred range. In contrast, Sample Nos. 4, 10, 12, 20, 21, 22, 25, 69, and 93 are within or closer to the desired ranges for a* and b*.

Using the a* and b* values in Table 5, $\Delta E_\theta$ was calculated using Equation (1) for angular color variation between each of the angles at which measurement were taken. For example, $\Delta E_\theta$ was calculated where the reference viewing angle or first angle $\theta_1$ was each of 10°, 15°, 30°, 45°, and 60°, and the second viewing angle $\theta_2$ was each of the other viewing angles not equal to the current $\theta_1$. The results are shown in Table 6. The right-most column of Table 6 shows the maximum $\Delta E_\theta$ value for reference viewing angle $\theta_1$ (expressed as $\Delta E_\theta(\theta_1)$).

TABLE 6

ΔEθ values for the selected Samples.

| Sample | θ₁ | θ₂ 10 | 15 | 30 | 45 | 60 | Max ΔE_θ(θ₁) |
|---|---|---|---|---|---|---|---|
| #04 | 10 | — | 0.26799804 | 1.70020916 | 2.93565975 | 2.67861347 | 2.935659747 |
| | 15 | 0.26799804 | — | 1.48532818 | 2.80688659 | 2.61413409 | 2.806886587 |
| | 30 | 1.70020916 | 1.48532818 | — | 1.57024945 | 1.7390851 | 1.739085096 |
| | 45 | 2.93565975 | 2.80688659 | 1.57024945 | — | 0.74461993 | 2.93565975 |
| | 60 | 2.67861347 | 2.61413409 | 1.7390851 | 0.74461993 | — | 2.678613471 |
| #10 | 10 | — | 0.312467396 | 1.519919382 | 2.726161017 | 2.50103221 | 2.726161017 |
| | 15 | 0.312467396 | — | 1.207646987 | 2.43917708 | 2.242836188 | 2.43917708 |
| | 30 | 1.519919382 | 1.207646987 | — | 1.400993372 | 1.417049886 | 1.519919382 |
| | 45 | 2.726161017 | 2.43917708 | 1.400993372 | — | 0.517648379 | 2.726161017 |
| | 60 | 2.50103221 | 2.242836188 | 1.417049886 | 0.517648379 | — | 2.50103221 |
| #12 | 10 | — | 0.70425294 | 1.57624014 | 2.79270712 | 2.96073648 | 2.96073648 |
| | 15 | 0.70425294 | — | 1.04965917 | 2.09000194 | 2.26865503 | 2.26865503 |
| | 30 | 1.57624014 | 1.04965917 | — | 1.6053211 | 2.06449553 | 2.06449553 |
| | 45 | 2.79270712 | 2.09000194 | 1.6053211 | — | 0.65346906 | 2.79270712 |
| | 60 | 2.96073648 | 2.26865503 | 2.06449553 | 0.65346906 | — | 2.96073648 |
| #20 | 10 | — | 0.29515346 | 1.49640739 | 2.8026372 | 2.79415438 | 2.8026372 |
| | 15 | 0.29515346 | — | 1.20145317 | 2.53879275 | 2.55430441 | 2.55430441 |
| | 30 | 1.49640739 | 1.20145317 | — | 1.54713087 | 1.71798623 | 1.71798623 |
| | 45 | 2.8026372 | 2.53879275 | 1.54713087 | — | 0.41969162 | 2.8026372 |
| | 60 | 2.79415438 | 2.55430441 | 1.71798623 | 0.41969162 | — | 2.79415438 |
| #21 | 10 | — | 0.19518826 | 1.35653479 | 2.0923993 | 2.08706422 | 2.0923993 |
| | 15 | 0.19518826 | — | 1.16155347 | 1.90566638 | 1.90204126 | 1.90566638 |
| | 30 | 1.35653479 | 1.16155347 | — | 0.91493239 | 0.93804859 | 1.35653479 |
| | 45 | 2.0923993 | 1.90566638 | 0.91493239 | — | 0.05749404 | 2.0923993 |
| | 60 | 2.08706422 | 1.90204126 | 0.93804859 | 0.05749404 | — | 2.08706422 |
| #22 | 10 | — | 0.31074845 | 1.4458113 | 2.25386803 | 2.3421873 | 2.3421873 |
| | 15 | 0.31074845 | — | 1.15630328 | 2.02638069 | 2.1706294 | 2.1706294 |
| | 30 | 1.4458113 | 1.15630328 | — | 1.04660566 | 1.40793566 | 1.4458113 |
| | 45 | 2.25386803 | 2.02638069 | 1.04660566 | — | 0.53086018 | 2.25386803 |
| | 60 | 2.3421873 | 2.1706294 | 1.40793566 | 0.53086018 | — | 2.3421873 |
| #25 | 10 | — | 0.35803605 | 1.61565857 | 2.63594163 | 2.39837843 | 2.63594163 |
| | 15 | 0.35803605 | — | 1.25763858 | 2.30710056 | 2.10839255 | 2.30710056 |
| | 30 | 1.61565857 | 1.25763858 | — | 1.29291724 | 1.38652682 | 1.61565857 |
| | 45 | 2.63594163 | 2.30710056 | 1.29291724 | — | 0.56146674 | 2.63594163 |
| | 60 | 2.39837843 | 2.10839255 | 1.38652682 | 0.56146674 | — | 2.39837843 |
| #33 | 10 | — | 0.27191069 | 1.61546305 | 3.09061164 | 2.61654344 | 3.09061164 |
| | 15 | 0.27191069 | — | 1.35099852 | 2.86948305 | 2.44776502 | 2.86948305 |
| | 30 | 1.61546305 | 1.35099852 | — | 1.70049707 | 1.64423819 | 1.70049707 |
| | 45 | 3.09061164 | 2.86948305 | 1.70049707 | — | 0.88770422 | 3.09061164 |
| | 60 | 2.61654344 | 2.44776502 | 1.64423819 | 0.88770422 | — | 2.61654344 |
| #65 | 10 | — | 0.41023603 | 2.15044089 | 4.00260095 | 3.87598993 | 4.00260095 |
| | 15 | 0.41023603 | — | 1.74049376 | 3.61804874 | 3.53091505 | 3.61804874 |
| | 30 | 2.15044089 | 1.74049376 | — | 2.05380934 | 2.25503922 | 2.25503922 |
| | 45 | 4.00260095 | 3.61804874 | 2.05380934 | — | 0.81455989 | 4.00260095 |
| | 60 | 3.87598993 | 3.53091505 | 2.25503922 | 0.81455989 | — | 3.87598993 |
| #66 | 10 | — | 0.39304455 | 1.96361029 | 3.33403152 | 3.05490407 | 3.33403152 |
| | 15 | 0.39304455 | — | 1.57072813 | 2.96221675 | 2.73335514 | 2.96221675 |
| | 30 | 1.96361029 | 1.57072813 | — | 1.61589528 | 1.81355366 | 1.96361029 |
| | 45 | 3.33403152 | 2.96221675 | 1.61589528 | — | 0.88576146 | 3.33403152 |
| | 60 | 3.05490407 | 2.73335514 | 1.81355366 | 0.88576146 | — | 3.05490407 |
| #67 | 10 | — | 0.46466345 | 2.08571336 | 3.82017225 | 3.45464574 | 3.82017225 |
| | 15 | 0.46466345 | — | 1.62126071 | 3.37395043 | 3.05334549 | 3.37395043 |
| | 30 | 2.08571336 | 1.62126071 | — | 1.91878297 | 1.94383875 | 2.08571336 |
| | 45 | 3.82017225 | 3.37395043 | 1.91878297 | — | 0.90441661 | 3.82017225 |
| | 60 | 3.45464574 | 3.05334549 | 1.94383875 | 0.90441661 | — | 3.45464574 |
| #69 | 10 | — | 0.28731929 | 1.76769186 | 3.36496282 | 2.97975489 | 3.36496282 |
| | 15 | 0.28731929 | — | 1.48037474 | 3.0951286 | 2.74075659 | 3.0951286 |
| | 30 | 1.76769186 | 1.48037474 | — | 1.79703256 | 1.7619101 | 1.79703256 |
| | 45 | 3.36496282 | 3.0951286 | 1.79703256 | — | 0.80971745 | 3.36496282 |
| | 60 | 2.97975489 | 2.74075659 | 1.7619101 | 0.80971745 | — | 2.97975489 |
| #71 | 10 | — | 0.40870046 | 1.82078088 | 3.49474325 | 3.25219048 | 3.49474325 |
| | 15 | 0.40870046 | — | 1.41520024 | 3.1048209 | 2.90573545 | 3.1048209 |
| | 30 | 1.82078088 | 1.41520024 | — | 1.94501403 | 2.08545923 | 2.08545923 |
| | 45 | 3.49474325 | 3.1048209 | 1.94501403 | — | 0.83838918 | 3.49474325 |
| | 60 | 3.25219048 | 2.90573545 | 2.08545923 | 0.83838918 | — | 3.25219048 |
| #72 | 10 | — | 0.29209365 | 1.73382103 | 3.20481288 | 2.76142088 | 3.20481288 |
| | 15 | 0.29209365 | — | 1.47201349 | 3.02234278 | 2.65524827 | 3.02234278 |
| | 30 | 1.73382103 | 1.47201349 | — | 1.79431414 | 1.86720163 | 1.86720163 |
| | 45 | 3.20481288 | 3.02234278 | 1.79431414 | — | 0.96487711 | 3.20481288 |
| | 60 | 2.76142088 | 2.65524827 | 1.86720163 | 0.96487711 | — | 2.76142088 |

TABLE 6-continued

ΔEθ values for the selected Samples.

| Sample | $\theta_1$ | $\theta_2$ 10 | 15 | 30 | 45 | 60 | Max $\Delta E_\theta(\theta_1)$ |
|---|---|---|---|---|---|---|---|
| #74 | 10 | — | 0.25607636 | 1.64926503 | 2.92792142 | 2.57601243 | 2.92792142 |
|  | 15 | 0.25607636 | — | 1.42232104 | 2.77081604 | 2.48524864 | 2.77081604 |
|  | 30 | 1.64926503 | 1.42232104 | — | 1.58680653 | 1.7182214 | 1.7182214 |
|  | 45 | 2.92792142 | 2.77081604 | 1.58680653 | — | 0.85895528 | 2.92792142 |
|  | 60 | 2.57601243 | 2.48524864 | 1.7182214 | 0.85895528 | — | 2.57601243 |
| #90 | 10 | — | 0.28391848 | 1.63667663 | 2.75775246 | 1.97074911 | 2.75775246 |
|  | 15 | 0.28391848 | — | 1.37111272 | 2.56292234 | 1.84249798 | 2.56292234 |
|  | 30 | 1.63667663 | 1.37111272 | — | 1.46399405 | 1.28790686 | 1.63667663 |
|  | 45 | 2.75775246 | 2.56292234 | 1.46399405 | — | 0.99279081 | 2.75775246 |
|  | 60 | 1.97074911 | 1.84249798 | 1.28790686 | 0.99279081 | — | 1.97074911 |
| #93 | 10 | — | 0.24267203 | 1.18790989 | 1.96425427 | 1.93606536 | 1.96425427 |
|  | 15 | 0.24267203 | — | 0.94534718 | 1.73669295 | 1.71781388 | 1.73669295 |
|  | 30 | 1.18790989 | 0.94534718 | — | 0.94915509 | 1.00980936 | 1.18790989 |
|  | 45 | 1.96425427 | 1.73669295 | 0.94915509 | — | 0.18081184 | 1.96425427 |
|  | 60 | 1.93606536 | 1.71781388 | 1.00980936 | 0.18081184 | — | 1.93606536 |

Anti-Glare Surface Example

According to one or more embodiments, an anti-reflective coating is used in combination with an anti-glare (AG) surface. Anti-glare surface treatments can impact the performance of anti-reflective coatings. Thus, selection of the proper anti-glare surface can be important for optimal performance, particular in difficult use environments, such as vehicle interiors. In such environments, anti-glare surfaces on a cover glass needs to have the minimum sparkle and provide the appropriate anti-glare effect and tactile while meeting a required Contrast Ratio (CR) under sunlight. In this example, a sample was prepared with a chemically-etched Ultra-Low Sparkle (ULS) AG surface on a glass substrate made of Corning® Gorilla® Glass with an anti-reflective coating according to embodiments of this disclosure, and an easy-to-clean (ETC) coating to provide stable color appearance with wide-viewing angles. The ambient contrast performance was evaluated at a system level to gauge the impact of AG/AR coating on sunlight viewablity.

The anti-glare surface was prepared on a Corning® Gorilla® Glass substrate by using a chemical etching method that enable ultra-low sparkle performance suitable for high resolution display up to 300 PPI. Then, the anti-glare glass optical properties were analyzed, including SCE/SCI, transmission haze, gloss, distinctness of image (DOI), and sparkle. Further information regarding these properties and how these measurement are made can be found in (1) C. Li and T. Ishikawa, Effective Surface Treatment on the Cover Glass for Auto-Interior Applications, SID Symposium Digest of Technical Papers Volume 1, Issue 36.4, pp. 467 (2016); (2) J. Gollier, G. A. Piech, S. D. Hart, J. A. West, H. Hovagimian, E. M. Kosik Williams, A. Stillwell and J. Ferwerda, Display Sparkle Measurement and Human Response, SID Symposium Digest of Technical Papers Volume 44, Issue 1 (2013); and (3) J. Ferwerda, A. Stillwell, H. Hovagimian and E. M. Kosik Williams, Perception of sparkle in anti-glare display screen, Journal of the SID, Vol 22, Issue 2 (2014), the contents of which are incorporated herein by reference.

The balance of the five metrics of SCE/SCI, transmission haze, gloss, distinctness of image (DOI), and sparkle is important for maximizing the benefits of an anti-glare for display readability, tactility on the glass surface, and the aesthetic appearance of high-performance touch displays in applications such as vehicle interiors. The sparkle is a micro-scattering interaction of the anti-glare surface with LCD pixels to create bright spots degrading image quality, especially at high resolution. The sparkle effect was studied using the method of the Pixel Power Deviation with reference (PPDr) to examine the sparkle effect on different resolution displays. For example, ultra-low sparkle anti-glare glass with less than 1% PPDr will have invisible sparkle effect on a display of less than 300 pixels-per-inch (PPI). However, up to 4% PPDr may be acceptable depending on the contents of display, based on the end-users preference. In vehicular or automotive interior settings, about 120 to about 300 PPI is acceptable, and displays over 300 PPI have diminishing value.

Figure 13:
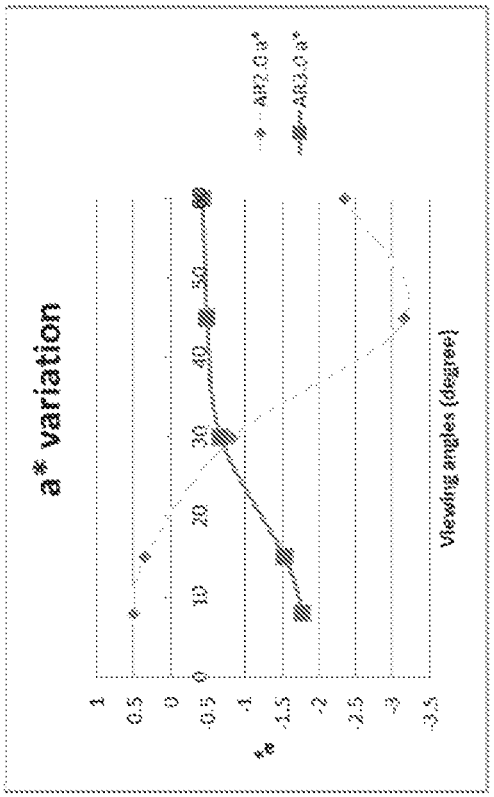
FIG. 13 is a graph of the photometric reflectance of anti-reflective coatings according to one or more embodiments.
Figure 14:
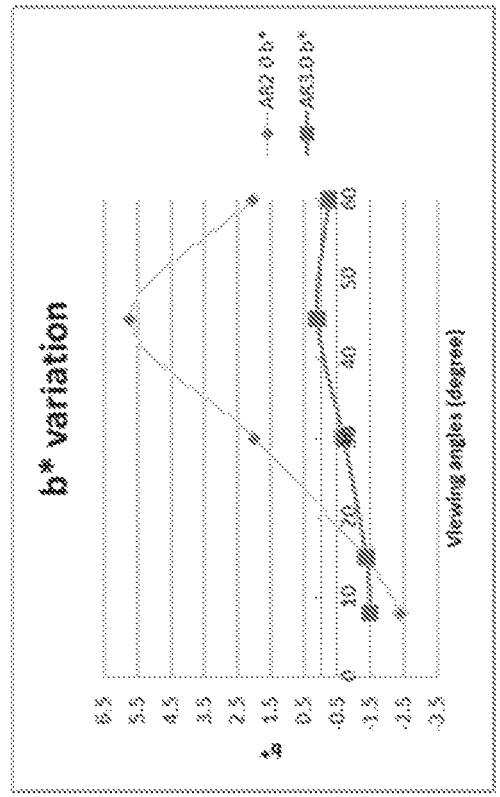
FIG. 14 is a graph of the color performance of anti-reflective coatings according to one or more embodiments.

FIGS. 13 and 14 show the calculated variation in a* and b* coordinates, respectively, as a function of viewing angle for two examples ("AR2.0" and "AR3.0") according to embodiments of the present disclosure. As shown in FIGS. 13 and 14, the reflectance stays below 1% from 0° to 40° with stable reflective color. At the system level, ambient contrast ratio (CR) is an important factor in readability. Bidirectional reflectance distribution function (BRDF) and reflectivity (SCI, SCE, and specular) measurements were made to give a comprehensive view of the properties of the glass surface with the anti-reflective coating. The scattering and reflection coefficient extracted from the measurements were put into a model to calculate the ambient contrast ratio assuming a display's attributes such as brightness (800 nits), reflectivity (2%), and scattering coefficient (0.0018) without screen contributions. Modeling showed that the anti-reflective coatings according to this disclosure will meet similar readability performance as other anti-reflective coatings, and this was confirmed with actual samples.

Figure 15:
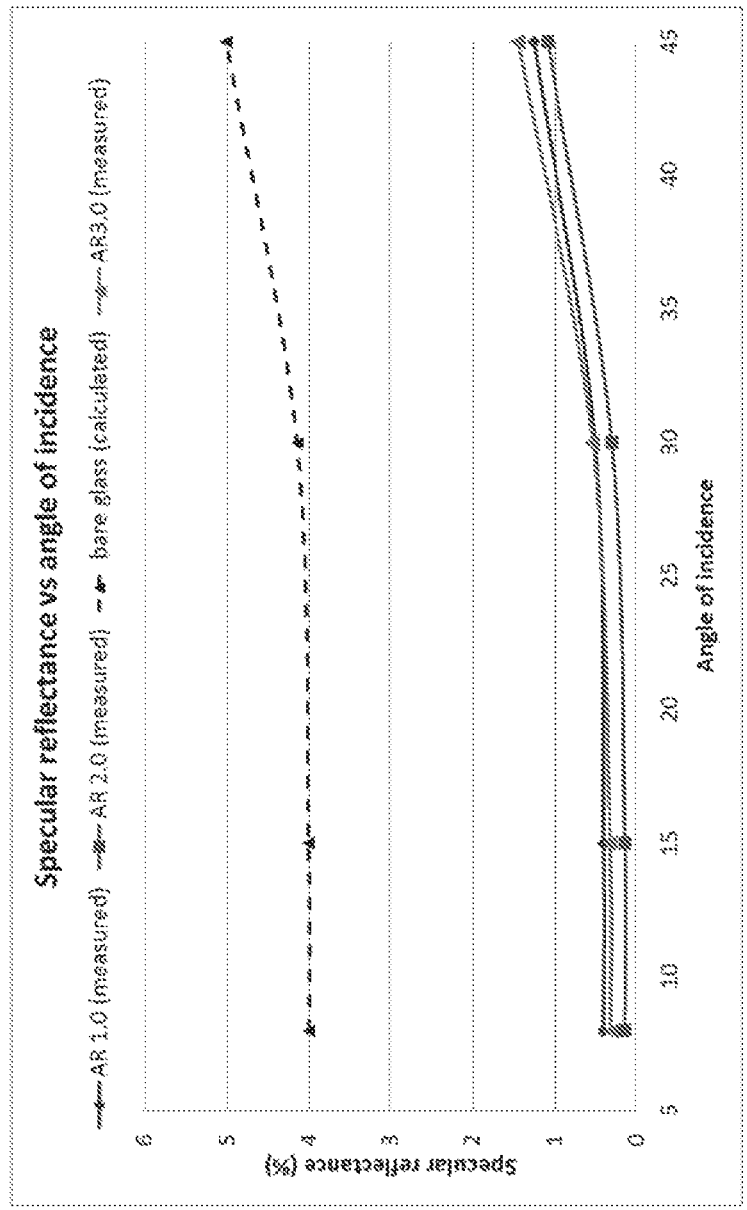
FIG. 15 is a graph of the specular reflectivity of anti-reflective coatings according to one or more embodiments.
Figure 16:
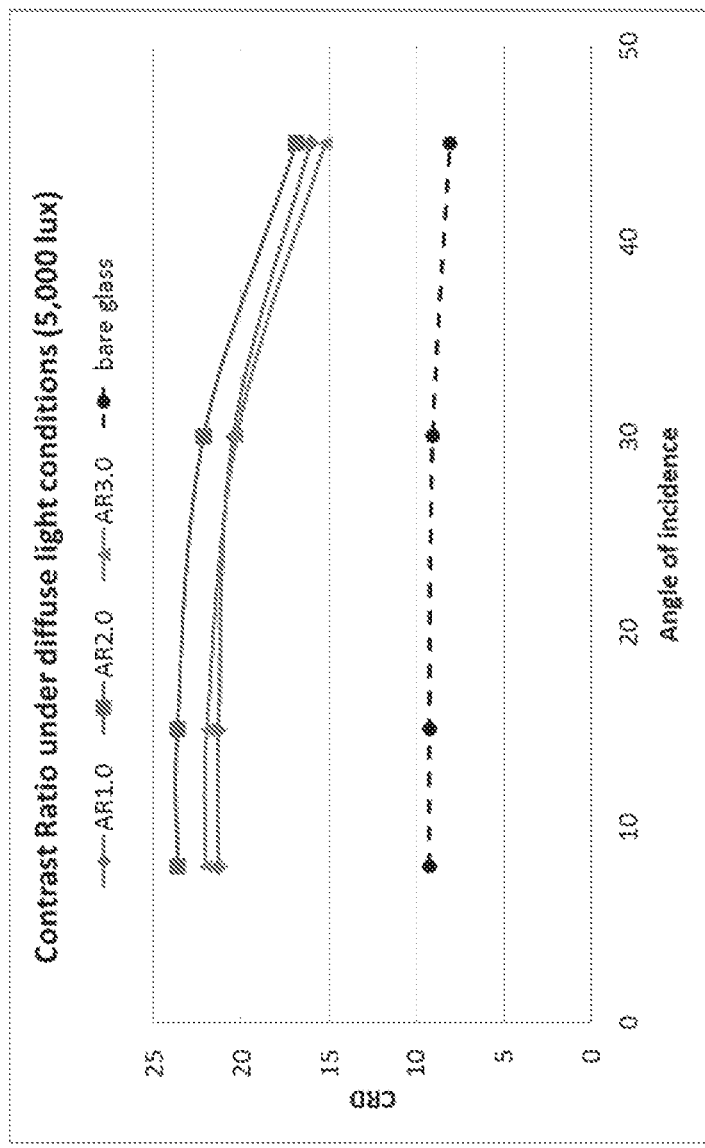
FIG. 16 is a graph of the contrast ratio for displays with anti-reflective coatings according to one or more embodiments.
Figure 17:
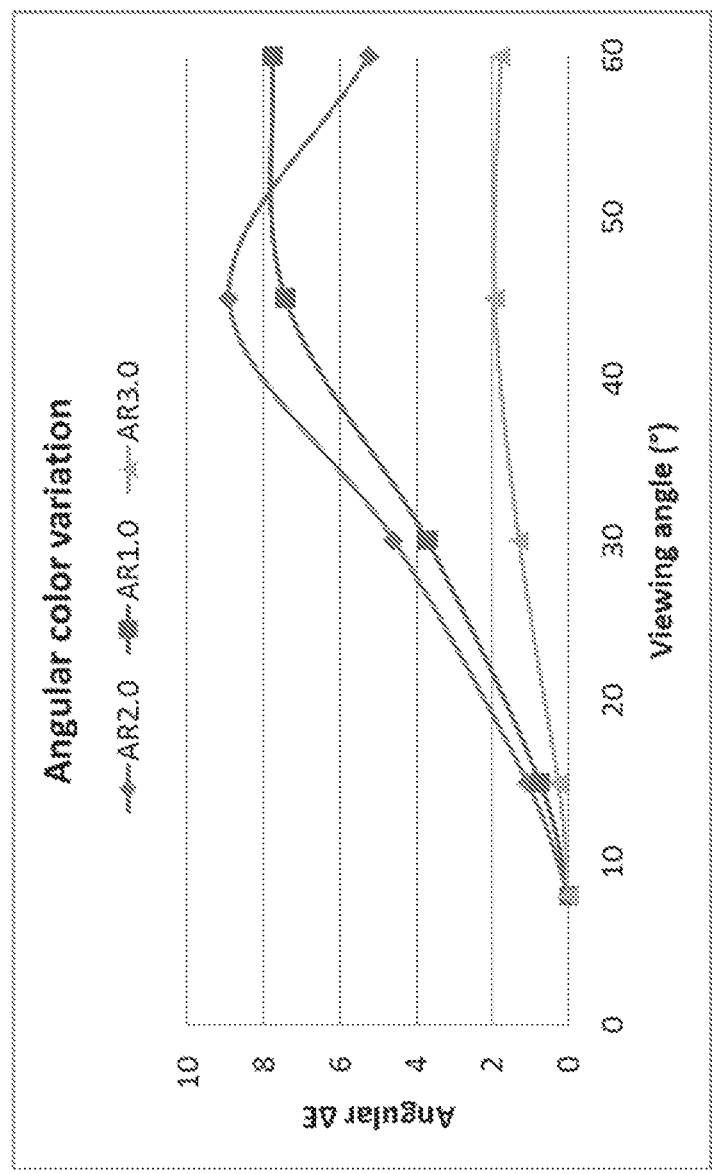
FIG. 17 is a graph of the angular color variation of anti-reflective coatings according to one or more embodiments.

As shown in FIG. 15, the specular reflectivity of two anti-reflective coatings according to one or more embodiments ("AR 1.0" and "AR2.0") and an anti-reflective coating according to one or more preferred embodiments ("AR3.0") is shown as a function of angle of incidence and is compared to the calculated data for the bare glass. Contrast ratio was measured under a condition in which no direct sunlight illuminating the display unit but a ghost reflected image reduces the readability of the content. This situation corresponds to the passenger's face being reflected in the center console (CC) of a vehicle or the driver's face being reflected to the instrument cluster (IC) of the vehicle in a clear sky day. FIG. 16 shows the contrast ratio for different viewing angles (AOV) or angle of incident (AOI) for image-forming rays. FIG. 16 demonstrates that contrast ratio in diffusive light (CRD) is not significantly reduced with AR3.0 as compared to AR2.0 (22 versus 23.5), but AR3.0 shows a great benefit with a significantly better color uniformity that AR2.0. It is noted that CRD is a relevant measurement for performance in vehicles, where ambient light is diffuse. FIG. 17 shows the angular color variation ($\Delta E_\theta$) from 8° to 60°, with $\theta_1$ equal to 8° and $\theta_2$ equal to 15°, 30°, 45°, and 60°. $\Delta E_\theta$ represents the distance between color coordinates at different angles, and smaller values of $\Delta E_\theta$ mean that the coating is more uniform in color when comparing different viewing angles. Thus, the objective of reducing $\Delta E_\theta$ is to achieve uniform appearance of the cover glass for different displays or surfaces in a vehicle like an instrument cluster (IC) at 0°-10° from the driver, a center console (CC) at 30°-45° from the driver, and a passenger-side display (PD) that can be seen at 60° from the driver's seat. Therefore, the significant gain on color uniformity quantified by $\Delta E_\theta$ outweighs the slight decrease of CRD (almost 4× improvement for color uniformity and only 7% decrease of CRD).

Additional examples of one or more embodiments were produced using a reactive sputtering coater. Exemplary embodiments of the anti-reflective coatings are described herein and provided below in Table 7, for example. Anti-reflective coating Examples 3-10 are inventive examples both having a buffer layer of silica (adjacent the substrate), followed by a $1^{st}$ $Nb_2O_5$ layer, a $1^{st}$ $SiO_2$ layer, a $2^{nd}$ $Nb_2O_5$ layer, and a $2^{nd}$ $SiO_2$ layer, in that order.

TABLE 7

Examples 3-10.

| | Thickness (nm) | | | | | | | |
|---|---|---|---|---|---|---|---|---|
| Examples | 3 | 4 | 5 | 6 | 7 | 8 | 9 | 10 |
| $SiO_2$ | 84.71 | 84.49 | 84.37 | 84.45 | 83.78 | 84.94 | 85.37 | 85.03 |
| $Nb_2O_5$ | 118.64 | 118.34 | 117.53 | 117.14 | 119.34 | 118.38 | 116.36 | 116.78 |
| SiO2 | 43.13 | 43.58 | 42.81 | 42.73 | 43.6 | 43.51 | 43.19 | 43.37 |
| Nb2O5 | 11.1 | 11.16 | 11.01 | 11.18 | 11.28 | 11.65 | 11.48 | 11.48 |
| Buffer Layer ($SiO_2$) | 25 | 25 | 25 | 25 | 25 | 25 | 25 | 25 |
| Substrate | Sub | Sub | Sub | Sub | Sub | Sub | Sub | Sub |

Examples 3-6 from Table 7 were analyzed for their optical performance in terms of first surface reflectance angular color shift from 0° to 60°, using a D65 CIE 1964 illuminant. $\theta_1=10°$ and $\theta_2$ was 15°, 30°, 45°, and 60°. The measured results are shown in Table 8.

TABLE 8

| | Example 3 | | | | | Example 4 | | | | |
|---|---|---|---|---|---|---|---|---|---|---|
| θ | $\theta_1$ | 15° | 30° | 45° | 60° | $\theta_1$ | 15° | 30° | 45° | 60° |
| L* | 3.72 | 3.77 | 4.99 | 11.62 | 26.54 | 3.77 | 3.84 | 5.13 | 11.76 | 26.63 |
| a* | −2.55 | −2.82 | −3.65 | −3.90 | −2.82 | −2.70 | −2.95 | −3.67 | −3.72 | −2.67 |
| b* | −3.32 | −3.04 | −2.38 | −2.03 | −1.62 | −3.48 | −3.12 | −2.66 | −2.30 | −1.72 |
| X | 0.33 | 0.33 | 0.43 | 1.16 | 4.46 | 0.33 | 0.33 | 0.45 | 1.18 | 4.50 |
| Y | 0.41 | 0.42 | 0.55 | 1.35 | 4.93 | 0.42 | 0.43 | 0.57 | 1.37 | 4.96 |

| | Example 5 | | | | | Example 6 | | | | |
|---|---|---|---|---|---|---|---|---|---|---|
| θ | $\theta_1$ | 15° | 30° | 45° | 60° | $\theta_1$ | 15° | 30° | 45° | 60° |
| L* | 3.28 | 3.28 | 4.32 | 10.92 | 26.10 | 3.30 | 3.28 | 4.33 | 10.96 | 26.16 |
| a* | −3.19 | −3.38 | −3.35 | −3.10 | −2.10 | −3.35 | −3.34 | −3.31 | −2.78 | −1.93 |
| b* | −2.40 | −2.12 | −2.02 | −2.10 | −1.59 | −2.43 | −2.24 | −2.15 | −2.35 | −1.68 |
| X | 0.27 | 0.26 | 0.37 | 1.09 | 4.38 | 0.27 | 0.26 | 0.37 | 1.11 | 4.41 |
| Y | 0.36 | 0.36 | 0.48 | 1.25 | 4.78 | 0.37 | 0.36 | 0.48 | 1.26 | 4.80 |

| | Example 7 | | | | | Example 8 | | | | |
|---|---|---|---|---|---|---|---|---|---|---|
| θ | $\theta_1$ | 15° | 30° | 45° | 60° | $\theta_1$ | 15° | 30° | 45° | 60° |
| L* | 3.32 | 3.32 | 4.21 | 10.65 | 25.98 | 2.77 | 2.69 | 3.48 | 10.00 | 25.64 |
| a* | −2.90 | −2.94 | −2.96 | −2.76 | −2.00 | −3.49 | −3.30 | −2.37 | −1.42 | −1.10 |
| b* | −3.51 | −3.40 | −2.85 | −2.40 | −1.57 | −2.24 | −2.12 | −2.17 | −2.18 | −1.36 |
| X | 0.28 | 0.28 | 0.37 | 1.07 | 4.35 | 0.21 | 0.20 | 0.31 | 1.03 | 4.30 |
| Y | 0.37 | 0.37 | 0.47 | 1.21 | 4.74 | 0.31 | 0.30 | 0.38 | 1.13 | 4.62 |

TABLE 8-continued

| | Example 10 | | | | |
|---|---|---|---|---|---|
| θ | $\theta_1$ | 15° | 30° | 45° | 60° |
| L* | 2.91 | 2.87 | 3.70 | 10.36 | 25.88 |
| a* | −3.04 | −3.07 | −2.24 | −1.31 | −1.10 |
| b* | −3.14 | −2.81 | −2.69 | −2.65 | −1.49 |
| X | 0.23 | 0.23 | 0.33 | 1.08 | 4.38 |
| Y | 0.32 | 0.32 | 0.41 | 1.17 | 4.71 |

A second aspect of this disclosure pertains to a method for forming the articles described herein. In one embodiment, the method includes providing a substrate having a major surface in a coating chamber, forming a vacuum in the coating chamber, forming an optical coating as described herein on the major surface, optionally forming an additional coating comprising at least one of an easy-to-clean coating and a scratch resistant coating, on the optical coating, and removing the substrate from the coating chamber. In one or more embodiments, the optical coating and the additional coating are formed in either the same coating chamber or without breaking vacuum in separate coating chambers.

In one or more embodiments, the method may include loading the substrate on carriers which are then used to move the substrate in and out of different coating chambers, under load lock conditions so that a vacuum is preserved as the substrate is moved.

The anti-reflective coating 120 and/or the additional coating 140 may be formed using various deposition methods such as vacuum deposition techniques, for example, chemical vapor deposition (e.g., plasma enhanced chemical vapor deposition (PECVD), low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. Liquid-based methods may also be used such as spraying, dipping, spin coating, or slot coating (for example, using sol-gel materials). Where vacuum deposition is utilized, inline processes may be used to form the anti-reflective coating 120 and/or the additional coating 131 in one deposition run. In some instances, the vacuum deposition can be made by a linear PECVD source.

In some embodiments, the method may include controlling the thickness of the anti-reflective coating 120 and/or the additional coating 131 so that it does not vary by more than about 4% along at least about 80% of the area of the anti-reflective surface 122 or from the target thickness for each layer at any point along the substrate area. In some embodiments, the thickness of the anti-reflective coating 120 and/or the additional coating 131 so that it does not vary by more than about 4% along at least about 95% of the area of the anti-reflective surface 122.

Aspect (1) of this disclosure pertains to an article comprising: a substrate comprising a first major surface and a second major surface opposite the first major surface and separated from the first side by a thickness of the substrate; and an anti-reflective coating disposed on the first major surface and comprising a reflective surface opposite the first major surface, wherein at a point on the reflective surface comprising the anti-reflective coating, the article comprises a single-surface reflectance under a D65 illuminant having an angular color variation, $\Delta E_\theta$, defined as: $\Delta E_\theta \sqrt{\{(a^*_{\theta 1} - a^*_{\theta 2})^2 + (b^*_{\theta 1} - b^*_{\theta 2})^2\}}$ where $a^*\theta 1$ and $b^*\theta 1$ are $a^*$ and $b^*$ values of the point measured from a first angle θ1, and $a^*\theta 2$ and $b^*\theta 2$ are $a^*$ and $b^*$ values of the point measured from a second angle θ2, θ1 and θ2 being any two different viewing angles at least 5 degrees apart in a range from about 10° to about 60° relative to a normal vector of the reflective surface, and wherein $\Delta E\theta$ is less than 5.

Aspect (2) of this disclosure pertains to the article of Aspect (1), wherein the reflective surface comprises a single-sided reflected color with an a* value from about −2 to about 1, and a b* value from about −4 to about 1 at a viewing angle in a range from about 10° to about 60°, or at all viewing angels in a range from about 10° to about 60°.

Aspect (3) of this disclosure pertains to the article of Aspect (1) or Aspect (2), wherein the reflective surface comprises a single-side reflected color with an a* value from about −2 to about 0, and a b* value from about −4 to about −1 at a viewing angle of about 10°.

Aspect (4) of this disclosure pertains to the article of any one of Aspects (1) through (3), wherein the reflective surface comprises a single-sided reflected color with an a* value from about −1 to about 1, and a b* value from about −2 to about 1 at a viewing angle of about 60°.

Aspect (5) of this disclosure pertains to the article of any one of Aspects (2) through (4), wherein the reflective surface comprises a single-sided reflected color with an a* value from about −2 to about 1, and a b* value from about −4 to about 1 at all viewing angles from about 10° and to about 60°.

Aspect (6) of this disclosure pertains to the article of any one of Aspects (1) through (5), wherein $\theta_1$ and $\theta_2$ are any two different viewing angles in a range from about 10° to about 50°, from about 10° to about 40°, from about 10° to about 30°, from about 10° to about 20°, from about 20° to about 60°, from about 30° to about 60°, from about 40° to about 60°, or from about 50° to about 60°.

Aspect (7) of this disclosure pertains to the article of any one of Aspects (1) through (5), wherein $\theta_1$ and $\theta_2$ are any two different viewing angles in a range from about 20° to about 30°, from about 30° to about 40°, or from about 40° to about 50°.

Aspect (8) of this disclosure pertains to the article of any one of Aspects (1) through (7), wherein the anti-reflective coating comprises a stack of alternating high- and low-index materials.

Aspect (9) of this disclosure pertains to the article of Aspect (8), wherein the low index material comprises a refractive index in a range from about 1.3 to about 1.7, and the high index material comprises a refractive index in a range from about 1.7 to about 2.5.

Aspect (10) of this disclosure pertains to the article of Aspect (9), wherein the low index material comprises silica (SiO2) and the high index material comprises niobium oxide (Nb2O5) or titanium oxide (TiOn).

Aspect (11) of this disclosure pertains to the article of any one of Aspects (8) through (10), wherein the stack comprises four layers.

Aspect (12) of this disclosure pertains to the article of any one of Aspects (8) through (11), the anti-reflective coating further comprising a buffer layer, wherein the stack is disposed on the buffer layer.

Aspect (13) of this disclosure pertains to the article of Aspect (12), wherein the buffer layer comprises silica.

Aspect (14) of this disclosure pertains to the article of Aspect (12) or Aspect (13), wherein the buffer layer comprises a thickness in a range from about 20 nm to about 30 nm.

Aspect (15) of this disclosure pertains to the article of any one of Aspects (1) through (14), wherein the anti-reflective coating comprises a stack comprising a first niobium oxide (Nb2O5) layer disposed on the substrate, a first silica (SiO2) layer disposed on the first niobium oxide layer, a second niobium oxide (Nb2O5) layer disposed on the first silica layer, and a second silica (SiO2) layer disposed on the second niobium oxide layer.

Aspect (16) of this disclosure pertains to the article of Aspect (15), wherein the first niobium oxide layer has a thickness that is less than the second niobium oxide layer.

Aspect (17) of this disclosure pertains to the article of Aspect (15) or Aspect (16), wherein the first silica layer has a thickness that is less than the second silica layer.

Aspect (18) of this disclosure pertains to the article of any one of Aspects (15) through (17), wherein the first niobium oxide layer has a thickness from about 11 nm to about 13 nm.

Aspect (19) of this disclosure pertains to the article of Aspect (18), wherein the first niobium oxide layer has a thickness from about 11 nm to about 12 nm.

Aspect (20) of this disclosure pertains to the article of any one of Aspects (15) through (19), wherein the first silica layer has a thickness from about 40 nm to about 45 nm.

Aspect (21) of this disclosure pertains to the article of Aspect (20), wherein the first silica layer has a thickness from about 41 nm to about 44 nm.

Aspect (22) of this disclosure pertains to the article of any one of Aspects (15) through (21), wherein the second niobium oxide layer has a thickness from about 115 nm to about 125 nm.

Aspect (23) of this disclosure pertains to the article of Aspect (22), wherein the second niobium oxide layer has a thickness from about 116 nm to about 121 nm.

Aspect (24) of this disclosure pertains to the article of Aspect (23), wherein the second niobium oxide layer has a thickness from about 118 nm to about 120 nm.

Aspect (25) of this disclosure pertains to the article of any one of Aspects (15) through (24), wherein the second silica layer has a thickness from about 80 nm to about 88 nm.

Aspect (26) of this disclosure pertains to the article of Aspect (25), wherein the second silica layer has a thickness from about 83 nm to about 86 nm.

Aspect (27) of this disclosure pertains to the article of Aspect (15), wherein the first niobium oxide layer has a thickness of 12.4 nm, the first silica layer has a thickness of 40.4 nm, the second niobium oxide layer has a thickness of 116 nm, and the second silica layer has a thickness of 83.8 nm.

Aspect (28) of this disclosure pertains to the article of Aspect (15), wherein the first niobium oxide layer has a thickness of 11.9 nm, the first silica layer has a thickness of 40.4 nm, the second niobium oxide layer has a thickness of 116.8 nm, and the second silica layer has a thickness of 80.8 nm.

Aspect (29) of this disclosure pertains to the article of Aspect (27) or Aspect (28), further comprising a buffer layer having a thickness in a range from about 20 nm to about 30 nm.

Aspect (30) of this disclosure pertains to the article of any one of Aspects (15) through (29), wherein the stack further comprises additional layers of niobium oxide and silica in an alternating arrangement disposed on the second layer of silica.

Aspect (31) of this disclosure pertains to the article of any one of Aspects (1) through (30), wherein a variation in a thickness of any layer in the anti-reflective coating is +/−2% or less of the thickness.

Aspect (32) of this disclosure pertains to the article of Aspect (31), wherein a variation in a thickness of each layer in the anti-reflective coating is +/−2% of the thickness.

Aspect (33) of this disclosure pertains to the article of any one of Aspects (1) through (32), wherein the article further comprises a functional layer disposed on a top layer of the stack.

Aspect (34) of this disclosure pertains to the article of Aspect (33), wherein the functional layer is at least one of an easy-to-clean layer and an anti-fingerprint layer.

Aspect (35) of this disclosure pertains to the article of any one of Aspects (1) through (34), wherein the article has a width greater than or equal to 600 mm.

Aspect (36) of this disclosure pertains to the article of any one of Aspects (1) through (35), further comprising a decorative layer on at least one of the first major surface and second major surface of the substrate.

Aspect (37) of this disclosure pertains to the article of Aspect (36), wherein the decorative layer comprises a coating including ink or pigment.

Aspect (38) of this disclosure pertains to the article of any one of Aspects (1) through (37), wherein the first major surface or the second major surface of the substrate comprises an anti-glare surface.

Aspect (39) of this disclosure pertains to the article of Aspect (38), wherein the anti-glare surface is an etched region in the first major surface or the second major surface of the substrate or a film disposed on the first major surface.

Aspect (40) of this disclosure pertains to the article of Aspect (38) or Aspect (39), wherein the anti-glare surface is disposed on the first major surface of the substrate, and the anti-reflective coating is disposed on the anti-glare surface.

Aspect (41) of this disclosure pertains to the article of any one of Aspects (38) through (40), wherein the anti-glare surface comprises a micro-textured surface, the micro-textured surface comprising a flat-bottom valley structure.

Aspect (42) of this disclosure pertains to the article of Aspect (41), wherein the flat-bottom valley structure comprises a bottom surface with raised portions on at least two sides of the bottom surface.

Aspect (43) of this disclosure pertains to the article of Aspect (42), wherein the bottom surface comprises a region that is substantially flat over an average diameter of about 1 μm, or from about 0.5 μm to about 1 μm.

Aspect (44) of this disclosure pertains to the article of Aspect (42) or Aspect (43)

The article of claim 42 or claim 43 wherein an average distance between peaks of the raised portions is less than 10 μm.

Aspect (45) of this disclosure pertains to the article of any one of Aspects (38) through (44), wherein an ambient contrast ratio of the substrate with the anti-glare surface and the anti-reflective coating is greater than or equal to 5.

Aspect (46) of this disclosure pertains to the article of Aspect (45), wherein the ambient contrast ratio of the substrate with the anti-glare surface and the anti-reflective coating is 5.1.

Aspect (47) of this disclosure pertains to the article of any one of Aspects (38) through (46), wherein a ghost image reduction of the substrate with the anti-glare surface and the anti-reflective coating is greater than or equal to 30.

Aspect (48) of this disclosure pertains to the article of Aspect (47), wherein the ghost image reduction of the glass sheet with the anti-glare surface and the anti-reflective coating is 31.

Aspect (49) of this disclosure pertains to the article of any one of Aspects (38) through (48), wherein a color uniformity ($\Delta E/deg$) of the substrate with the anti-glare surface and the anti-reflective coating is greater than or equal to 2.

Aspect (50) of this disclosure pertains to the article of Aspect (49), wherein the color uniformity ($\Delta E/deg$) of the reflective surface with the anti-glare surface and the anti-reflective coating is 2.6.

Aspect (51) of this disclosure pertains to the article of any one of Aspects (1) through (50), wherein the first major surface of the substrate and the reflective surface is complexly curved.

Aspect (52) of this disclosure pertains to the article of any one of Aspects (1) through (51), further comprising: a base having a non-planar support surface, the substrate being disposed on the base with the second major surface of the substrate facing the non-planar support surface.

Aspect (53) of this disclosure pertains to the article of Aspect (52), wherein the substrate is cold-formed onto the non-planar support surface.

Aspect (54) of this disclosure pertains to the article of Aspect (52) or Aspect (53), wherein the non-planar support surface has a curved surface with a radius of curvature greater than or equal to 50 mm, greater than or equal to 100 mm, or greater than or equal to 500 mm.

Aspect (55) of this disclosure pertains to the article of any one of Aspects (1) through (54), wherein $\Delta E\theta$ is less than 4, or less than 3, or less than 2.

Aspect (56) of this disclosure pertains to the article of any one of Aspects (1) through (55), wherein $\Delta E\theta$ is less than or equal to about 1.7, less than or equal to about 1.5, less than or equal to about 1.4, or less than or equal to about 1.2 for any two values of $\theta 1$ and $\theta 2$ in a range from about 10° to about 30° that differ from one another.

Aspect (57) of this disclosure pertains to the article of any one of Aspects (1) through (56), wherein $\Delta E\theta$ is less than or equal to about 2.9, less than or equal to about 2.6, less than or equal to about 2.5, less than or equal to about 2.4, less than or equal to about 2.3, less than or equal to about 2.1, less than or equal to about 2.0, less than or equal to about 1.9, or less than or equal to about 1.8 for any two values of $\theta 1$ and $\theta 2$ in a range from about 15° to about 45° that differ from one another.

Aspect (58) of this disclosure pertains to the article of any one of Aspects (1) through (57), wherein $\Delta E\theta$ is less than or equal to about 1.0, less than or equal to about 0.8, less than or equal to about 0.7, less than or equal to about 0.6, less than or equal to about 0.5, or less than or equal to about 0.2 for any two values of $\theta 1$ and $\theta 2$ in a range from about 45° to about 60° that differ from one another.

Aspect (59) of this disclosure pertains to a vehicle comprising the article of any one of Aspects (1) through (58).

Aspect (60) pertains to the vehicle of Aspect (59), wherein the article is a vehicle interior surface.

Aspect (61) pertains to the vehicle of Aspect (59) or Aspect (60), wherein the article composes at least part of a dashboard, an instrument panel, a control panel, a center console, a steering wheel, a side door component, an entertainment unit, or a graphical or video display.

Aspect (62) pertains to the vehicle of any one of Aspects (59) through (61), wherein any two points on the reflective surface of the substrate comprising the anti-reflective coating have the same angular color variation, $\Delta E\theta$.

Aspect (63) pertains to an anti-reflective coating comprising a stack of alternating high- and low-index materials, the anti-reflective coating including reflective surface configured to face an observer, wherein at a point on the reflective surface, the anti-reflective coating comprises a single-surface reflectance under a D65 illuminant having an angular color variation, $\Delta E\theta$, defined as: $\Delta E\theta=\sqrt{\{(a^*_{\theta 1}-a^*_{\theta 2})^2+(b^*_{\theta 1}-b^*_{\theta 2})^2\}}$, where $a^*\theta 1$ and $b^*\theta 1$ are $a^*$ and $b^*$ values of the point measured from a first angle $\theta 1$, and $a^*\theta 2$ and $b^*\theta 2$ are $a^*$ and $b^*$ values of the point measured from a second angle $\theta 2$, $\theta 1$ and $\theta_2$ being any two different viewing angles at least 5 degrees apart in a range from about 10° to about 60° relative to a normal vector of the top side, and wherein $\Delta E\theta$ is less than 5.

Aspect (64) pertains to the anti-reflective coating of Aspect (63), wherein the reflective surface comprises a single-sided reflected color with an $a^*$ value from about −2 to about 1, and a $b^*$ value from about −4 to about 1 at a viewing angle in a range from about 10° to about 60°, or at all viewing angles in a range from about 10° to about 60°.

Aspect (65) pertains to the anti-reflective coating of Aspect (64), wherein the reflective surface comprises a single-side reflected color with an $a^*$ value from about −2 to about 0, and a $b^*$ value from about −4 to about −1 at a viewing angle of about 10°.

Aspect (66) pertains to the anti-reflective coating of any one of Aspects (63) through (65), wherein the reflective surface comprises a single-sided reflected color with an $a^*$ value from about −1 to about 1, and a $b^*$ value from about −2 to about 1 at a viewing angle of about 60°.

Aspect (67) pertains to the anti-reflective coating of any one of Aspects (63) through (66), wherein the reflective surface comprises a single-sided reflected color with an $a^*$ value from about −2 to about 1, and a $b^*$ value from about −4 to about 1 at all viewing angles from about 10° and to about 60°.

Aspect (68) pertains to the anti-reflective coating of any one of Aspects (63) through (67), wherein $\theta 1$ and $\theta 2$ are any two different viewing angles in a range from about 10° to about 50°, from about 10° to about 40°, from about 10° to about 30°, from about 10° to about 20°, from about 20° to about 60°, from about 30° to about 60°, from about 40° to about 60°, or from about 50° to about 60°.

Aspect (69) pertains to the anti-reflective coating of any one of Aspects (63) through (67), wherein $\theta 1$ and $\theta 2$ are any two different viewing angles in a range from about 20° to about 30°, from about 30° to about 40°, or from about 40° to about 50°.

Aspect (70) pertains to the anti-reflective coating of any one of Aspects (63) through (69), wherein the low index material comprises a refractive index in a range from about 1.3 to about 1.7, and the high index material comprises a refractive index in a range from about 1.7 to about 2.5

Aspect (71) pertains to the anti-reflective coating of Aspect (70), wherein the stack comprises alternating layers of silica ($SiO_2$) and niobium oxide ($Nb_2O_5$).

Aspect (72) pertains to the anti-reflective coating of any one of Aspects (63) through (71), wherein the stack comprises four layers.

Aspect (73) pertains to the anti-reflective coating of any one of Aspects (63) through (72), the anti-reflective coating further comprising a buffer layer, the stack being disposed on the buffer layer.

Aspect (74) pertains to the anti-reflective coating of Aspect (73), wherein the buffer layer comprises silica.

Aspect (75) pertains to the anti-reflective coating of Aspect (73) or Aspect (74), wherein the buffer layer comprises a thickness in a range from about 20 nm to about 30 nm.

Aspect (76) pertains to the anti-reflective coating of any one of Aspects (63) through (75), wherein the anti-reflective coating comprises a silica buffer layer and a stack comprising a first niobium oxide (Nb2O5) layer disposed on the buffer layer, a first silica (SiO2) layer disposed on the first niobium oxide layer, a second niobium oxide (Nb2O5) layer disposed on the first silica layer, and a second silica (SiO2) layer disposed on the second niobium oxide layer.

Aspect (77) pertains to the anti-reflective coating of Aspect (76), wherein the first niobium oxide layer has a thickness that is less than the second niobium oxide layer.

Aspect (78) pertains to the anti-reflective coating of Aspect (76) or Aspect (77), wherein the first silica layer has a thickness that is less than the second silica layer.

Aspect (79) pertains to the anti-reflective coating of any one of Aspects (76) through (78), wherein the first niobium oxide layer of has a thickness from about 11 nm to about 13 nm.

Aspect (80) pertains to the anti-reflective coating of Aspect (79), wherein the first niobium oxide layer has a thickness from about 11 nm to about 12 nm.

Aspect (81) pertains to the anti-reflective coating of any one of Aspects (76) through (80), wherein the first silica layer has a thickness from about 40 nm to about 45 nm.

Aspect (82) pertains to the anti-reflective coating of Aspect (81), wherein the first silica layer has a thickness from about 41 nm to about 44 nm.

Aspect (83) pertains to the anti-reflective coating of any one of Aspects (76) through (82), wherein the second niobium oxide layer has a thickness from about 115 nm to about 125 nm.

Aspect (84) pertains to the anti-reflective coating of Aspect (83), wherein the second niobium oxide layer has a thickness from about 116 nm to about 121 nm.

Aspect (85) pertains to the anti-reflective coating of Aspect (84), wherein the second niobium oxide layer has a thickness from about 118 nm to about 120 nm.

Aspect (86) pertains to the anti-reflective coating of any one of Aspects (76) through (85), wherein the second silica layer has a thickness from about 80 nm to about 88 nm.

Aspect (87) pertains to the anti-reflective coating of Aspect (86), wherein the second silica layer has a thickness from about 83 nm to about 86 nm.

Aspect (88) pertains to the anti-reflective coating of Aspect (76), wherein the first niobium oxide layer has a thickness of 12.4 nm, the first silica layer has a thickness of 40.4 nm, the second niobium oxide layer has a thickness of 116 nm, and the second silica layer has a thickness of 83.8 nm.

Aspect (89) pertains to the anti-reflective coating of Aspect (76), wherein the first niobium oxide layer has a thickness of 11.9 nm, the first silica layer has a thickness of 40.4 nm, the second niobium oxide layer has a thickness of 116.8 nm, and the second silica layer has a thickness of 80.8 nm.

Aspect (90) pertains to the anti-reflective coating of Aspect (88) or Aspect (89), wherein the silica buffer layer has a thickness in a range from about 20 nm to about 30 nm.

Aspect (91) pertains to the anti-reflective coating of any one of Aspects (76) through (90), wherein the stack further comprises additional layers of niobium oxide and silica in an alternating arrangement disposed on the second layer of silica.

Aspect (92) pertains to the anti-reflective coating of any one of Aspects (63) through (91), wherein a variation in a thickness of any layer in the anti-reflective coating is +/−2% of the thickness.

Aspect (93) pertains to the anti-reflective coating of Aspect (92), wherein a variation in a thickness of each layer in the anti-reflective coating is +/−2% of the thickness.

Aspect (94) pertains to the anti-reflective coating of any one of Aspects (63) through (93), wherein the reflective surface has a width greater than or equal to 600 mm.

Aspect (95) pertains to the anti-reflective coating of any one of Aspects (63) through (94), wherein $\Delta E\theta$ is less than 4, or less than 3, or less than 2.

Aspect (96) pertains to the anti-reflective coating of any one of Aspects (63) through (95), wherein $\Delta E\theta$ is less than or equal to about 1.7, less than or equal to about 1.5, less than or equal to about 1.4, or less than or equal to about 1.2 for any two values of $\theta 1$ and $\theta 2$ in a range from about 10° to about 30° that differ from one another.

Aspect (97) pertains to the anti-reflective coating of any one of Aspects (63) through (96), wherein $\Delta E\theta$ is less than or equal to about 2.9, less than or equal to about 2.6, less than or equal to about 2.5, less than or equal to about 2.4, less than or equal to about 2.3, less than or equal to about 2.1, less than or equal to about 2.0, less than or equal to about 1.9, or less than or equal to about 1.8 for any two values of $\theta 1$ and $\theta 2$ in a range from about 15° to about 45° that differ from one another.

Aspect (98) pertains to the anti-reflective coating of any one of Aspects (63) through (97), wherein $\Delta E\theta$ is less than or equal to about 1.0, less than or equal to about 0.8, less than or equal to about 0.7, less than or equal to about 0.6, less than or equal to about 0.5, or less than or equal to about 0.2 for any two values of $\theta 1$ and $\theta 2$ in a range from about 45° to about 60° that differ from one another.

Aspect (99) pertains to a method of producing an anti-reflective coating, comprising: providing a substrate comprising a first major surface; depositing an anti-reflective coating on the first major surface, the anti-reflective coating comprising a stack with a reflective surface opposite to the first major surface and alternating layers of silica (SiO2) and niobium oxide (Nb2O5), wherein at a point on the reflective surface, the anti-reflective coating comprises a single-surface reflectance under a D65 illuminant having an angular color variation, $\Delta E\theta$, defined as: $\Delta E\theta = \sqrt{(a*\theta 1 - a*\theta 2)2 + (b*\theta 1 - b*\theta 2)2}$, where $a*\theta 1$ and $b*\theta 1$ are $a*$ and $b*$ values of the point measured from a first angle $\theta 1$, and $a*\theta 2$ and $b*\theta 2$ are $a*$ and $b*$ values of the point measured from a second angle $\theta 2$, $\theta 1$ and $\theta 2$ being any two different viewing angles at least 5 degrees apart in a range from about 10° to about 60° relative to a normal vector of the first major surface, and wherein $\Delta E\theta$ is less than 5.

Aspect (100) pertains to the method of Aspect (99), wherein the anti-reflective coating further comprises a buffer layer disposed on the first major surface between the stack and the first major surface.

Aspect (101) pertains to the method of Aspect (99) or Aspect (100), wherein the reflective surface comprises a single-sided reflected color with an a* value from about −2 to about 1, and a b* value from about −4 to about 1 at a range from about 10° to about 60°, or at all viewing angles in a range from about 10° and to about 60°.

Aspect (102) pertains to the method of any one of Aspects (99) through (101), wherein the reflective surface comprises a single-side reflected color with an a* value from about −2 to about 0, and a b* value from about −4 to about −1 at a viewing angle of about 10°.

Aspect (103) pertains to the method of any one of Aspects (99) through (102), wherein the reflective surface comprises a single-sided reflected color with an a* value from about −1 to about 1, and a b* value from about −2 to about 1 at a viewing angle of about 60°.

Aspect (104) pertains to the method of any one of Aspects (99) through (103), wherein the reflective surface comprises a single-sided reflected color with an a* value from about −2 to about 1, and a b* value from about −4 to about 1 at all viewing angles from about 10° and to about 60°.

Aspect (105) pertains to the method of any one of Aspects (99) through (104), wherein θ1 and θ2 are any two different viewing angles in a range from about 10° to about 50°, from about 10° to about 40°, from about 10° to about 30°, from about 10° to about 20°, from about 20° to about 60°, from about 30° to about 60°, from about 40° to about 60°, or from about 50° to about 60°.

Aspect (106) pertains to the method of any one of Aspects (99) through (105), wherein θ1 and θ2 are any two different viewing angles in a range from about 20° to about 30°, from about 30° to about 40°, or from about 40° to about 50°.

Aspect (107) pertains to the method of any one of Aspects (99) through (106), wherein the alternating layers of silica and niobium oxide comprise: a first niobium oxide layer disposed on the buffer layer; a first silica layer disposed on the first niobium oxide layer; a second niobium oxide layer disposed on the first silica layer; and a second silica layer disposed on the second niobium oxide layer.

Aspect (108) pertains to the method of Aspect (107), wherein depositing the anti-reflective coating comprises: depositing the first niobium oxide layer on the buffer layer; depositing the first silica layer on the first niobium oxide layer; depositing the second niobium oxide layer on the first silica layer; and depositing the second silica layer disposed on the second niobium oxide layer.

Aspect (109) pertains to the method of Aspect (107) or Aspect (108), wherein the first niobium oxide layer has a thickness that is less than the second niobium oxide layer.

Aspect (110) pertains to the method of any one of Aspects (107) through (109), wherein the first silica layer has a thickness that is less than the second silica layer.

Aspect (111) pertains to the method of any one of Aspects (107) through (110), wherein the first niobium oxide layer has a thickness from about 11 nm to about 13 nm.

Aspect (112) pertains to the method of Aspect (111), wherein the first niobium oxide layer has a thickness from about 11 nm to about 12 nm.

Aspect (113) pertains to the method of any one of Aspects (107) through (112), wherein the first silica layer has a thickness from about 40 nm to about 45 nm.

Aspect (114) pertains to the method of Aspect (113), wherein the thickness of the first silica layer is 40.4 nm.

Aspect (115) pertains to the method of any one of Aspects (107) through (114), wherein the second niobium oxide layer has a thickness from about 115 nm to about 125 nm.

Aspect (116) pertains to the method of Aspect (115), wherein the second niobium oxide layer has a thickness from about 116 nm to about 121 nm.

Aspect (117) pertains to the method of Aspect (116), wherein the second niobium oxide layer has a thickness from about 118 nm to about 120 nm Aspect (118) pertains to the method of any one of Aspects (107) through (117), wherein the second silica layer has a thickness from about 80 nm to about 88 nm.

Aspect (119) pertains to the method of Aspect (118), wherein the second silica layer has a thickness from about 83 nm to about 86 nm.

Aspect (120) pertains to the method of Aspect (107), wherein the first niobium oxide layer has a thickness of 12.4 nm, the first silica layer has a thickness of 40.4 nm, the second niobium oxide layer has a thickness of 116 nm, and the second silica layer has a thickness of 83.8 nm.

Aspect (121) pertains to the method of Aspect (107), wherein the first niobium oxide layer has a thickness of 11.9 nm, the first silica layer has a thickness of 40.4 nm, the second niobium oxide layer has a thickness of 116.8 nm, and the second silica layer has a thickness of 80.8 nm.

Aspect (122) pertains to the method of any one of Aspects (100) through (121), wherein the buffer layer has a thickness in a range from about 20 nm to about 30 nm.

Aspect (123) pertains to the method of any one of Aspects (100) through (122), wherein the buffer layer is silica.

Aspect (124) pertains to the method of any one of Aspects (100) through (123), wherein a variation in thickness of each of the first and second silica layers, and the first and second niobium oxide layers is within +/−2% of the thickness.

Aspect (125) pertains to the method of any one of Aspects (100) through (124), wherein the stack comprises four layers.

Aspect (126) pertains to the method of any one of Aspects (99) through (125), wherein the substrate is a glass sheet comprising the first major surface, a second major surface opposite the first major surface, and a minor surface separating the first and second major surfaces.

Aspect (127) pertains to the method of Aspect (126), further comprising, prior to depositing the anti-reflective coating, forming an anti-glare surface on the first major surface of the glass sheet, wherein the anti-reflective surface is deposited on the anti-glare surface.

Aspect (128) pertains to the method of Aspect (127), wherein forming the anti-glare surface comprises etching at least a portion of the first major surface.

Aspect (129) pertains to the method of Aspect (127) or Aspect (128), wherein the anti-glare surface comprises a micro-textured surface, the micro-textured surface comprising a flat-bottom valley structure.

Aspect (130) pertains to the method of Aspect (129), wherein the bottom surface comprises a region that is substantially flat over an average diameter of about 1 μm.

Aspect (131) pertains to the method of Aspect (129) or Aspect (130), wherein an average distance between peaks of the raised portions is about 2 μm.

Aspect (132) pertains to the method of any one of Aspects (127) through (131), wherein an ambient contrast ratio of the substrate with the anti-glare surface and the anti-reflective coating is greater than or equal to 5.

Aspect (133) pertains to the method of Aspect (132), wherein the ambient contrast ratio of the substrate with the anti-glare surface and the anti-reflective coating is 5.1.

Aspect (134) pertains to the method of any one of Aspects (127) through (133), wherein a ghost image reduction of the substrate with the anti-glare surface and the anti-reflective coating is greater than or equal to 30.

Aspect (135) pertains to the method of any one of Aspects (127) through (134), wherein the ghost image reduction of the substrate with the anti-glare surface and the anti-reflective coating is 31.

Aspect (136) pertains to the method of any one of Aspects (127) through (135), wherein a color uniformity (ΔE/deg) of the substrate with the anti-glare surface and the anti-reflective coating is greater than or equal to 2.

Aspect (137) pertains to the method of any one of Aspects (127) through (136), wherein the color uniformity (ΔE/deg) of the substrate with the anti-glare surface and the anti-reflective coating is 2.6.

Aspect (138) pertains to the method of any one of Aspects (99) through (137), wherein ΔEθ is less than 4, or less than 3, or less than 2.

Aspect (139) pertains to the method of any one of Aspects (99) through (138), wherein ΔEθ is less than or equal to about 1.7, less than or equal to about 1.5, less than or equal to about 1.4, or less than or equal to about 1.2 for any two values of θ1 and θ2 in a range from about 10° to about 30° that differ from one another.

Aspect (140) pertains to the method of any one of Aspects (99) through (139), wherein ΔEθ is less than or equal to about 2.9, less than or equal to about 2.6, less than or equal to about 2.5, less than or equal to about 2.4, less than or equal to about 2.3, less than or equal to about 2.1, less than or equal to about 2.0, less than or equal to about 1.9, or less than or equal to about 1.8 for any two values of θ1 and θ2 in a range from about 15° to about 45° that differ from one another.

Aspect (141) pertains to the method of any one of Aspects (99) through (140), wherein ΔEθ is less than or equal to about 1.0, less than or equal to about 0.8, less than or equal to about 0.7, less than or equal to about 0.6, less than or equal to about 0.5, or less than or equal to about 0.2 for any two values of θ1 and θ2 in a range from about 45° to about 60° that differ from one another.

What is claimed is:

1. An article comprising:
a substrate comprising a first major surface and a second major surface opposite the first major surface and separated therefrom by a thickness of the substrate; and
an anti-reflective coating disposed on the first major surface and comprising an anti-reflective surface opposite the first major surface,
wherein at a point on the anti-reflective surface of the anti-reflective coating, the article comprises a single-surface reflectance under a D65 illuminant having an angular color variation, ΔEθ, defined as:

$$\Delta E_\theta = \sqrt{\{(a^*_{\theta 1} - a^*_{\theta 2})^2 + (b^*_{\theta 1} - b^*_{\theta 2})^2\}}$$

where $a^*_{\theta 1}$ and $b^*_{\theta 1}$ are a and b values of the point measured from a first viewing angle $\theta_1$, and $a^*_{\theta 2}$ and $b^*_{\theta 2}$ are a and b values of the point measured from a second viewing angle $\theta_2$, $\theta_1$ and $\theta_2$ being any two different viewing angles at least 5 degrees apart in a range from about 10° to about 60° relative to a normal vector of the anti-reflective surface, and
wherein ΔEθ is less than 5,
wherein the anti-reflective surface comprises a single-surface reflected color with an a* value from about −2 to about 0, and a b* value from about −4 to about −1 at a viewing angle of about 10°,
wherein the anti-reflective surface exhibits an average visible photopic reflectance of 1% or less over viewing angles ranging from 0° to 40°,
wherein the anti-reflective coating comprises a stack of alternating high- and low-refractive index materials, wherein the low refractive index material comprises a refractive index, in a range from about 1.3 to 1.7 and the high refractive index material comprises a refractive index in a range from about 1.7 to about 2.5,
wherein the anti-coating coating comprises a buffer layer having a thickness of at least 20 nm disposed on the substrate such that the buffer layer is disposed between the substrate and the stack, wherein the buffer layer is constructed of a material having a refractive index within 5% of the refractive index of the substrate, and
wherein the anti-reflective coating comprises a coating thickness in a range from 200 nm to 300 nm.

2. The article of claim 1, wherein the anti-reflective surface comprises a single-surface reflected color with an a* value from about −1 to about 1, and a b* value from about −4 to about 1 at all viewing angles in a range from about 10° to about 60°.

3. The article of claim 1, wherein the $\Delta E_\theta$ is less than 2.

4. The article of claim 1, wherein the low index material comprises silica ($SiO_2$) and the high index material comprises niobium oxide ($Nb_2O_5$) or titanium oxide ($TiO_n$) and, wherein the stack comprises four layers.

5. The article of claim 1, wherein the stack comprises a first niobium oxide ($Nb_2O_5$) layer disposed on the buffer layer, a first silica ($SiO_2$) layer disposed on the first niobium oxide layer, a second niobium oxide ($Nb_2O_5$) layer disposed on the first silica layer, and a second silica ($SiO_2$) layer disposed on the second niobium oxide layer, and any one of the following:
wherein the first niobium oxide layer has a thickness that is less than the second niobium oxide layer, and
wherein the first silica layer has a thickness that is less than the second silica layer.

6. The article of 5, further comprising any one or more of wherein the first niobium oxide layer has a thickness from about 11 nm to about 13 nm, wherein the first silica layer has a thickness from about 40 nm to about 45 nm, wherein the second niobium oxide layer has a thickness from about 115 nm to about 125 nm, wherein the second silica layer has a thickness from about 80 nm to about 88 nm.

7. The article of claim 1, wherein the buffer layer comprises silica and the thickness of the buffer layer is not greater than about 30 nm.

8. The article of claim 1, wherein a variation in a thickness of any layer in the anti-reflective coating is +/−2% or less of the thickness.

9. The article of claim 1, wherein the first major surface comprises an anti-glare surface, and wherein the anti-glare surface is disposed on the first major surface of the substrate, and the anti-reflective coating is disposed on the anti-glare surface.

10. The article of claim 9, wherein further comprising any one of:
an ambient contrast ratio of the substrate with the anti-glare surface and the anti-reflective coating is greater than or equal to 5,
a ghost image reduction of the substrate with the anti-glare surface and the anti-reflective coating is greater than or equal to 30, and
a color uniformity (ΔE/deg) of the substrate with the anti-glare surface and the anti-reflective coating is greater than or equal to 2.

11. The article of claim 1, wherein the article has a width greater than or equal to 600 mm.

12. The article of claim 1, wherein the first major surface of the substrate and the anti-reflective surface are complexly curved.

13. The article of claim 1, further comprising:
a base having a non-planar support surface, the substrate being disposed on the base with the second major surface of the substrate facing the non-planar support surface, and wherein the substrate is a glass and/or glass-based material cold-formed onto the non-planar support surface.

14. A vehicle comprising the article of claim 1, wherein the article is a vehicle interior surface, wherein the article composes at least part of a dashboard, an instrument panel, a control panel, a center console, a steering wheel, a side door component, an entertainment unit, or a graphical or video display.

15. The vehicle of claim 14, wherein any two points on the reflective surface of the substrate comprising the anti-reflective coating have the same angular color variation, $\Delta E_\theta$.

16. An article comprising:
a substrate comprising a first major surface and a second major surface opposite the first major surface and separated therefrom by a thickness of the substrate; and
an anti-reflective coating comprising a stack of alternating high- and low-refractive index materials disposed on the first major surface and comprising an anti-reflective surface opposite the first major surface,
wherein at a point on the anti-reflective surface of the anti-reflective coating, the article comprises a single-surface reflectance under a D65 illuminant having an angular color variation, $\Delta E_\theta$, defined as:

$$\Delta E_\theta = \sqrt{(a^*_{\theta 1} - a^*_{\theta 2})^2 + (b^*_{\theta 1} - b^*_{\theta 2})^2}$$

where $a^*_{\theta 1}$ and $b^*_{\theta 1}$ are a and b values of the point measured from a first viewing angle $\theta_1$, and $a^*_{\theta 2}$ and $b^*_{\theta 2}$ are a and b values of the point measured from a second viewing angle $\theta_2$, $\theta_1$ and $\theta_2$ being any two different viewing angles at least 5 degrees apart in a range from about 10° to about 60° relative to a normal vector of the anti-reflective surface, and
wherein $\Delta E_\theta$ is less than 5,
wherein the anti-reflective surface comprises a single-surface reflected color with an a* value from about −2 to about 0, and a b* value from about −4 to about −1 at a viewing angle of about 10°,
wherein the anti-reflective surface exhibits an average visible photopic reflectance of 1% or less over viewing angles ranging from 0° to 40°,
wherein the anti-coating coating comprises a buffer layer having a thickness of at least 20 nm disposed on the substrate such that the buffer layer is disposed between the substrate and the stack, wherein the buffer layer is constructed of a material having a refractive index within 5% of the refractive index of the substrate, and
wherein the anti-reflective coating comprises a coating thickness in a range from 200 nm to 300 nm.

17. The article of claim 16, wherein the anti-reflective surface comprises a single-surface reflected color with an a* value from about −1 to about 1, and a b* value from about −2 to about 1 at a viewing angle of about 60°.

18. The article of claim 16, wherein the anti-reflective surface comprises a single-surface reflected color with an a* value from about −1 to about 1, and a b* value from about −4 to about 1 at all viewing angles in a range from about 10° to about 60°.

19. The article of claim 16, wherein the thickness of the buffer layer is not greater than about 30 nm.

20. The article of claim 16, wherein the substrate is a glass or glass-based material.

* * * * *